United States Patent
Nakamura et al.

(10) Patent No.: US 7,145,193 B2
(45) Date of Patent: Dec. 5, 2006

(54) SEMICONDUCTOR INTEGRATED CIRCUIT DEVICE AND PROCESS FOR MANUFACTURING THE SAME

(75) Inventors: Yoshitaka Nakamura, Ome (JP); Isamu Asano, Iruma (JP); Keizou Kawakita, Ome (JP); Satoru Yamada, Ome (JP)

(73) Assignee: Hitachi, Ltd., Tokyo (JP)

( * ) Notice: Subject to any disclaimer, the term of this patent is extended or adjusted under 35 U.S.C. 154(b) by 40 days.

(21) Appl. No.: 10/470,573

(22) Filed: Aug. 29, 2002

(65) Prior Publication Data

US 2004/0046195 A1    Mar. 11, 2004

Related U.S. Application Data

(62) Division of application No. 09/208,879, filed on Dec. 10, 1998, now Pat. No. 6,734,060.

(30) Foreign Application Priority Data

Dec. 18, 1997   (JP)   ................... 9-348823

(51) Int. Cl.
     *H01L 27/108*   (2006.01)

(52) U.S. Cl. ............... 257/296; 257/298; 257/E27.087; 257/E27.088; 438/243

(58) Field of Classification Search .................. 257/68, 257/71, 296, 298, 306, 309, E27.087, E27.088, 257/E27.092; 438/243
See application file for complete search history.

(56) References Cited

U.S. PATENT DOCUMENTS

| 5,604,365 A | * | 2/1997 | Kajigaya et al. | 257/296 |
| 5,804,479 A | * | 9/1998 | Aoki et al. | 438/253 |
| 5,956,594 A | * | 9/1999 | Yang et al. | 438/396 |
| 5,976,929 A | * | 11/1999 | Kajigaya et al. | 438/241 |
| 5,981,369 A | * | 11/1999 | Yoshida et al. | 438/597 |
| 6,103,566 A | * | 8/2000 | Tamaru et al. | 438/240 |
| 6,130,449 A | * | 10/2000 | Matsuoka et al. | 257/296 |
| 6,143,601 A |   | 11/2000 | Sun |  |
| 6,150,689 A | * | 11/2000 | Narui et al. | 257/306 |
| 6,255,151 B1 | * | 7/2001 | Fukuda et al. | 438/197 |
| 6,258,654 B1 | * | 7/2001 | Gocho | 438/240 |
| 6,376,304 B1 | * | 4/2002 | Matsuoka et al. | 438/253 |
| 6,423,992 B1 | * | 7/2002 | Fukuda et al. | 257/288 |
| 6,617,205 B1 | * | 9/2003 | Kimura et al. | 438/210 |
| 6,734,060 B1 | * | 5/2004 | Nakamura et al. | 438/253 |
| 6,798,005 B1 | * | 9/2004 | Kimura et al. | 257/296 |
| 6,815,762 B1 | * | 11/2004 | Yoshida et al. | 257/323 |
| 6,852,579 B1 | * | 2/2005 | Kumauchi et al. | 438/167 |

* cited by examiner

*Primary Examiner*—Matthew Smith
*Assistant Examiner*—Khiem Nguyen
(74) *Attorney, Agent, or Firm*—Antonelli, Terry, Stout and Kraus, LLP.

(57) ABSTRACT

In a peripheral circuit region of a DRAM, two connection holes, for connecting a first layer line and a second layer line electrically are opened separately in two processes. After forming the connection holes, plugs are formed in the respective connection holes.

4 Claims, 34 Drawing Sheets

SEMICONDUCTOR INTEGRATED CIRCUIT DEVICE AND PROCESS FOR MANUFACTURING THE SAME

CROSS-REFERENCE TO RELATED APPLICATIONS

This application is a divisional application of application Ser. No. 09/208,879, filed Dec. 10, 1998 now U.S. Pat. No. 6,734,060.

BACKGROUND OF THE INVENTION

The present invention relates to a process for manufacturing a semiconductor integrated circuit device and a semiconductor integrated circuit device technique; and, more particularly, the invention relates to a technique which is effective when applied to a process for manufacturing a semiconductor integrated circuit device having a DRAM (Dynamic Random Access Memory), and a semiconductor integrated circuit device technique.

The DRAM has a plurality of memory cells each comprising one memory cell selecting MIS transistor and a capacitor connected in series with the MIS transistor, so that its degree of integration is high enough to lower the unit price per bit. Therefore, DRAMs are widely used in main memories for various computers or communication devices that require a memory of high storage capacity.

With developments in technology, the memory capacity of a DRAM has tended to increase more and more. In accordance with this tendency, the area occupied by the memory cell has been reduced with a view to improving the degree of integration of the memory cells of the DRAM.

However, the capacitance of the information storage capacitive element (capacitor) in a memory cell of a DRAM is required to be a certain value from the standpoint of the operation margin, soft errors and so on, independently of the DRAM generation, and cannot be proportionally reduced, as is generally known in the art.

Thus, the capacitor structure has been developed to have a necessary capacitance in a limited small occupation area. As one of the results of these developments, a three-dimensional capacitor structure, such as the so-called "stacked capacitor", in which two layers of capacitor electrodes are stacked through a capacitor insulation film has been adopted.

The stacked capacitor generally has a structure in which the capacitor electrodes are arranged over a memory cell selecting MOSFET (Metal Oxide Semiconductor Field Effect Transistor), and is represented by a cylindrical or fin type capacitor structure. Either of these structures is characterized in that a large capacitance can be ensured by increasing the size in the height direction of the capacitor, but without increasing the size in the widthwise direction of the capacitor.

A DRAM having memory cells is disclosed in Japanese Patent Laid-Open No. 122654/1995 relating to the so-called "Capacitor Over Bitline (will be abbreviated to COB)" arrangement in which the information storage capacitive elements are provided in a layer over the bit lines.

SUMMARY OF THE INVENTION

We have discovered the following problems in the above-specified technique. Specifically, the connection hole for electrically connecting different wiring layers or a wiring line and a semiconductor substrate has such a high aspect ratio that it is difficult to open a connection hole and to fill it in with a conductor layer. This problem is serious in the case of the connection hole portion for connecting the upper wiring layer and the lower wiring layer in a stacked capacitor, especially when the information storage capacitive element of the DRAM is a stacked capacitor. This is caused by the deepened connection hole because the capacitance of the capacitor is increased without increasing the occupation area.

We have studied the prior art from the view point of the wiring structure of the DRAM and have-found PCT Laid-Open No. 9719468, for example, relating to that technique. This publication discloses a structure in which three buried wiring layers are interposed between the capacitor and the semiconductor substrate of the DRAM. Also disclosed is a structure in which multiple plugs are stacked, but there is no mention of the structure in which the lines buried in the layer common to the bit lines are led out through the stacked plugs to the wiring layer over the capacitor.

An object of the invention is to provide a technique which is capable of facilitating the work required to open a connection hole for connecting different wiring layers and to fill in the connection hole with a conductor film.

The above-specified and other objects and the novel features of the invention will become apparent from the following description to be made with reference to the accompanying drawings.

Representative aspects of the invention to be disclosed herein will be briefly described in the following.

According to the invention, there is provided a process for manufacturing a semiconductor integrated circuit device including, on a semiconductor substrate, a plurality of memory cells each having a memory cell selecting transistor and an information storage capacitive element connected in series with the memory cell selecting transistor, comprising the steps of forming a bit line and a first line in the same wiring layer over the semiconductor substrate; forming the information storage capacitive element over the bit line, not through another wiring layer line; and forming a second line over the information storage capacitive element, wherein the process further comprises forming between the first line and the second line a first connection portion electrically connected in direct contact with the first line, and a second connection portion electrically connected in direct contact with the first connection portion.

In a semiconductor integrated circuit device manufacturing process according to the invention, moreover, the second connection portion has a planar size larger than that of the first connection portion.

In a semiconductor integrated circuit device manufacturing process of the invention, moreover, the second connection portion has a planar size larger than that of the first connection portion to an extent that it includes a plurality of the first connection portions.

According to the invention, there is further provided a process for manufacturing a semiconductor integrated circuit device including, on a semiconductor substrate, a plurality of memory cells each having a memory cell selecting transistor and an information storage capacitive element connected in series with the memory cell selecting transistor, comprising the steps of:

(a) forming a bit line and a first line in the same wiring layer over said semiconductor substrate;

(b) forming over said semiconductor substrate a first insulation film covering the bit line and the first line;

(c) opening in the first insulation film a first connection hole for exposing the first line in the region other than the region where the memory cell is formed;

(d) forming the first connection portion by filling in the first connection hole with a first conductor film;

(e) forming a second insulation film made of a material allowing a relatively high etching selection ratio for the first insulation film in such a way as to cover the upper faces of the first insulation film and the first connection portion;

(f) forming the information storage capacitive element over the bit line in said memory cell forming region;

(g) opening a second connection hole for exposing the first connection portion in a region other than the region where the memory cell is formed in the second insulation film formed between the wiring layer over the information storage capacitive element and the first connection portion, and in a third insulation film made of such a material to allow a relatively high etching selection ratio for the second insulation film; and (h) forming a second connection portion electrically connected in direct contact with the first connection portion, by burying a second conductor film in the second connection hole.

According to the invention, moreover, there is further provided a process for manufacturing a semiconductor integrated circuit device including on a semiconductor substrate a plurality of memory cells each having a memory cell selecting transistor and an information storage capacitive element connected in series with the memory cell selecting transistor, comprising the steps of:

(a) forming a bit line and a first line in the same wiring layer over the semiconductor substrate;

(b) forming over the semiconductor substrate a first insulation film covering the bit line and the first line;

(c) opening in the first insulation film a first connection hole for exposing the first line in the region other than the region where the memory cell is formed;

(d) forming the first connection portion by filling in the first connection hole with a first conductor film;

(e) forming the information storage capacitive element over the bit line in the memory cell forming region;

(f) opening a second connection hole for exposing the first connection portion in a region other than said memory cell forming region in the insulation film formed between the wiring layer over the information storage capacitive element and the first connection portion; and (g) forming a second connection portion electrically connected in direct contact with said first connection portion, by burying the second conductor film in the second connection hole.

According to the invention, there is further provided a process for manufacturing a semiconductor integrated circuit device including, on a semiconductor substrate, a plurality of memory cells each having a memory cell selecting transistor and an information storage capacitive element connected in series with the memory cell selecting transistor, comprising the steps of:

(a) forming a bit line and a first line in the same wiring layer over the semiconductor substrate;

(b) forming over the semiconductor substrate a first insulation film covering the bit line and the first line;

(c) opening in the first insulation film a first connection hole for exposing the first line in the region other than the region where the memory cell is formed, and opening a connection hole for the information storage capacitive element for exposing the bit line in the memory cell forming region;

(d) forming a first connection portion and a connection portion for an information storage capacitive element by filling in the first connection hole and the information storage capacitive element connection hole with a first conductor film;

(e) forming a second insulation film made of a material allowing a relatively high etching selection ratio for the first insulation film in such a way as to cover the upper faces of the first insulation film, the first connection portion, and the information storage capacitive element connection portion;

(f) forming the information storage capacitive element over the bit line in the memory cell forming region;

(g) opening a second connection hole for exposing the first connection portion in the region other than the memory cell forming region in the second insulation film formed between the wiring layer over the information storage capacitive element and the first connection portion, and in a third insulation film made of a material to allow a relatively high etching selection ratio for the second insulation film; and (h) forming a second connection portion electrically connected in direct contact with the first connection portion, by burying a second conductor film in the second connection hole.

According to the invention, there is further provided a process for manufacturing a semiconductor integrated circuit device including, on a semiconductor substrate, a plurality of memory cells each having a memory cell selecting transistor and an information storage capacitive element connected in series with the memory cell selecting transistor, comprising the steps of:

(a) forming a bit line and a first line in the same wiring layer over the semiconductor substrate;

(b) forming over the semiconductor substrate a first insulation film covering the bit line and the first line;

(c) forming over the first insulation film a second insulation film made of a material allowing a relatively high etching selection ratio for the first insulation film;

(d) forming the information storage capacitive element over the bit line in the region where the memory cell is formed;

(e) opening a connection hole between wiring layers, through which the first line is exposed, in the region other than the memory cell forming region, in a first insulation film and a second insulation film formed between the wiring layer over the information storage capacitive element and the first line, and in a third insulation film formed over the first insulation film and the second insulation film and made of a material allowing a relatively high etching selection ratio for the second insulation film; and (f) forming a connection portion between the wiring layers electrically connected in direct contact with the first line, by filling in the connection hole between the wiring layers with a conductor film, wherein the step of forming the connection hole between the wiring layers includes forming a mask pattern for forming a connection hole over the third insulation film;

performing a first etching process to open a first hole for exposing a part of the second insulation film in the third insulation film exposed from the mask pattern, by etching using the mask pattern as an etching mask, under the condition in which the third insulation film is etched off more easily than the second insulation film at a relatively increased etching selection ratio between the second insulation film and the third insulation film;

performing, after the first etching process step, a second etching process to remove the second insulation film exposed from the bottom portion of the first hole and to open a second hole for exposing a part of the first insulation film in the second insulation film, by etching using the mask pattern as an etching mask under the condition in which the second insulation film is etched off more easily than the third insulation film at a relatively increased etching selection ratio between the second insulation film and the third insulation film; and performing, after the second etching process step, a third etching process to remove the first insulation film exposed from the bottom of the second hole and to open the connection hole between the wiring layers for exposing the first insulation film, by etching under the condition in which the first insulation film is etched off more easily than the second insulation film at a relatively increased etching selection ratio between the second insulation film and the first insulation film.

In the semiconductor integrated circuit device manufacturing process, according to the invention, the step (d) includes forming a first electrode constituting the information storage capacitive element; forming a capacitor insulation film on the surface of the first electrode; and forming a second electrode covering the capacitor insulation film, the step (e) includes opening a connection hole extending through the second electrode for leading out the second electrode in the third insulation film, the step of forming the connection hole between the wiring layers and the connection hole for leading out the second electrode includes forming a mask pattern over the third insulation film;

performing a first etching process to open a first hole constituting the connection hole between the wiring layers and for exposing a part of the second insulation film, and to open a first hole which constitutes the connection hole for leading out the second electrode and extends through the second electrode and the bottom of which extends to an intermediate position of the third insulation film, in the third insulation film exposed from the mask pattern, by etching using the mask pattern as an etching mask under the condition in which the third insulation film is etched off more easily than the second insulation film at a relatively increased etching selection ratio between the second insulation film and the third insulation film;

performing, after the first etching process step, a second etching process to remove the second insulation film exposed from the bottom of the first hole for the connection hole between the wiring layers and to open a second hole for the connection hole between the wiring layers and for exposing a part of the first insulation film, by etching using the mask pattern as an etching mask under the condition in which the second insulation film is etched off more easily than the third insulation film at a relatively increased etching selection ratio between the second insulation film and the third insulation film; and performing, after the second etching process step, a third etching process to open a connection hole between the wiring layers for exposing the first insulation film from the bottom of the second hole for the connection hole of the insulation film between the wiring layers, by etching under the condition in which the first insulation film is etched off more easily than the second insulation film at a relatively increased etching selection ratio between the second insulation film and the first insulation film, and wherein said (f) step includes burying a conductor film in the connection hole between the wiring layer and in the second electrode lead-out connection hole, and forming the connection portion between the wiring layers electrically connected in direct contact with the first line, and the second electrode lead-out connection portion electrically connected with the second electrode.

According to the invention, there is further provided a process for manufacturing a semiconductor integrated circuit device, in which a memory cell including a first MISFET and a capacitive element connected in series with the first MISFET is formed in a first region of a semiconductor substrate and in which a second MISFET is formed in a second region of the semiconductor substrate, comprising the steps of:

(a) forming a first line in the second region of the semiconductor substrate;

(b) forming a first insulation film over the first line;

(c) forming a first opening in the first insulation film to expose a portion of the first line;

(d) forming a first conductor layer selectively in the first opening;

(e) forming a second insulation film over the first insulation film and the first conductor layer;

(f) forming a third insulation film over the second insulation film;

(g) forming a second opening in the third insulation film in the first region;

(h) forming a second conductor layer selectively along the inner wall of the second opening;

(i) forming a fourth insulation film and a third conductor layer over the second conductor layer;

f forming a third opening in the third insulation film and the second insulation film in the second region in such a way as to expose a part of the first conductor layer; and forming a fourth conductor layer in the third opening, wherein at the second opening forming step, the third insulation film is etched under the condition in which the etching rate of the third insulation film is higher than that of the second insulation film, and wherein at the third opening forming step, the third insulation film is etched under the condition in which the etching rate of the third insulation film is higher than that of the second insulation film, and then the second insulation film is etched under the condition in which the etching rate of the second insulation film is higher than that of the third insulation film.

According to the invention, there is further provided a process for manufacturing a semiconductor integrated circuit device, in which a memory cell including a first MISFET and a capacitive element connected in series with the first MISFET is formed in a first region of a semiconductor substrate and in which a second MISFET is formed in a second region of the semiconductor substrate, comprising the steps of:

(a) forming a first line in the second region of the semiconductor substrate;

(b) forming a first insulation film over the first line;

(c) forming a second insulation film over the first insulation film;

(d) forming a third insulation film over the second insulation film;

(e) forming a first opening in the third insulation film in the first region;

(f) forming a first conductor layer selectively along the inner wall of the first opening;

(g) forming a fourth insulation film and a second conductor layer over the first conductor layer;

(h) forming a second opening in the third insulation film and the second insulation film in the second region in such a way as to expose a part of the first conductor layer; and (i) forming a third conductor layer in the second opening, wherein at the first opening forming step, the third insulation film is etched under the condition in which the etching rate of the third insulation film is higher than that of the second insulation film, and wherein at the second opening forming step, the third insulation film is etched under the condition in which the etching rate of the third insulation film is higher than that of the second insulation film, then the second insulation film is etched under the condition in which the etching rate of the second insulation film is higher than that of the first insulation film, and the first insulation film is etched in such a way as to expose a part of the first line.

DESCRIPTION OF THE PREFERRED EMBODIMENTS

Figure 1:
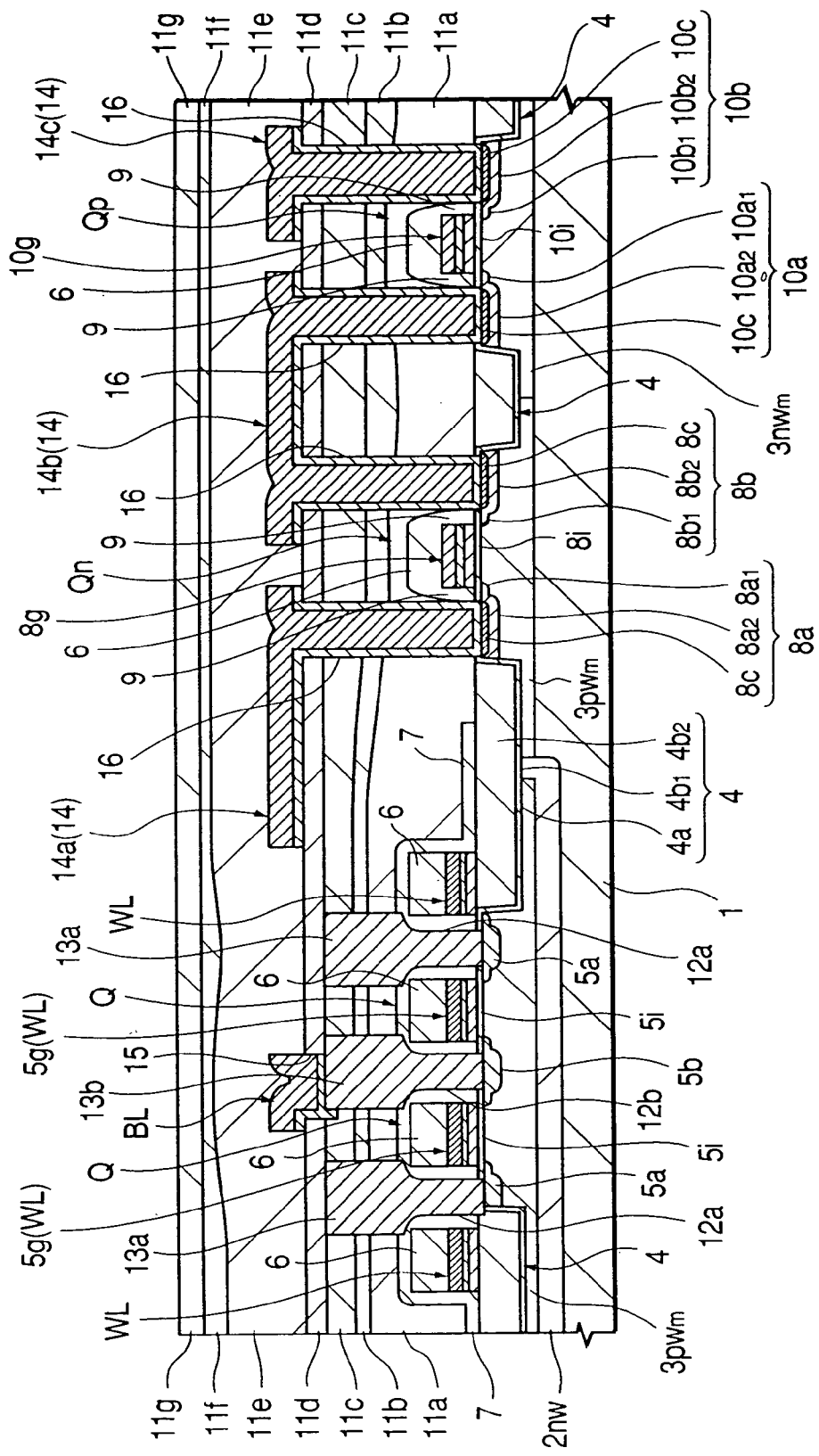
FIG. 1 is a section view of a portion of a semiconductor integrated circuit device manufactured according to one embodiment of the invention.

The invention will be described in detail in connection with various embodiments with reference to the accompanying drawings (throughout all the Figures for illustrating the embodiments, those portions having identical functions are designated by common reference numerals, and their repeated description will be omitted).

Embodiment 1

FIGS. 1 to 8 are sections of portions of a semiconductor integrated circuit device showing the manufacturing process according to one embodiment of the invention.

Embodiment 1 is directed to the case in which the technical concept of the invention is applied to a 256M-DRAM, for example.

FIG. 1 is a section showing the configuration of the device in the process for manufacturing the DRAM. A semiconductor substrate 1 is made of a p-type silicon single crystal, for example. In the memory field (as located on the lefthand side of FIG. 1) of this semiconductor substrate 1, there is formed a deep n-well 2 nw. This deep n-well 2 nw is doped with an n-type impurity such as phosphorous.

In this deep n-well 2 nw, there is formed a p-well 3 pwm. This p-well 3 pwm is enclosed by the deep n-well 2 nw formed therebelow and the n-well formed on the side of the p-well 3 pwm, so that it is electrically isolated from the peripheral circuit region or the like. This p-well 3 pwm is doped with a p-type impurity such as boron.

In the semiconductor substrate 1 at the peripheral circuit region and the like (located on the righthand side of FIG. 1), moreover, there is formed a p-well 3 pwp in a region as deep as that of the p-well 3 pwm of the memory region. This p-well 3 pwm is doped with a p-type impurity such as boron.

In the semiconductor substrate 1 at the peripheral circuit region and the like, moreover, there is formed an n-well 3 nwp in a region as deep as that of the p-well 3 pwm of the memory cell region. This n-well 3 nwp is doped with an n-type impurity such as phosphorous or arsenic.

In the major face portion of this semiconductor substrate 1, there is formed an element isolating region (or trench isolation) 4 of a shallow trench excavation type, for example. Specifically, this element isolating region 4 is formed by burying isolating insulation films 4b1 and 4b2 in an isolation trench 4a which is excavated in the thickness direction of the semiconductor substrate 1.

These isolating insulation films 4b1 and 4b2 are made of silicon oxide or the like. Here, the upper face of this element isolating region 4 is flattened to have a height substantially equal to that of the major face of the semiconductor substrate 1.

In this manufacture process, over the p-well 3 pwm in the memory cell region, there is formed a memory cell selecting MOSFET Q which constitutes a memory cell of the DRAM. This memory cell selecting MOSFET is constructed to include a pair of semiconductor regions 5a and 5b formed over the p-well 3 pwm and separated from each other, a gate insulating film 5i formed over the semiconductor substrate 1, and a gate electrode 5g formed over the gate insulating film 5i. Here, the threshold voltage of the memory cell selecting MOSFET is set to 1 V or the like.

The semiconductor regions 5a and 5b are those for forming the source/drain of the memory cell selecting MOSFET and are doped with an n-type impurity such as arsenic. Between these semiconductor regions 5a and 5b and just under the gate electrode 5g, there is formed the channel region of the memory cell selecting MOSFET.

Moreover, the gate electrode 5g is formed of a portion of a word line WL by depositing an n-type low resistance polysilicon layer, a titanium nitride film and a tungsten film sequentially from the lower layer.

The titanium nitride film in this gate electrode 5g is a barrier metal film for preventing any silicide from being produced in a heat treatment of the manufacturing process at a contact portion between the low resistance polysilicon film and the tungsten film when the latter is formed directly on the former.

This barrier metal film should not be limited to titanium nitride but can be changed in various manners including the use of tungsten nitride, for example. In this regard, tungsten nitride has the following first to third excellent features.

First, tungsten nitride has a high resistance to oxidation. After the patterning of the gate electrode 5g or the like, the gate insulating film under the gate electrode 5g may be slightly scraped, and light oxidation is performed to repair the scraped gate insulating film or the like. Therefore, a barrier metal film may preferably be made of a material having a high oxidation resistance. Especially in the case of a tungsten-based material, the region, in which not the tungsten-based metal but Si is oxidized, can be widened by controlling the light oxidizing atmosphere.

Second, in the case of tungsten nitride, the gate insulating film lightly oxidized has an excellent voltage resistance.

Third, in the case of tungsten nitride, the gate vertical resistance (the resistance between the metal and the polysilicon) is low.

The tungsten film in the gate electrode of the memory cell selecting MOSFET has a function to lower the wiring resistance, and the sheet resistance of the gate electrode 5g (the word line WL) can be lowered by the tungsten film to about 2 to 2.5 $\Omega/\square$. This value is about one tenth the specific resistance of 15 to 10 $\mu\Omega$cm of tungsten silicide.

This makes it possible to improve the access speed of the DRAM. Since the number of memory cells to be connected with one word line WL can be increased, moreover, the area to be occupied by the entire memory region can be reduced to reduce the size of the semiconductor chip.

In Embodiment 1, for example, 512 memory cells can be connected with the word line WL. This makes it possible for the size of the semiconductor chip to be reduced by about 6%, as compared with that of the case in which 256 memory cells are connected with the word line WL. In a semiconductor chip of a finer class, moreover, it is possible to achieve an effect to reduce the size of the semiconductor chip by 10% or less. As a result, the number of semiconductor chips to be manufactured by one manufacturing process can be increased to promote a cost reduction of the DRAM. If the size of the semiconductor chip is unchanged, on the other hand, it is possible to improve the degree of element integration.

The gate insulating film 5i is made of silicon oxide, for example, to have a thickness of about 7 nm, for example. Moreover, this gate insulating film 5i may also be formed of an oxynitride film (SiON film). As a result, the interface state in the gate insulating film can be suppressed, and the electron trap in the gate insulating film can also be reduced so that the hot carrier resistance in the gate insulating film 5i can be improved. This makes it possible to improve the reliability of an extremely thin gate insulating film 5i.

Methods of oxynitriding the gate insulating film 5i include a method of introducing nitrogen into the gate insulating film 5i by subjecting the gate insulating film 5i to a hot heat treatment in a gas atmosphere of $NH_3$ gas or $NO_2$ gas when it is to be formed by oxidizing it, a method of forming a nitride film on the upper face of the gate insulating film 5$i$ made of silicon oxide or the like, a method of oxidizing the gate insulating film 5$i$ after doping the major face of a semiconductor substrate with nitrogen ions, a method of depositing nitrogen on a gate insulating film by a heat treatment after a polysilicon film for forming the gate electrodes is doped with nitrogen ions.

Over the gate electrode 5$g$ of this memory cell selecting MOSFET Q, i.e., over the upper face of the word line WL, there is formed a cap insulating film 6 which is made of silicon nitride, for example. Over the cap insulating film and the gate electrode 5$g$ (the word line WL) and over the major face of the semiconductor substrate 1 between the adjoining word lines WL, moreover, there is formed an insulation film 7 which is made of silicon nitride, for example.

Meanwhile over the p-well 3 pwp in the peripheral circuit region (located on the righthand side of FIG. 1), there is formed an n-channel type MOSFET Qn. This n-channel type MOSFET Qn is equipped with a pair of semiconductor regions 8$a$ and 8$b$ formed over the p-well 3 pwp and isolated from each other, a gate insulating film 8$i$ formed over the semiconductor substrate 1, and a gate electrode 8$g$ formed over the gate insulating film 8$i$. Here, this MOSFET Qn has a threshold voltage of 0.1 V or its vicinity, for example.

The semiconductor regions 8$a$ and 8$b$ are those for forming the source/drain of the n-channel type MOSFET Qn, and the n-channel region of the n-channel type MOSFET Qn is formed between those semiconductor regions 8$a$ and 8$b$ just under the gate electrode 8$g$.

These semiconductor regions 8$a$ and 8$b$ are given an LDD (Lightly Doped Drain) structure. Specifically, the semiconductor regions 8$a$ and 8$b$ individually have lightly doped regions 8$a$1 and 8$b$1 and heavily doped regions 8$a$2 and 8$b$2. The lightly doped regions 8$a$1 and 8$b$1 are formed on the channel region side, and the heavily doped regions 8$a$2 and 8$b$2 are formed at positions spaced from the channel region.

The lightly doped regions 8$a$1 and 8$b$1 are doped with an n-type impurity such as As. The heavily doped regions are doped with an n-type impurity such as As, but their impurity concentrations are set higher than those of the lightly doped regions 8$a$1 and 8$b$1. Here in the major face portions of the semiconductor regions 8$a$ and 8$b$, there is formed a silicide layer 8$c$ which is made of titanium silicide, for example.

The gate electrode 8$g$ is formed, for example, by depositing an n-type low resistance polysilicon film, a titanium nitride film and a tungsten film in order from the lower layer. The titanium nitride film in this gate electrode 8$g$ is a barrier metal film for preventing silicide from being produced at the contact portion between the low resistance polysilicon film and the tungsten film, when the tungsten film is directly formed on the low resistance polysilicon film, by the heat treatment in the manufacturing process. This barrier metal may be replaced by a tungsten nitride film.

The metal film, such as the tungsten film in the gate electrode 8$g$, has a function to lower the wiring resistance, so that it can reduce the sheet resistance of the gate electrode 8$g$ to about 2 to 2.5 $\Omega/\square$. This makes it possible to improve the operating speed of the DRAM.

The gate insulating film 8$i$ is made of silicon oxide, for example, to have a thickness of about 7 nm, for example, like the gate insulating film 5$i$' of the aforementioned memory cell selecting MOSFET Q. Moreover, the gate insulating film 8$i$ may be formed of an oxynitride film (an SiON film). This makes it possible to improve the hot carrier resistance of the extremely thin gate insulating film 8$i$, as described above.

Over the upper face of the gate electrode 8$g$, there is formed the cap insulating film 6 which is made of silicon nitride, for example. On the side faces of the cap insulating film 6 and the gate electrode 8$g$, moreover, there is formed a side wall 9 which is made of silicon nitride, for example.

Here, this side wall 9 is used as an ion implantation mask for forming mainly the lightly doped regions 8$a$1 and 8$b$1 and the heavily doped regions 8$a$2 and 8$b$2 of the n-channel type MOSFET Qn over the semiconductor substrate 1.

After the formation of the gate electrode 8$g$ and before the formation of the side wall 9, more specifically, the semiconductor substrate 1 is implanted with ions of an impurity for forming the lightly doped regions 8$a$1 and 8$b$1 by using the gate electrode 8$g$ as a mask, and the semiconductor substrate 1 is implanted with ions of an impurity for forming the heavily doped regions 8$a$2 and 8$b$2 by using the side wall 9 as a mask.

Over the n-well 3$nwp$ in the peripheral circuit region there is formed a p-channel type MOSFET Qp. This p-channel type MOSFET Qp is equipped with a pair of semiconductor regions 10$a$ and 10$b$ formed over the p-well 3$nwp$ and isolated from each other, a gate insulating film 10$i$ formed over the semiconductor substrate 1, and a gate electrode 10$g$ formed over the gate insulating film 10$i$. Here, this MOSFET Qp has a threshold voltage of around 0.1 V, for example.

The semiconductor regions 10$a$ and 10$b$ are those for forming the source/drain of the p-channel type MOSFET Qp, and the p-channel region of the p-channel type MOSFET Qp is formed between those semiconductor regions 10$a$ and 10$b$ just under the gate electrode 10$g$.

These semiconductor regions 10$a$ and 10$b$ are given an LDD (Lightly Doped Drain) structure. Specifically, the semiconductor regions 10$a$ and 10$b$ individually have lightly doped regions 10$a$1 and 10$b$1 and heavily doped regions 10$a$2 and 10$b$2. The lightly doped regions 10$a$1 and 10$b$1 are formed on the channel region side, and the heavily doped regions 10$a$2 and 10$b$2 are formed at positions apart from the channel region.

The lightly doped regions 10$a$1 and 10$b$1 are doped with a p-type impurity such as boron. The heavily doped regions are doped with a p-type impurity such as boron, but their impurity concentrations are set higher than those of the lightly doped regions 10$a$1 and 10$b$1. Here, in the major face portions of the semiconductor regions 10$a$ and 10$b$, there is formed a silicide layer 10$c$ which is made of titanium silicide, for example.

The gate electrode 10$g$ is formed, for example, by depositing an n-type low resistance polysilicon film, a titanium nitride film and a tungsten film in order from the lower layer.

The titanium nitride film in this gate electrode 10$g$ is a, barrier metal film for preventing silicide from being produced at the contact portion between the low resistance polysilicon film and the tungsten film, when the tungsten film is directly formed over the low resistance polysilicon film, by the heat treatment in the manufacture process. This barrier metal may be replaced by a tungsten nitride film.

The metal film such as the tungsten film in the gate electrode 10$g$ has a function to lower the wiring resistance, so that it can reduce the sheet resistance of the gate electrode 10$g$ to about 2 to 2.5 $\Omega/\square$. This makes it possible to improve the operating speed of the DRAM.

The gate insulating film 10$i$ is made of silicon oxide, for example, to have a thickness of about 7 nm, for example, like the gate insulating film 5$i$ of the aforementioned memory cell selecting MOSFET Q. Moreover, the gate insulating film 10i may be formed of an oxynitride film (an SiON film). This makes it possible to improve the hot carrier resistance of the extremely thin gate insulating film 10i, as described above.

Over the upper face of the gate electrode 10g, there is formed the cap insulating film 6 which is made of silicon nitride, for example. On the side faces of, the cap insulating film 6 and the gate electrode 10g, moreover, there is formed a side wall 9 which is made of silicon nitride, for example.

Here, this side wall 9 is used as an ion implantation mask for forming mainly the lightly doped regions 10a1 and 10b1 and the heavily doped regions 10a2 and 10b2 of the p-channel type MOSFET Qp over the semiconductor substrate 1.

After the formation of the gate electrode 10g and before the formation of the side wall 9, more specifically, the semiconductor substrate 1 is implanted with ions of an impurity for forming the lightly doped regions 10a1 and 10b1 by using the gate electrode 10g as a mask, and the semiconductor substrate 1 is implanted with ions of an impurity for forming the heavily doped regions 10a2 and 10b2 by using the side wall 9 as a mask.

These n-channel type MOSFETs Qn and p-channel type MOSFETs Qp constitute the peripheral circuits such as a sense amplifier circuit, a column decoder circuit, a column driver circuit, a row decoder circuit, a row driver circuit, an I/O selector circuit, a data input buffer circuit, a data output buffer circuit and a power supply circuit all of a DRAM.

The semiconductor integrated circuit elements such as those memory cell selecting MOSFETs Q, p-channel type MOSFETs Qp and n-channel type MOSFETs Qn are covered with interlayer insulating films 11a to 11c which are deposited on the semiconductor substrate 1.

These interlayer insulating films 11a to 11c are made of silicon oxide, for example. The interlayer insulating film 11a is covered with an SOG (Spin On Glass) film, for example. The interlayer insulating films 11b and 11c are deposited by a plasma CVD method, for example. Moreover, the interlayer insulating film 11c is so flattened that its upper face height is substantially equal in the memory region and in the peripheral circuit region.

In the interlayer insulating films 11a to 11c and the insulation film 7 of the memory region, there are formed connection holes 12a and 12b, through which the semiconductor regions 5a and 5b are exposed to the outside. Of the sizes of the lower portions of the connection holes 12a and 12b, the width size of the gate electrode 5g (the word line WL) is substantially determined by the portion of the insulation film 7 on the side faces of the gate electrodes 5g (the word line WL) adjoining each other.

This is because the connection holes 12a and 12b are formed in a self-alignment way by the insulation film 7 on the side face of the gate electrode 5g (the word line WL). In other words, the connection holes 12a and 12b are opened at an increased etching selection ratio to the interlayer insulating films 11a to 11c.

As a result, the gate electrode 5g (the word line WL) is not partially exposed from the connection holes 12a and 12b, even when the relative planar positions between the pattern of the connection holes 12a and 12b and the active region of a memory cell selecting MOSFET Qs differ. As a result, the registration allowance can be reduced to reduce the size of the memory cells.

In these connection holes 12a and 12b, there are respectively buried plugs 13a and 13b. These plugs 13a and 13b are made of low resistance polysilicon containing an n-type impurity such as phosphorous and are electrically connected with the semiconductor regions 5a and 5b of the memory cell selecting MOSFET Q, respectively. Over the upper face of the plug 13b, there is formed a silicide film which is made of titanium suicide, for example.

Over the interlayer insulating film 11c, there is deposited an interlayer insulating film 11d. This interlayer insulating film 11d is made of silicon oxide, for example, and is formed by a plasma CVD method, for example. Over the interlayer insulating film 11d, there are formed a bit line BL and a first-layer line 14 (14a to 14c). This bit line BL and the first-layer line 14 are given a width of about 0.1 microns and a thickness of about 0.1 microns.

This bit line BL is formed by depositing a titanium film, a titanium nitride film and a tungsten film in order from the lower layer and is electrically connected with the plug 13b through a connection hole 15 formed in the interlayer insulating film 11d, and with the semiconductor region 5b of the memory cell selecting MOSFET Q through the plug 13.

The bit line BL extends perpendicularly to the extending direction of the word line WL. As a result, the bit line BL is not ordinarily seen in the section shown in FIG. 1, but is shown in order to show the wiring layer in which the bit line BL is disposed.

The first-layer line 14 of the peripheral circuit region is formed like the bit line BL, for example, by depositing a titanium film, a titanium nitride film or a tungsten film in order from the lower layer. Here, the material of the bit line BL and the first-layer line 14 should not be limited to the aforementioned ones but can be changed. For example, a single-layer film of aluminum (Al), an alloy film prepared by introducing Si or Cu into the conductor film of Al, or a single-layer film of copper (Cu) can be used. Moreover, the structure may be modified such that the surfaces (the upper face and side face) of the bit line BL or the first-layer line 14 are covered with an insulation film made of silicon nitride, for example.

Of this, the first-layer line 14a is electrically connected with the semiconductor region 8a of the n-channel type MOSFET Qn through connection holes 16 which are opened in the interlayer insulating films 11a to 11d. Meanwhile, the first-layer line 14b is electrically connected with the semiconductor region 8b of the n-channel type MOSFET Qn and the semiconductor region 10a of the p-channel type MOSFET Qp through the connection holes 16 which are opened in the interlayer insulating films 11a to 11d. Moreover, the first layer line 14c are electrically connected with the semiconductor region 10b of the p-channel type MOSFET Qp through the connection holes 16 which are opened in the interlayer insulating films 11a to 11d.

On the upper face of the interlayer insulating film 11, there are deposited interlayer insulating films (first insulation films) 11e to 11g in order from the lower layer. As a result, the bit line BL and the first layer line 14 is covered. The interlayer insulating films 11e to 11g are made of silicon oxide or the like, for example. Of these, the interlayer insulating film lie is formed of an SOG film, for example. The interlayer insulating films 11f and hg are formed by a plasma CVD method or the like, for example. Moreover, the upper face of the interlayer insulating film 11g is so flattened that its height may be substantially equal in the memory cell region and in the peripheral circuit region.

Figure 2:
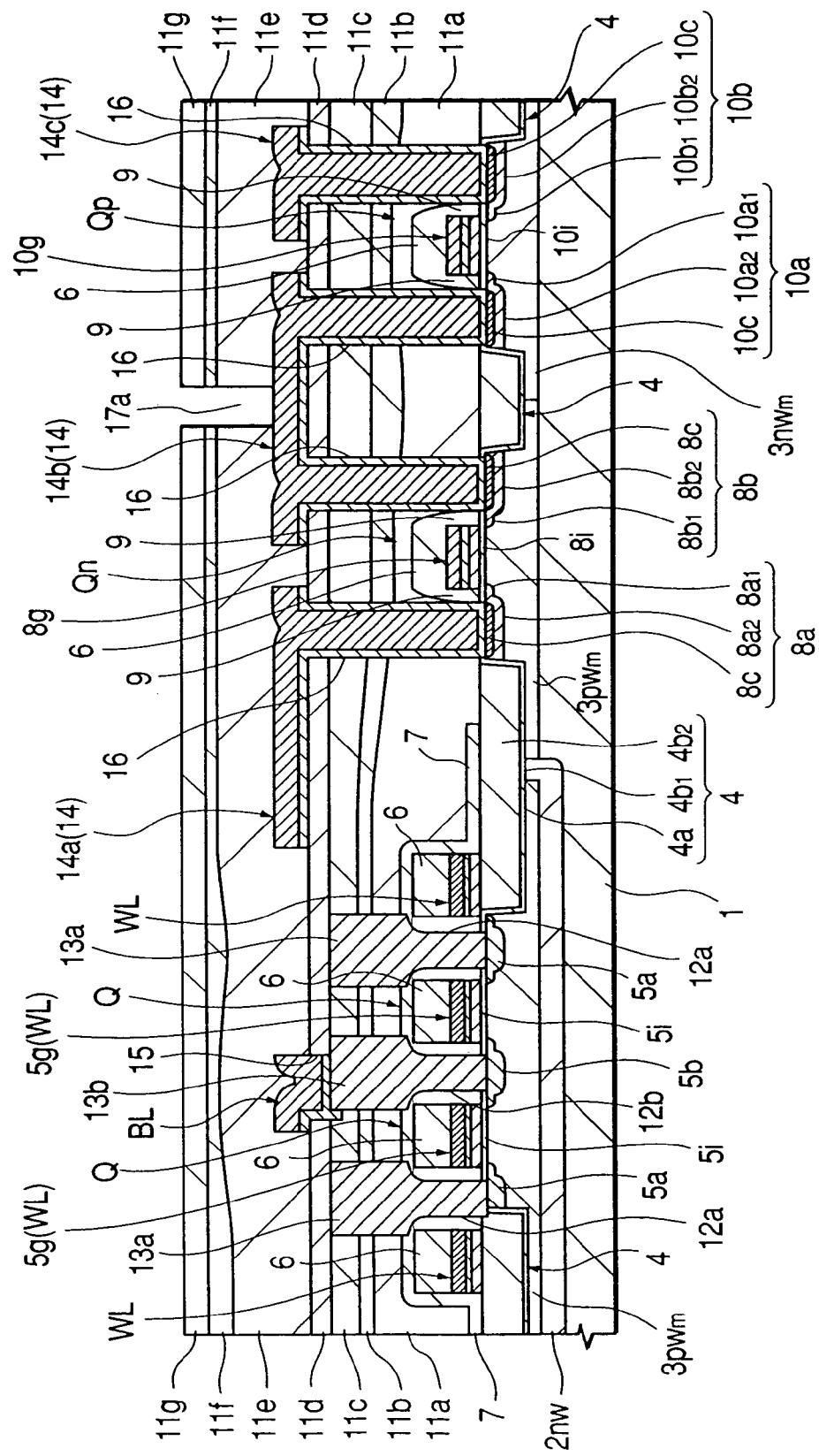
FIG. 2 is a section view of semiconductor integrated circuit device in the manufacturing process subsequent to FIG. 1.

First, this semiconductor substrate 1 is subjected to a photolithography process and a dry etching process to open a connection hole (a first connection hole) 17a in the interlayer insulating films 11e to 11g to expose a portion of the first-layer line 14b, as shown in FIG. 2.

This connection hole 17a is given a depth of about 0.7 microns, for example, and a diameter, although the invention is not especially limited thereto, of one to 1.5 times (0.2 to 0.3 microns) as large as the gate work length, or preferably about 0.25 microns.

Figure 3:
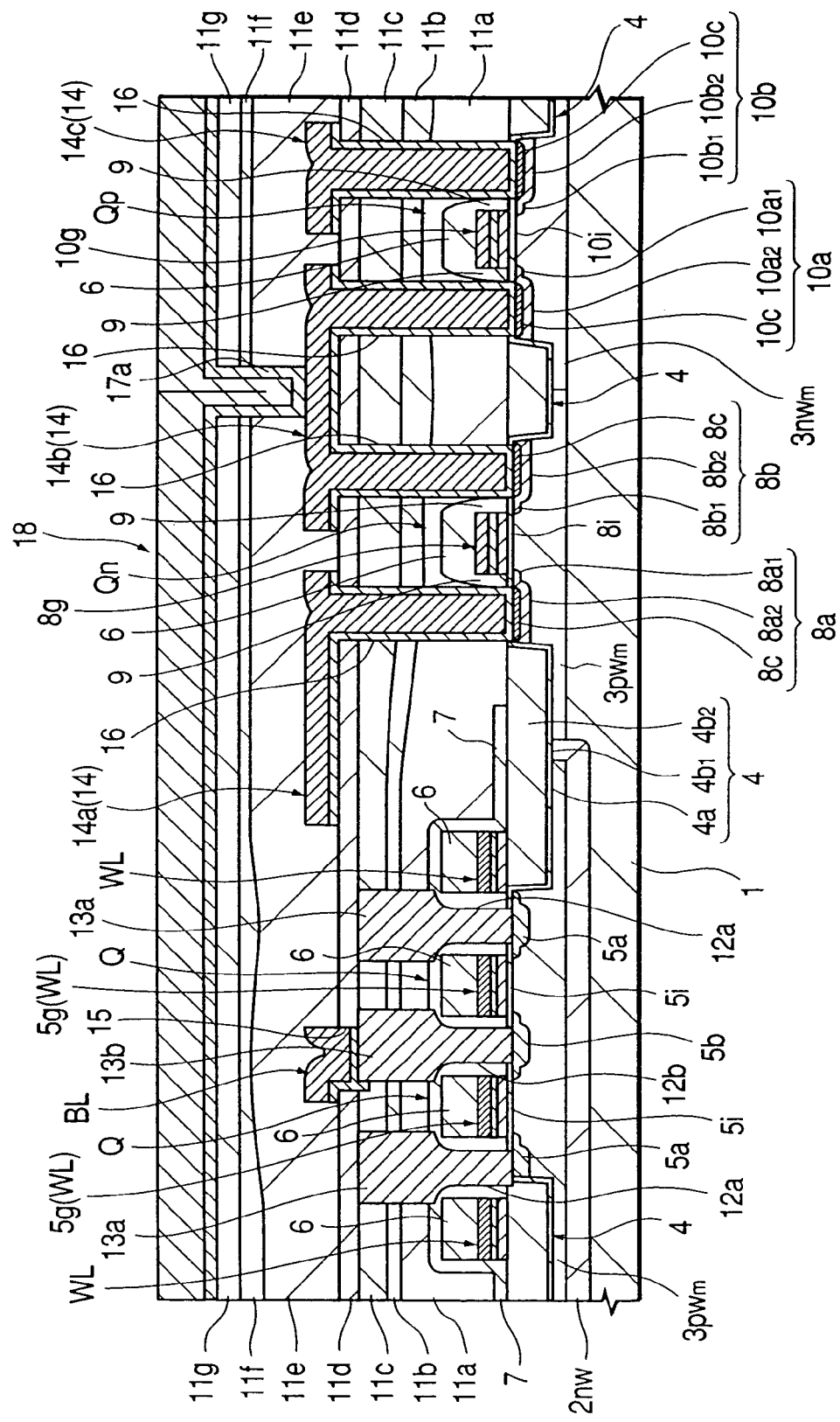
FIG. 3 is a section view of the semiconductor integrated circuit device in the manufacturing process subsequent to FIG. 2.

Next, as shown in FIG. 3, the upper face of the interlayer insulating film 11g and the inside of the connection hole 17a are covered with a conductor film 18 by a blanket CVD method or the like. Specifically, the conductor film 18 is formed by forming a relatively thin conductor film by a sputtering method or the like and by forming a relatively thick conductor film on the thin conductor film by a CVD method. At this time, the connection hole 17a is filled in completely to its top portion with the conductor film 18. That thin conductor film is made of titanium nitride, for example, and the thick conductor film is made of tungsten or the like, for example. In case the first-layer line 14 exposed from the connection hole 17a is made of aluminum or polysilicon, the gas of tungsten hexafluoride to be used for forming the thick conductor film by a CVD method reacts with aluminum or silicon to produce highly resistive aluminum trifluoride ($AlF_3$) or highly volatile carbon tetrafluoride ($CF_4$), causing a problem. The thin conductor film to be formed before the thick conductor film has a function to suppress the problem, but the inside of the connection hole 17a may be insufficiently covered with the thin conductor film due to the decrease of the size of the connection hole 17a (higher aspect ratio), thereby creating a problem. In this embodiment, however, the first-layer line 14 is made of tungsten (at the portion exposed from the connection hole 17a) so that the aforementioned problem is not caused by the reaction of the filming gas. As a result, the connection defect at the connection hole 17a and the variation/increase in the resistance can be suppressed to improve the production yield and the reliability of the semiconductor integrated circuit device.

Figure 4:
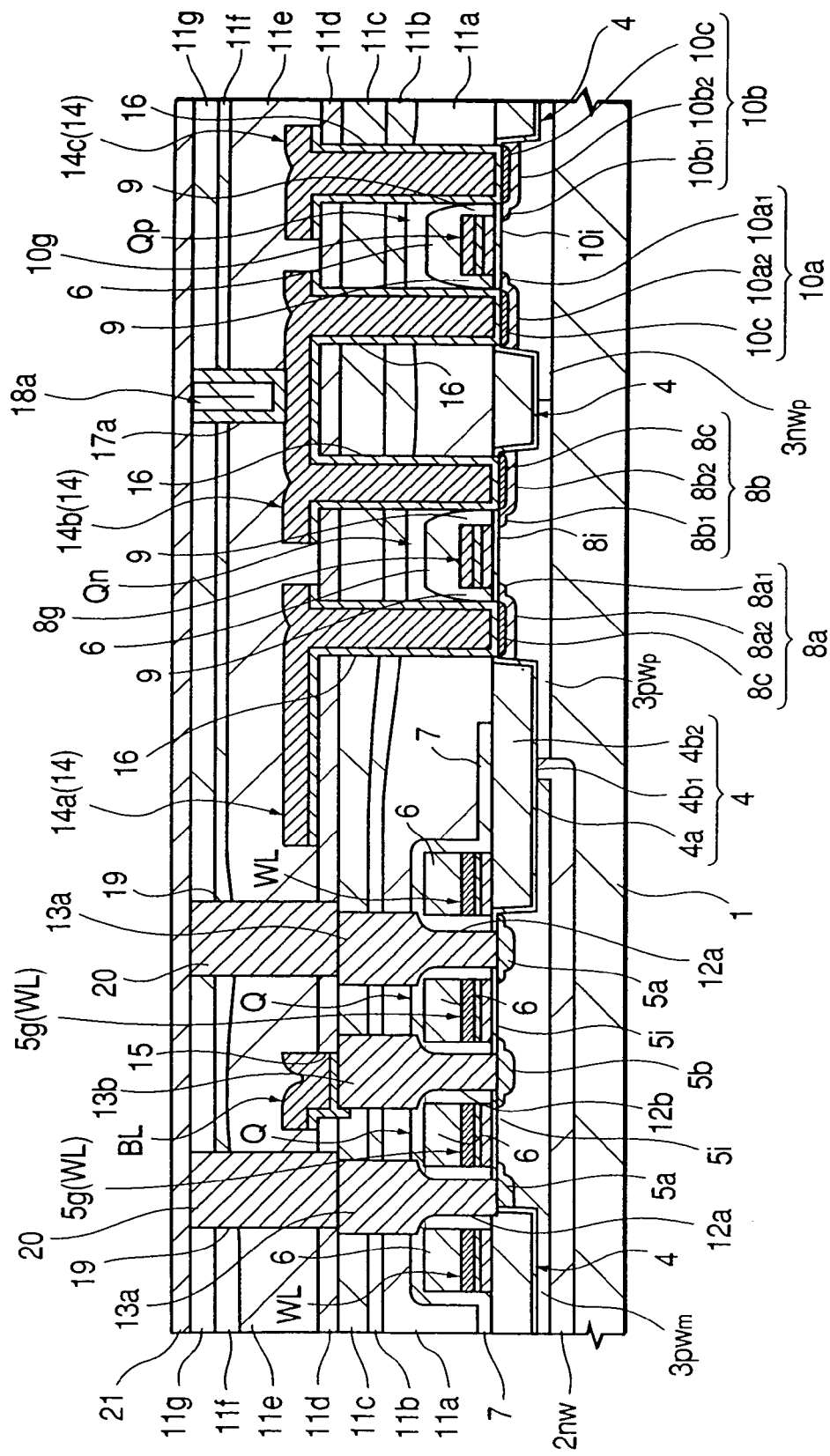
FIG. 4 is a section view of the semiconductor integrated circuit device in the manufacturing process subsequent to FIG. 3.

After this, the semiconductor substrate 1 is subjected to an anisotropic dry etching treatment or a CMP (Chemical Mechanical Polishing) treatment to remove the conductor film 18 from the upper face of the interlayer insulating film 11g while leaving the conductor film 18 only in the connection hole 17a, so that a plug (a first connection portion) 18a is formed in the connection hole 17a, as shown in FIG. 4. This plug 18a is electrically connected in direct contact with the first-layer line 14.

This connection hole 17a can have a low aspect ratio because it is shallow despite of the small diameter, so that it can be opened or buried with the conductor film 18a relatively easily. As a result, the plug 18a in the connection hole 17a and the first-layer line 14b can be electrically connected in an excellent manner.

Next, a connection hole 19 for exposing the upper face of the plug 13a is formed in the interlayer insulating films 11e to 11g of the memory cell region by a photolithography technique and a dry etching technique. After this, a plug (a conductor film for a capacitor element) 20 is formed in the connection hole 19. The diameter of this connection hole 19 is not especially limited but is set to about one to 1.5 times (0.2 to 0.3 microns) as large as that of the gate work length, or preferably about 0.25 microns.

This plug 20 is formed by covering the upper face of the interlayer insulating film 11g and the inside of the connection hole 19 with a low resistance polysilicon film doped with an n-type impurity (e.g., P (phosphorous)), by a CVD method or the like, and by etching back the polysilicon film using an anisotropic dry etching method or a CMP method while leaving the polysilicon film in the connection hole 19.

However, Embodiment 1 has been described, taking the case where the plug 20 of the memory region is formed after the formation of the plug 18a of the peripheral circuit region, but the order of formation should not be limited thereto but may be reversed. Specifically, the plug 18a of the peripheral circuit, region may be formed after the formation of the plug 20 in the memory region.

Next, an insulation film (a second insulation film) 21 of silicon nitride or the like having a thickness of about 100 nm, for example, is so formed by a plasma CVD method or the like as to cover the upper face of the interlayer insulating film 11g, the exposed face of the plug 18a and the exposed face of the plug 20.

This insulation film 21 functions as an etching stopper when the silicon oxide film between the storage electrode of a later-described information storage capacitive element and the lower electrode is to be etched at a step of forming the storage electrode. The insulation film 21 also functions to prevent the storage electrode of the information storage capacitive element from falling down. In Embodiment 1, moreover, the insulation film 21 functions as an etching stopper when the silicon oxide film over the plug 18a is to be etched off at the step of forming the connection hole for exposing the upper face of the plug 18a.

Figure 5:
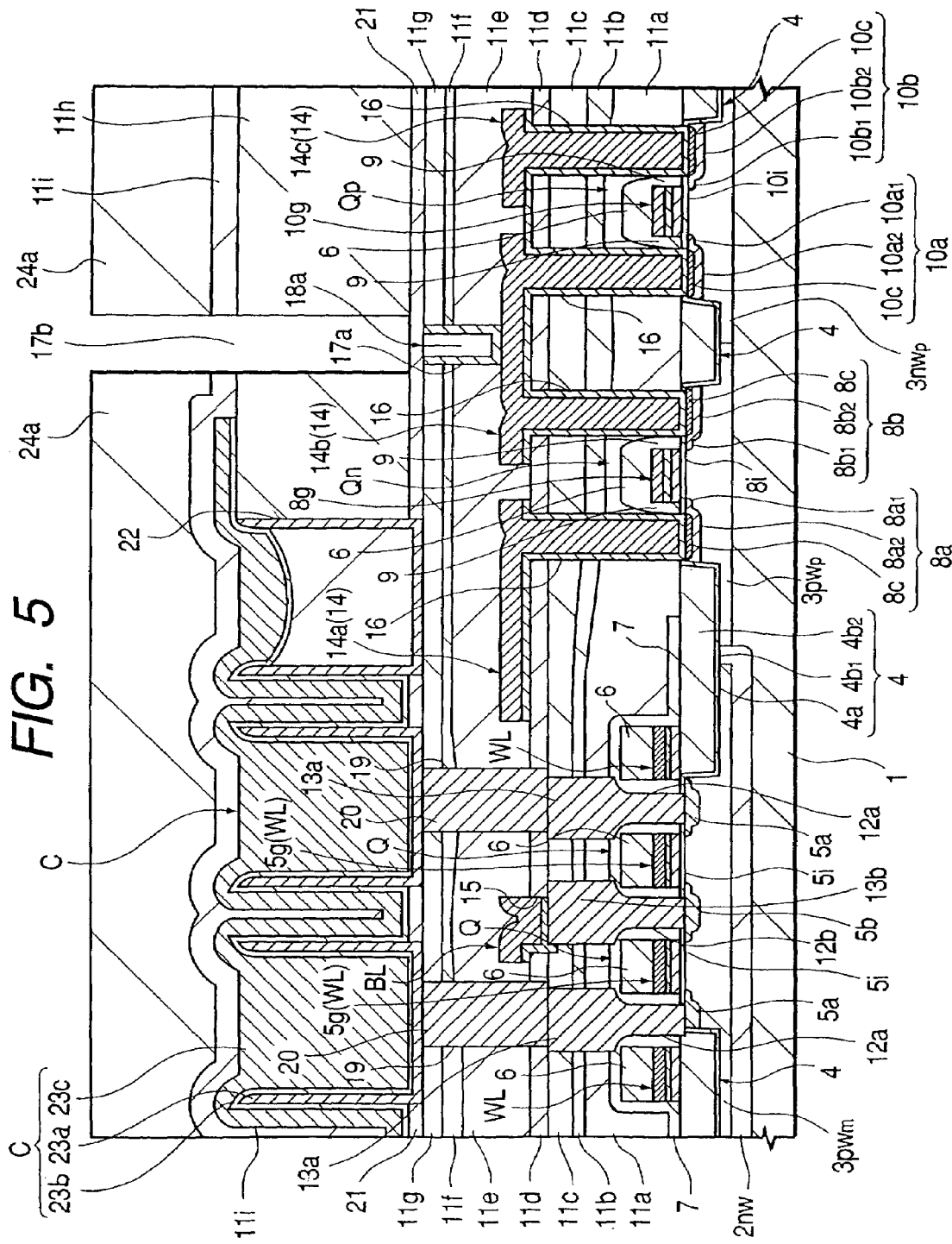
FIG. 5 is a section view of the semiconductor integrated circuit device in the manufacturing process subsequent to FIG. 4.

Next, on the insulation film 21, as shown in FIG. 5, there is deposited an interlayer insulating film (a third insulation film) 11h of silicon oxide or the like having a thickness of about 1.3 microns by a plasma CVD method or the like using ozone ($O_3$) or tetraethoxy silane (TEOS), for example, as the source gas. After this, a trench 22 for exposing the upper face of the plug 20 to the outside is formed in the interlayer insulating film 11h and the underlying insulation film 21 by a photolithography technique and an etching technique.

At the time of forming this trench 22 the etching treatment is performed at a high etching selection ratio between the silicon oxide film and the silicon nitride film. First, more specifically, by performing the etching treatment for etching off the silicon oxide film earlier, the portion of the interlayer insulating film 11h exposed from the photoresist pattern is removed. At this time, the underlying insulation film 21 is made of silicon nitride or the like so that it functions as an etching stopper. Subsequently, the portion of the insulation film 21 is removed by performing etching treatment to etch the silicon nitride earlier. At this time, the interlayer insulating film 11g underlying the insulation film 21 is not greatly removed at the time of removing the insulation film 21, because it is made of silicon oxide or the like.

After the step of forming such a trench 22, there is deposited on the semiconductor substrate 1 a conductor film made of low resistance polysilicon and having a film thickness of about 60 nm doped with an n-type impurity (e.g., P (phosphorous)), for example, by a CVD method. This conductor film of low resistance polysilicon is used as the storage electrode material for the information storage capacitive element.

Subsequently, an insulation film of silicon oxide or the like having a larger thickness (e.g., about 2 microns) than the depth of the trench 22 is formed by spin-coating on the conductor film made of the low resistance polysilicon. After this, the insulation film is etched back, and the conductor film of the low resistance polysilicon over the interlayer insulating film 11h is etched back to leave the conductor film of the low resistance polysilicon inside (on the inner wall and on the bottom) the trench 22.

After this, a storage electrode (a first electrode) 23a of the information storage capacitive element is formed by removing the interlayer insulating film 11h of the peripheral circuit region in the gap between the insulation film in the trench 22 and the trench 22 by a wet etching method using the photoresist film covering the interlayer insulating film 11h as a mask.

At this time, the insulation film 21 of silicon nitride or the like is left in the gap of the trench 22 so that the upper portion of the underlying layer insulating film 11g is not etched.

At this time, moreover, in Embodiment 1, the lower portion of the storage electrode 23a can be supported by the left insulation film 21, so that its fixing strength can be improved to prevent its fall-down.

Moreover, one end of the photoresist film covering the interlayer insulating film 11h of the peripheral circuit region is disposed at the boundary between the storage electrode 23a formed at its outermost end of the memory array, and the peripheral circuit region. Thus, even in the case of misalignment of the end portion of the photoresist film, neither is the insulation film left in the trench 22 of the storage electrode 23a to be formed at its outermost end of the memory array, nor is the interlayer insulating film 11h of the peripheral circuit region etched.

Next, after the removal of the photoresist, in order to prevent the low resistance polysilicon of the storage electrode 23a from being oxidized, the semiconductor substrate 1 is thermally treated in an ammonia atmosphere at about 800° C. to nitride the surface of the storage electrode 23a of the low resistance polysilicon. After this, an insulation film 23b of tantalum oxide having a thickness of about 20 nm, for example, is deposited on the storage electrode 23a by a CVD method.

Subsequently, the semiconductor substrate 1 is thermally treated at about 800° C., for example, to activate the insulation film 23b of tantalum oxide. This insulation film 23b is employed as a material for the capacitor insulating film of the information storage capacitive element.

After this, a conductor film of titanium nitride or the like having a thickness of about 150 nm, for example, is deposited on the surface of the insulation film 23b by a CVD method and a sputtering method. After this, the conductor film and the insulation film 23b are patterned by a photolithography technique and a dry etching technique.

As a result, there is formed a crown-shaped information storage capacitive element C which is constituted of an upper electrode (a second electrode) 23c, an insulating film made of tantalum oxide or the like, and a storage electrode 23a made of low resistance polysilicon. Thus, there is provided a memory cell of a DRAM, which is constructed to include the memory cell selecting MOSFET Q and the information storage capacitive element C connected in series with the MOSFET Q.

Next, there is deposited on the interlayer insulating film 11h an interlayer insulating film (a third insulation film) 11i which is made of silicon oxide or the like having a thickness of about 100 nm, for example, to cover the information storage capacitive element C. This interlayer insulating film 11i is deposited by a plasma CVD method using ozone ($O_3$) and tetraethoxy silane (TEOS), for example, as the source gas.

Subsequently, a photoresist pattern 24a for opening a connection hole in the peripheral circuit region is formed over the interlayer insulating film 11i. After this, the photoresist pattern 24a is used as a mask to etch off the interlayer insulating films 11i and 11h exposed therefrom, and the insulation film 21 thereby to open a connection hole (a second connection hole) 17b for exposing the upper portion of the plug 18a to the outside. This connection hole 17b is given a diameter, although the invention is not especially limited thereto, of one to 1.5 times (0.3 to 0.6 microns) as large as that of the gate work length, or preferably about 0.4 microns and larger than that of the aforementioned connection hole 17a. Moreover, the depth is about 1.8 microns, although the invention is not especially limited thereto.

At the time of forming the connection hole 17b, the silicon oxide film and the silicon nitride film are etched at an increased etching selection ratio. Specifically, first, the portions of the interlayer insulating films 11i and 11h exposed from the photoresist pattern 24a are removed by performing an etching process in such a way that the silicon oxide film may be etched off earlier. At this time, the underlying insulation film 21 functions as an etching stopper because it is made of silicon nitride or the like. Subsequently, the portion of the insulation film 21 is removed by performing an etching process in such a way that the silicon nitride may be etched off earlier. At this time, the interlayer insulating film 11g underlying the insulation film 21 is not greatly removed when the insulation film is removed, because it is made of silicon oxide or the like.

Figure 6:
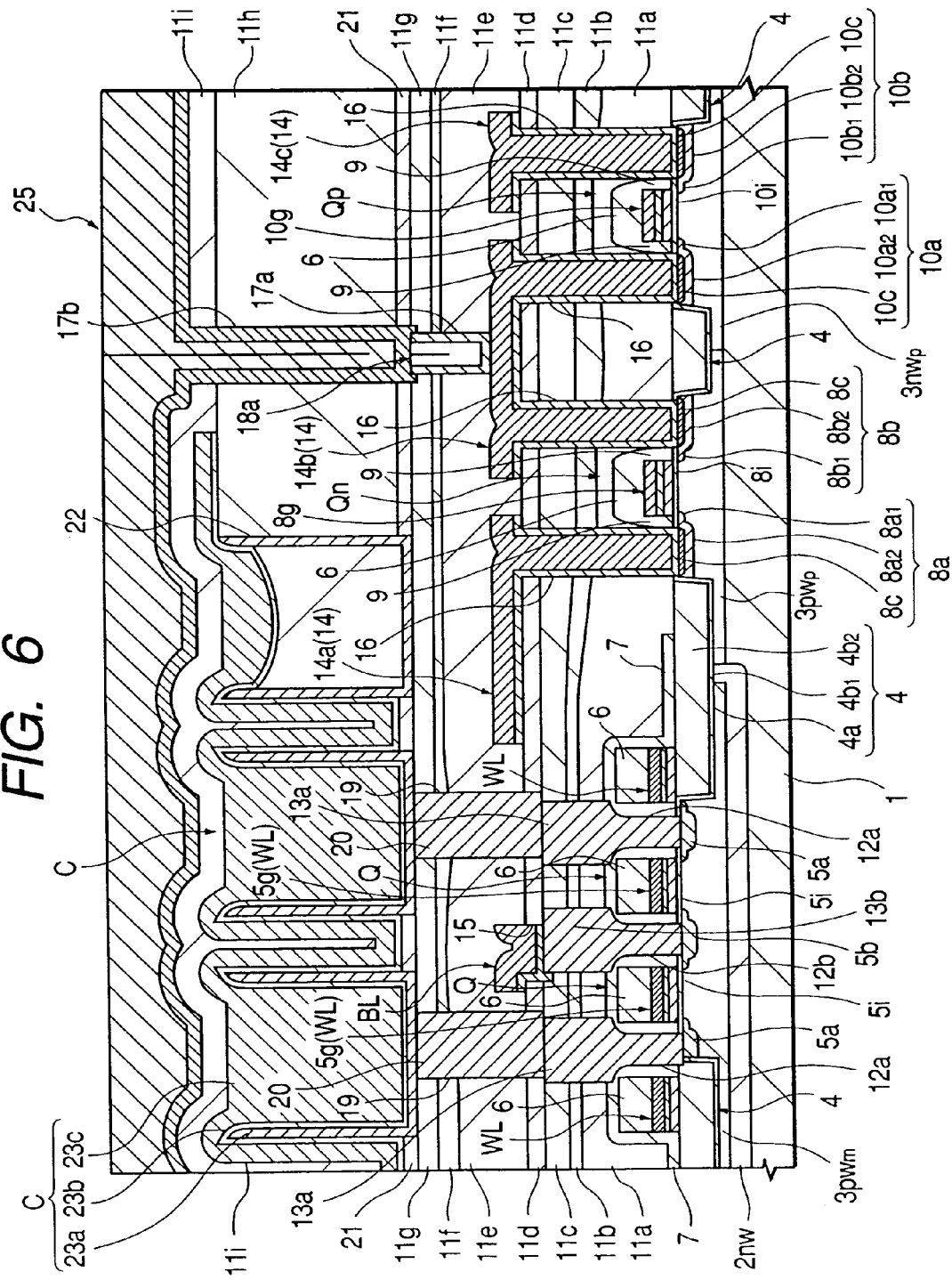
FIG. 6 is a section view if the semiconductor integrated circuit device in the manufacturing process subsequent to FIG. 5.

After the connection hole 17b is thus opened in the peripheral circuit region, as shown in FIG. 6, the upper face of the interlayer insulating film 11i and, the inside of the connection hole 17b are covered with a conductor film 25 by a blanket CVD method or the like.

Specifically, the conductor film 25 is formed by depositing a thin conductor film, such as a titanium nitride film, for example, by a sputtering method or the like and subsequently by depositing a thick conductor film, such as a tungsten film, on the thin conductor film, by a CVD method or the like. At this time, the connection hole 17b is filled in with the conductor film 25 completely up to its upper portion.

Figure 7:
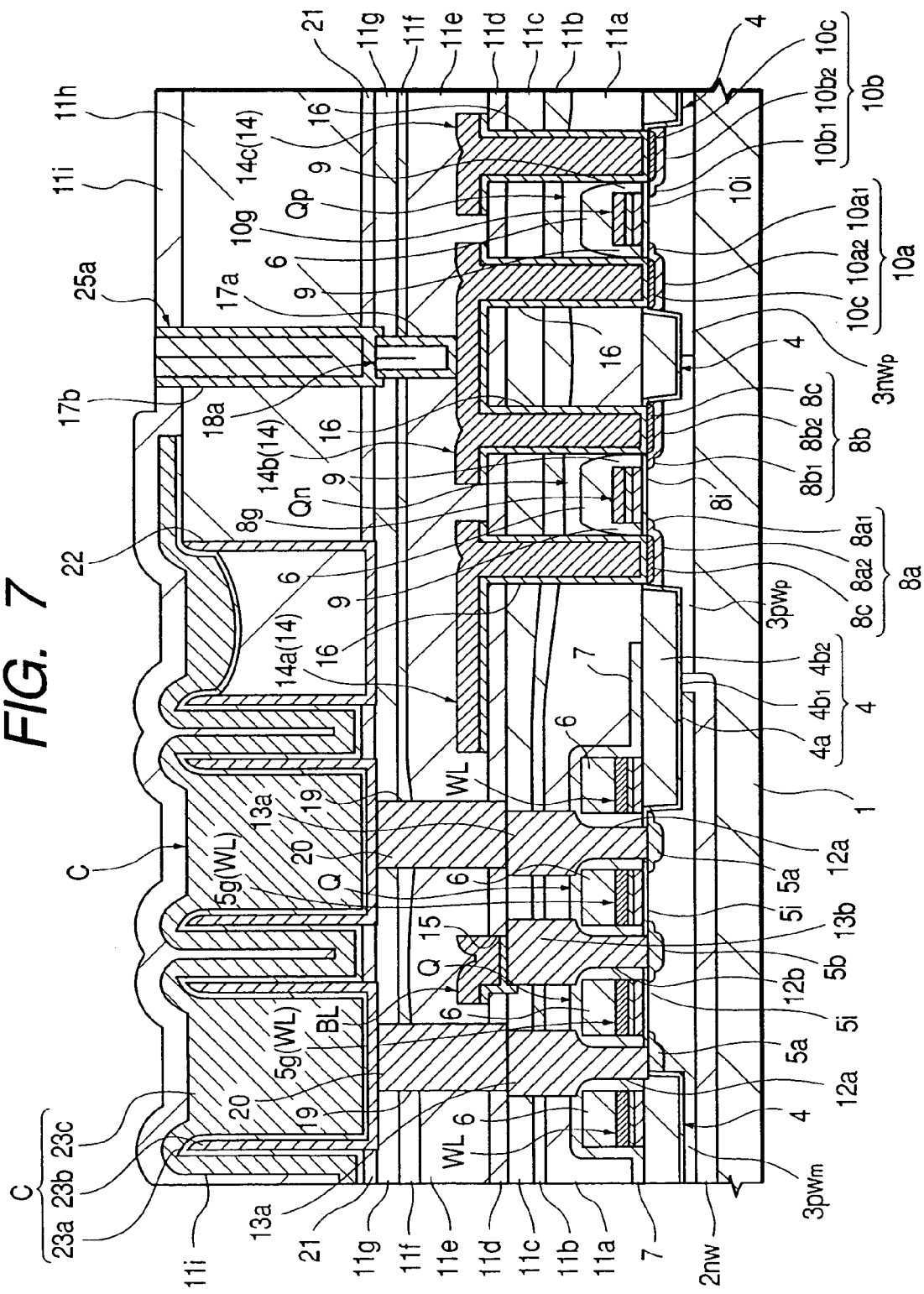
FIG. 7 is a section view of the semiconductor integrated circuit device in the manufacturing process subsequent to FIG. 6.

After this, a plug (a second connection portion) 25a is formed in the connection hole 17b, as shown in FIG. 7, by subjecting the semiconductor substrate 1 to an anisotropic dry etching treatment to remove the conductor film 25 from the upper face of the interlayer insulating film 11i while leaving the conductor film 25 in the connection hole 17b. This plug 25a is electrically connected in direct contact with the plug 18a.

Next, a conductor film of titanium nitride, for example, is deposited on the interlayer insulating film 11i by a sputtering method or the like. Aluminum (Al) or an Al alloy such as an Al—Si—Cu alloy is deposited on the conductor film by a sputtering method. Moreover, a conductor film of titanium nitride or the like, for example, is deposited on the aluminum or its alloy by a sputtering method or the like.

Figure 8:
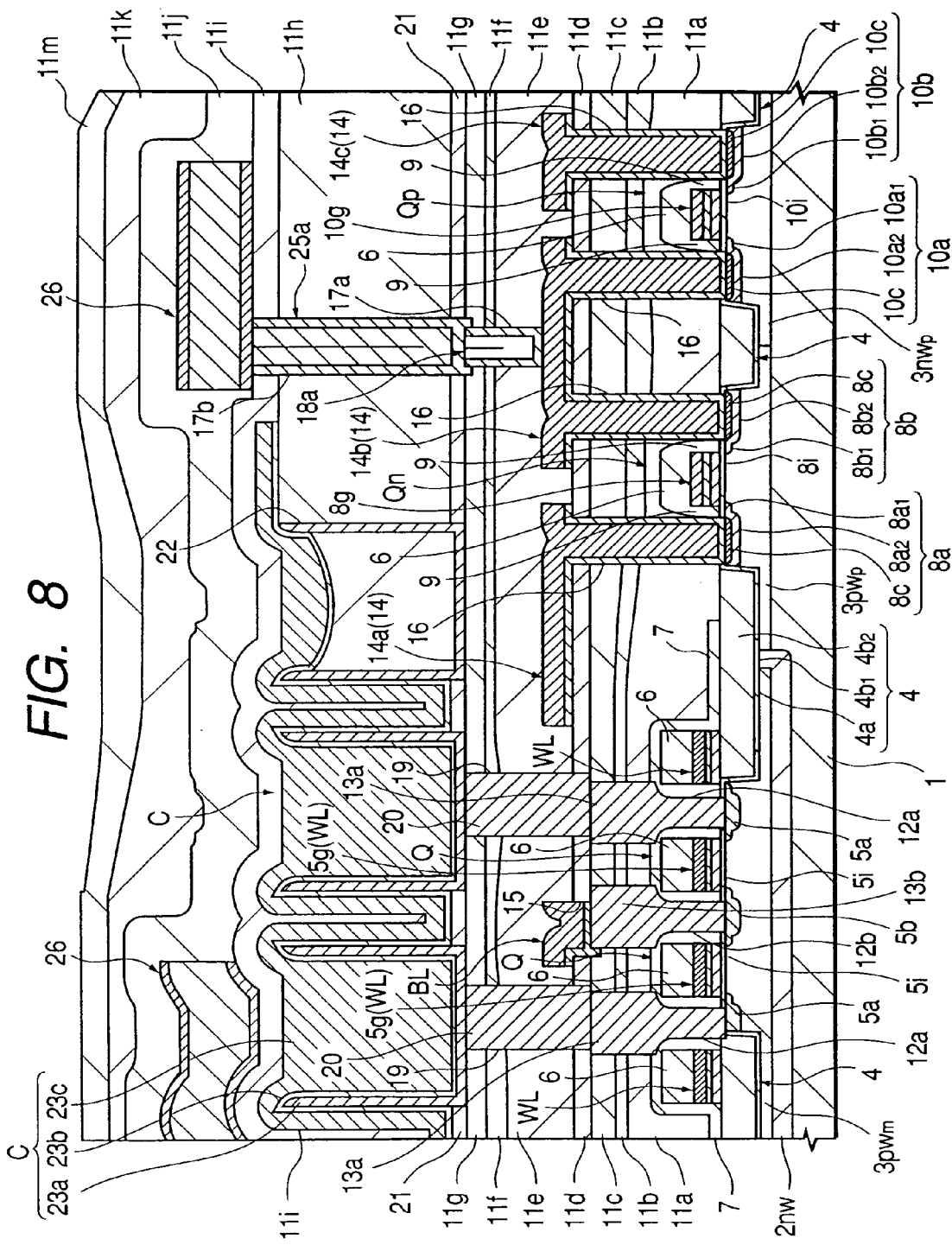
FIG. 8 is a section view of the semiconductor integrated circuit device in the manufacturing process subsequent to FIG. 7.

Subsequently, a second-layer line 26 is formed, as shown in FIG. 8, by patterning the multilayer conductor film by a photolithography technique or a dry etching technique. This second-layer line 26 is given a width of about 0.7 microns, for example, although the invention is not especially limited thereto, and a thickness of about 0.8 microns, for example, although the invention is not especially limited thereto.

After this, interlayer insulating films 11j, 11k and 11m of silicon oxide, for example, are deposited on the interlayer insulating film 11i by a CVD method or the like, and a third-layer line is formed like the second-layer line 26 on those interlayer insulating films.

After this, a surface protective film, which is formed of either a single-layer film of a silicon oxide film or a multilayer film having a silicon nitride film formed on a silicon oxide film, for example, is deposited to cover the third-layer line by a CVD method or the like, so that the DRAM is manufactured.

Thus in Embodiment 1, the connection holes 17a and 17b for connecting the second-layer line 26 and the first-layer line 14 electrically are formed separately in two steps in the peripheral circuit region of the DRAM, and the conductor film is buried after opening the individual connection holes 17a and 17b to form the plugs 18a and 25a. In Embodiment 1, therefore, there is provided a structure in which the first-layer line 14 and the second-layer line 26 are electrically connected with each other through the two plugs 18a and 25a which are stacked in direct contact in the height direction between those wiring layers.

In the case of the technology in which the connection holes for connecting the first-layer line 14 and the second-layer line 26 are opened by one treatment in the peripheral circuit region of the DRAM, that is, in the case of the technique in which one connection hole for exposing a portion of the first-layer line 14 is opened in the insulation film between the first-layer line 14 and the second-layer line 26 prior to the step of depositing the conductor film for forming the second-layer line, the aspect ratio of the connection hole becomes so large that it is difficult to open and to fill it in with a conductor film.

In the memory cell region, three is interposed between the first-layer line 14 and the second-layer line 26 the information storage capacitive element C which has a tendency to have an increased height in order to ensure a large capacitance in a small occupied area. As the capacitance of the information storage capacitive element C increases, therefore, the connection hole naturally becomes deeper to increase the aspect ratio. In the case of the technology in which the aforementioned connection hole is opened by one process, the hole diameter has to be small so as to increase the aspect ratio, because the diameter has to be determined according to the fine first-layer line 14. This makes it difficult to fill the connection hole in with the conductor film, and the connection defect and the resistance variation/increase of the connection hole may take place to lower the production yield and the reliability of the DRAM.

When the aforementioned connection hole is opened by one process, moreover, over-etching is required considering the variation in the thickness of the interlayer insulating films 11h, 11g, 11f and 11e in the wafer. By this over-etching, however, the connection hole is extended, to the semiconductor substrate surface raising the possibility of a shortcircuit between the second-layer line and the semiconductor substrate.

In Embodiment 1, on the contrary, the connection holes 17a and 17b conductor film connecting the first-layer line 14 and the second-layer line 26 in the peripheral circuit regions are separately formed, that is, two hole making processes are conducted, and then the connection holes 17a and 17b are filled in with conductor films, facilitating the hole-making and filling-in processes. This makes it possible to improve the connection reliability of the first-layer line 14 and the second-layer line 26 and to improve the production yield and the reliability of the DRAM.

Especially in Embodiment 1, the connection hole 17b to be opened just before the step of depositing the conductor film for forming the second-layer line can be shallowed and enlarged in the diameter thereby to increase its aspect ratio. This is because the connection hole 17b may be opened so deeply as to expose the upper portion of the plug 18a, so that it can be made shallower by the height of the plug 18a (or the thickness of the interlayer insulating films 11e to 11g) than that of the case in which the connection hole is opened to expose a part of the first-layer line 14. In short, the plug 18a in the connection hole ha has a function to shallow the connection hole 17b thereby to lower its aspect ratio.

Figure 9:
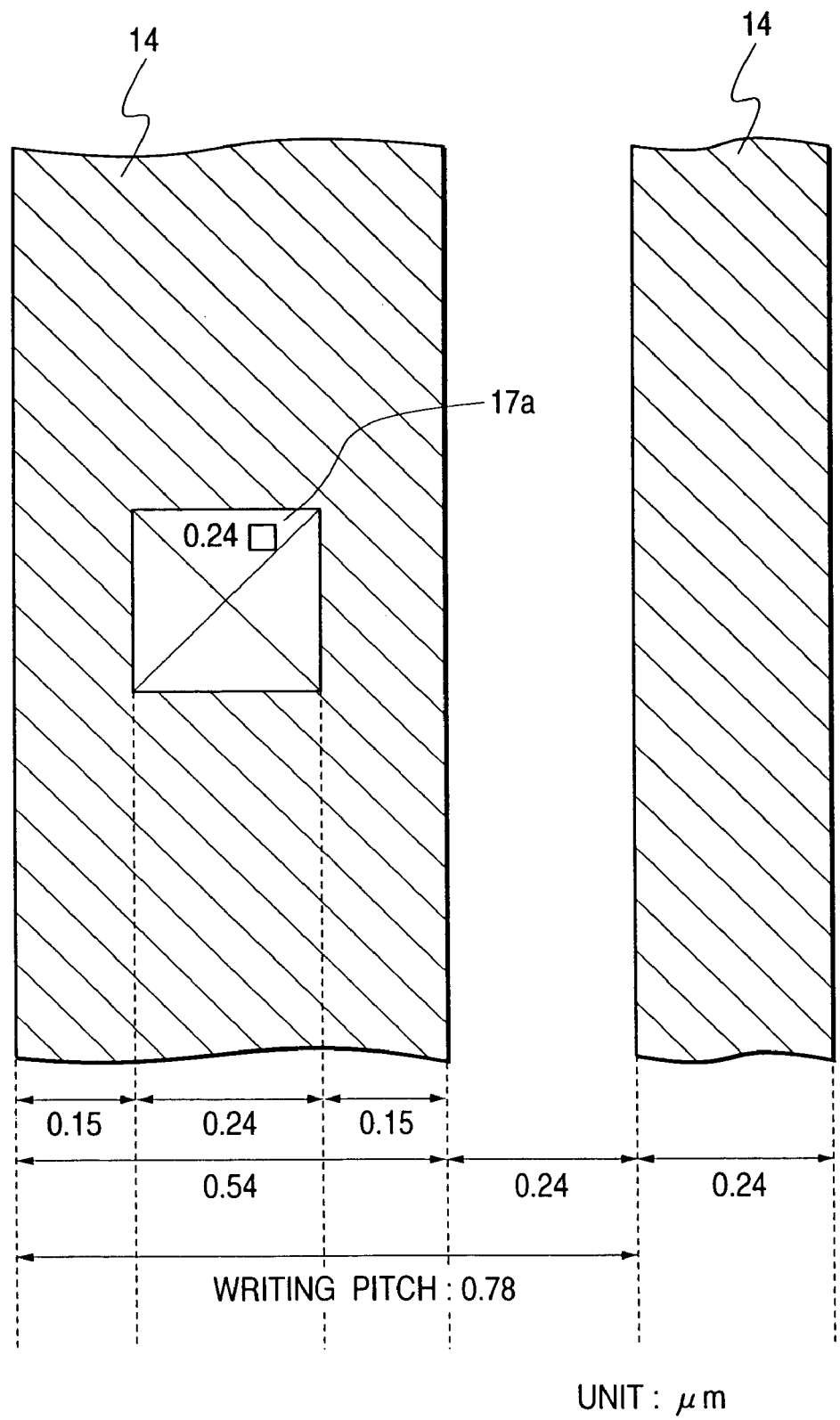
FIG. 9 is a top plan view showing essential portions of a connection hole of the semiconductor integrated circuit device of FIG. 8.
Figure 10:
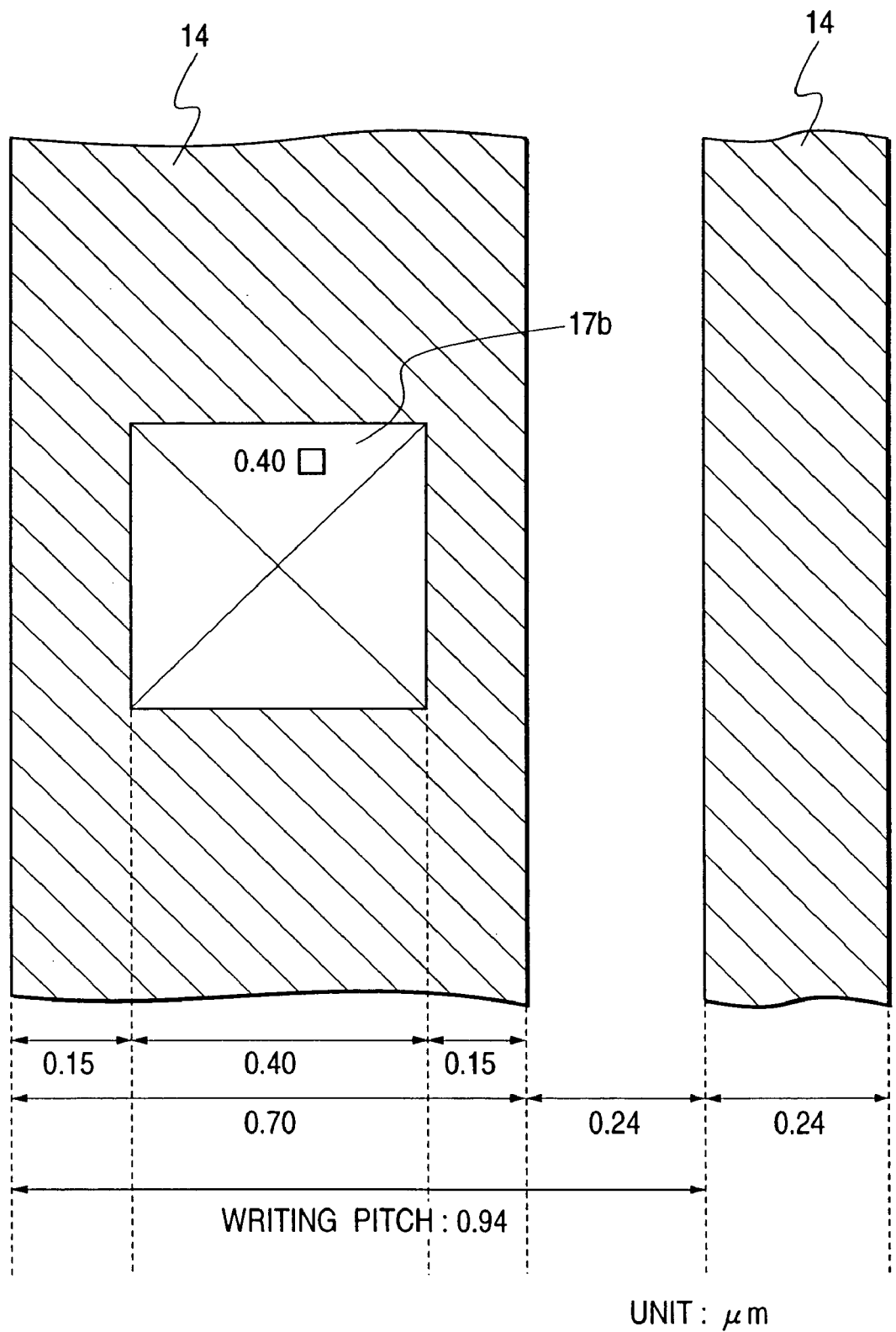
FIG. 10 is a top plan view showing essential portions of a connection hole of the semiconductor integrated circuit device of FIG. 8.

In Embodiment 1, moreover, the diameter of the connection hole 17b to be opened just before the step of depositing the conductor film for forming the second-layer line can be increased, as shown in FIGS. 9 and 10, to lower its aspect ratio. This will be explained in the following.

In the case of the technique in which the connection hole for exposing a part of the first-layer line 14 is to be opened in the peripheral circuit region, the diameter of the connection hole cannot be increased so much because it is restricted by the width of the minute first-layer line 14 connected with elements, by the planar aligning with the first-layer line 14 and by the gap with the first-layer line 14 adjacent thereto.

in Embodiment 1, on the contrary, the connection hole 17b in the peripheral circuit region may be opened to expose the upper portion of the plug 18a, and its diameter is less restricted by the first-layer line 14 than by the plug 18a. However, this restriction is looser than that by the first-layer line 14, so that the diameter for the connection hole, 17b can be set to a relatively large value. Here, the plug 18a in the connection hole 17a has a restriction loosening function to set a large diameter of the connection hole 17b.

FIGS. 9 and 10 show the case in which the width of the first-layer line 14 is determined considering the allowance (0.15 microns) of the registration with the connection holes 17a and 17b as in the ordinary setting case in which the connection hole for connecting the first-layer line and the second-layer line are opened by one process. Specifically, the wiring line width is set to establish the allowance of 0.15 microns of registration on both sides of the connection holes 17a and 17b when the connection holes 17a and 17b are arranged at the center of the wiring. In this embodiment, however, the connection hole 17a to be considered in terms of the planar misregistration with the first-layer line 14 is formed under the layer for forming the information storage capacitive element C and is positioned close to the layer for forming the first-layer line 14, so that the planar misregistration between the connection hole 17a and the first-layer line 14 can be made relatively small and the width of the first-layer line 14 can be set without considering the planar misregistration. In short, the width of the first-layer line 14 receives no restriction from the connection hole. It is unnecessary to widen the width of the first-layer line 14 as a whole and to form a wide pattern in a portion (where the connection hole 17a is made) of the first-layer line 14. This makes it possible to reduce the width of the first-layer line 14 thereby to dispose the first-layer line 14 highly densely. For example, the width of the first-layer line 14 to be connected with the connection hole 17a can be equalized to the diameter of the connection hole 17a. As a result, it is possible to promote the size reduction of the semiconductor chip.

Thus, the following effects can be achieved in Embodiment 1.

(1) In the peripheral circuit region of the DRAM, the connection hole for connecting the first-layer line 14 and the second-layer line 26 electrically is divided into two, the connection holes 17a and 17b, and the plugs 18a and 25a are buried in the two individual connection holes, so that the process to open the connection holes 17a and 17b and the process to bury the conductor film can be facilitated.

(2) By making the diameter of the connection hole 17b larger than that of the connection hole 17a, it is possible to reduce the required positioning accuracy in the photolithography step for forming the connection hole 17b. It is also possible to facilitate the opening process at the etching step of forming the connection hole 17b. It is further possible to facilitate and improve the process to bury the conductor film in the connection hole. 17b.

Thanks to the foregoing effects (1) and (2), the electrical connection defect of the connection holes 17a and 17b for connecting the first-layer line 14 and the second-layer line 26 electrically can be reduced to improve the production yield and the reliability of the DRAM.

Thanks to the foregoing effect (1), at the time of setting the height of the cylindrical information storage capacitive element C, the restriction imposed by the connection holes 17a and 17b to be opened in the peripheral circuit region can be relaxed to increase the capacitance of the information storage capacitive element C. As a result, the capacitance contributing to the information storage can be increased without increasing the area occupied by the information storage capacitive element C and without additionally introducing any high-degree and complicated processing technique.

(5) Thanks to the aforementioned effect (4), the refresh characteristics of the DRAM and the reliability of the read/write operations can be improved without increasing the area of the memory cell region.

Embodiment 2

FIGS. 11 to 18 are sections of portions of a semiconductor integrated circuit device shown in the manufacturing process according to another embodiment of the invention.

In Embodiment 2, as well, the description will be directed to the case in which the technical concept of the invention is applied to a 256M DRAM, for example.

Figure 11:
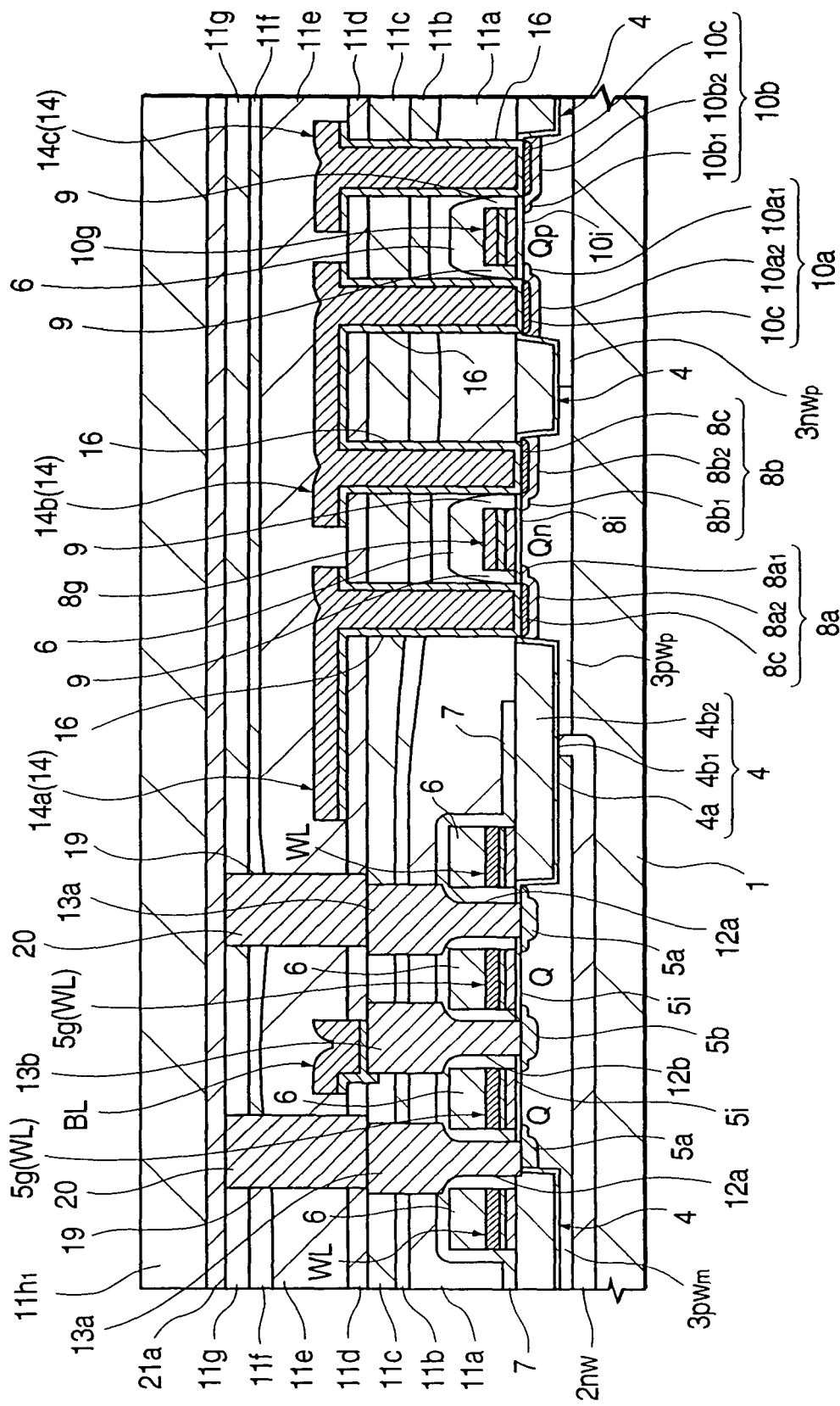
FIG. 11 is a section view of a portion of a semiconductor integrated circuit device manufactured according to another embodiment of the invention.

First, the connection hole 19 for exposing the upper face of the plug 13a is opened, as shown in FIG. 11, in the interlayer insulating films hid to hg shown in FIG. 1, by a photolithography technique and a dry etching technique.

Subsequently, the upper face of the interlayer insulating film 11g and the inside of the connection hole 19 are deposited by a CVD method with a conductor film of low resistance polysilicon, for example, and the conductor film is then scraped by an etch-back method, a CMP method or the like. As in Embodiment 1, too, the plug 20 is formed by leaving the conductor film only in the connection hole 19 but not on the upper face of the interlayer insulating film 11g.

After this, the upper faces of the interlayer insulating film 11g and the plug 20 are covered by a CVD method or the like with an insulation film (a second insulation film) 21a of, e.g., silicon nitride, and the upper face of this insulation film is also covered by a CVD method or the like with an interlayer insulating film (a fourth insulation film) 11h1 of, e.g., silicon oxide.

Figure 12:
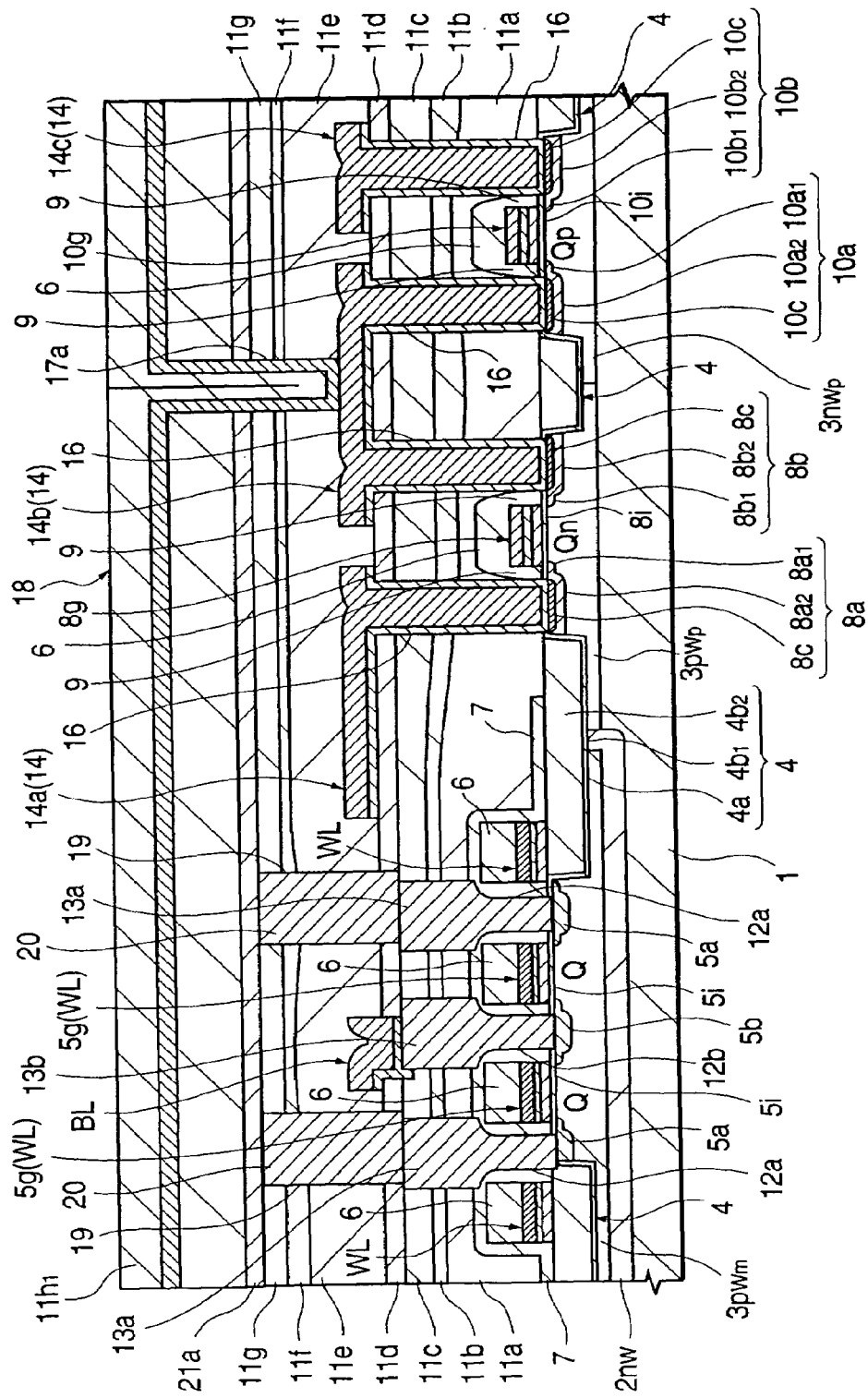
FIG. 12 is a section view of the semiconductor integrated circuit device in the manufacturing process subsequent to FIG. 11.

Next, the connection hole 17a is so opened in the interlayer insulating films 11e to 11g, the insulator film 21a and the interlayer insulating film 11h1 by a photolithography technique and a dry etching technique as to expose a part of the first-layer line 14b, as shown in FIG. 12. The diameter of this connection hole 17a is, although the invention is not especially limited thereto, the gate work length to the gate work length×1.5 microns, or preferably about 0.25 microns. Moreover, the depth is about 1.2 microns, for example, although the invention is not especially limited thereto.

Subsequently, the upper face of the interlayer insulating film 11h11 and the inside of the connection hole 17a are covered with the conductor film 18 by a blanket CVD method or the like. Specifically, the conductor film 18 is formed by depositing a thin conductor film, such as a titanium nitride film, for example, by a sputtering method or the like and by depositing a thick conductor film of, e.g., a tungsten film on the thin conductor film by a CVD method or the like. At this time, the connection hole 17a is filled completely to its upper portion with the conductor film 18.

Figure 13:
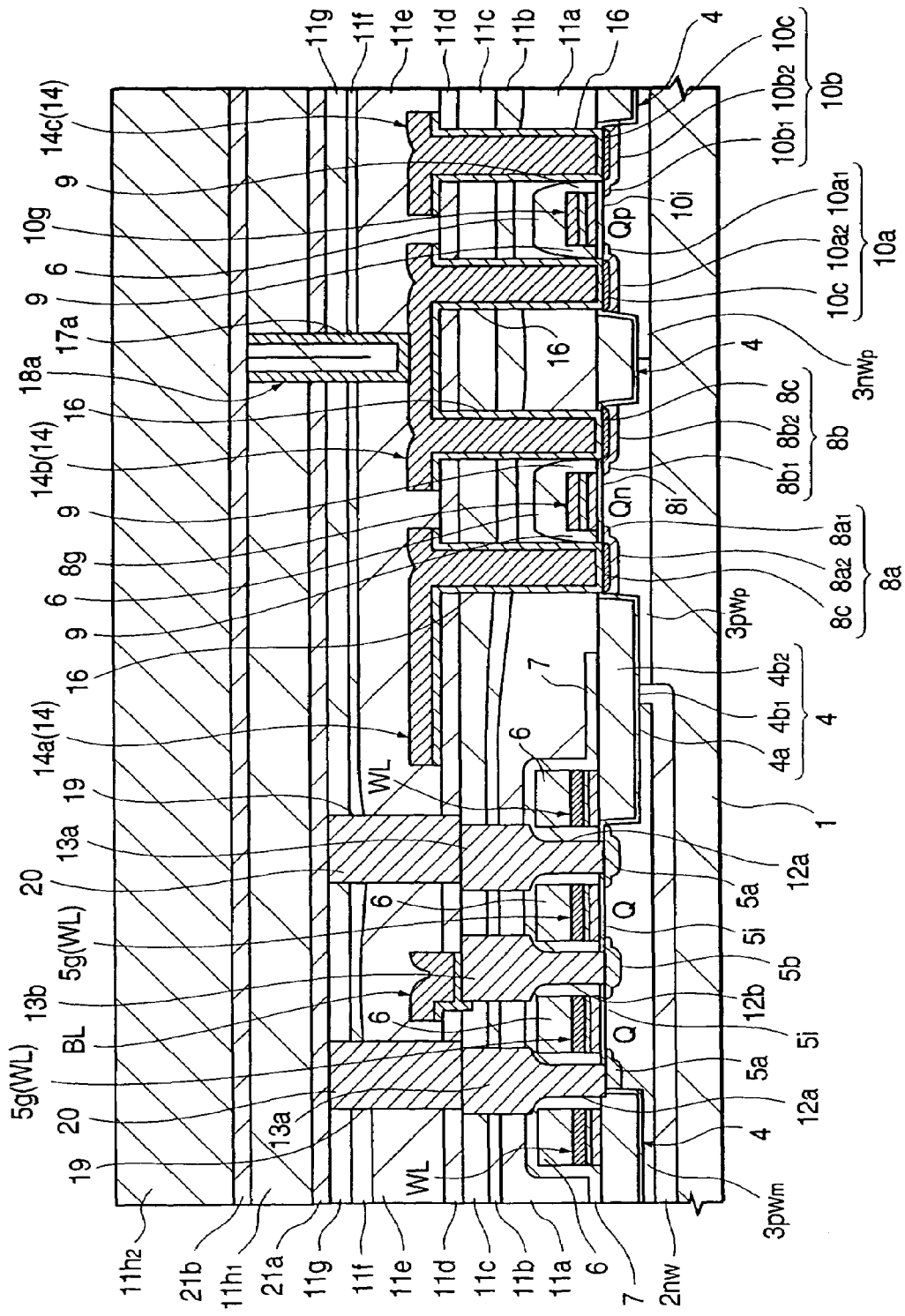
FIG. 13 is a section view of the semiconductor integrated circuit device in the manufacturing process subsequent to FIG. 12.

After this, the semiconductor substrate 1 is subjected to an anisotropic dry etching treatment or a CMP process to remove the conductor film 18 on the upper face of the interlayer insulating film 11h1 while leaving the conductor film 18 only in the connection hole 17a, thereby to form the plug (the first connection portion) 18a in the connection hole 17a, as shown in FIG. 13.

Next, the upper faces of the interlayer insulating film 11h1 and the plug 18a are covered by a CVD method or the like with an insulation film (a fifth insulation film) 21b of, e.g., silicon nitride, and the insulation film 21b is then covered by a CVD method or the like with an interlayer insulating film (a sixth insulation film) 11h2 of, e.g., silicon oxide.

Figure 14:
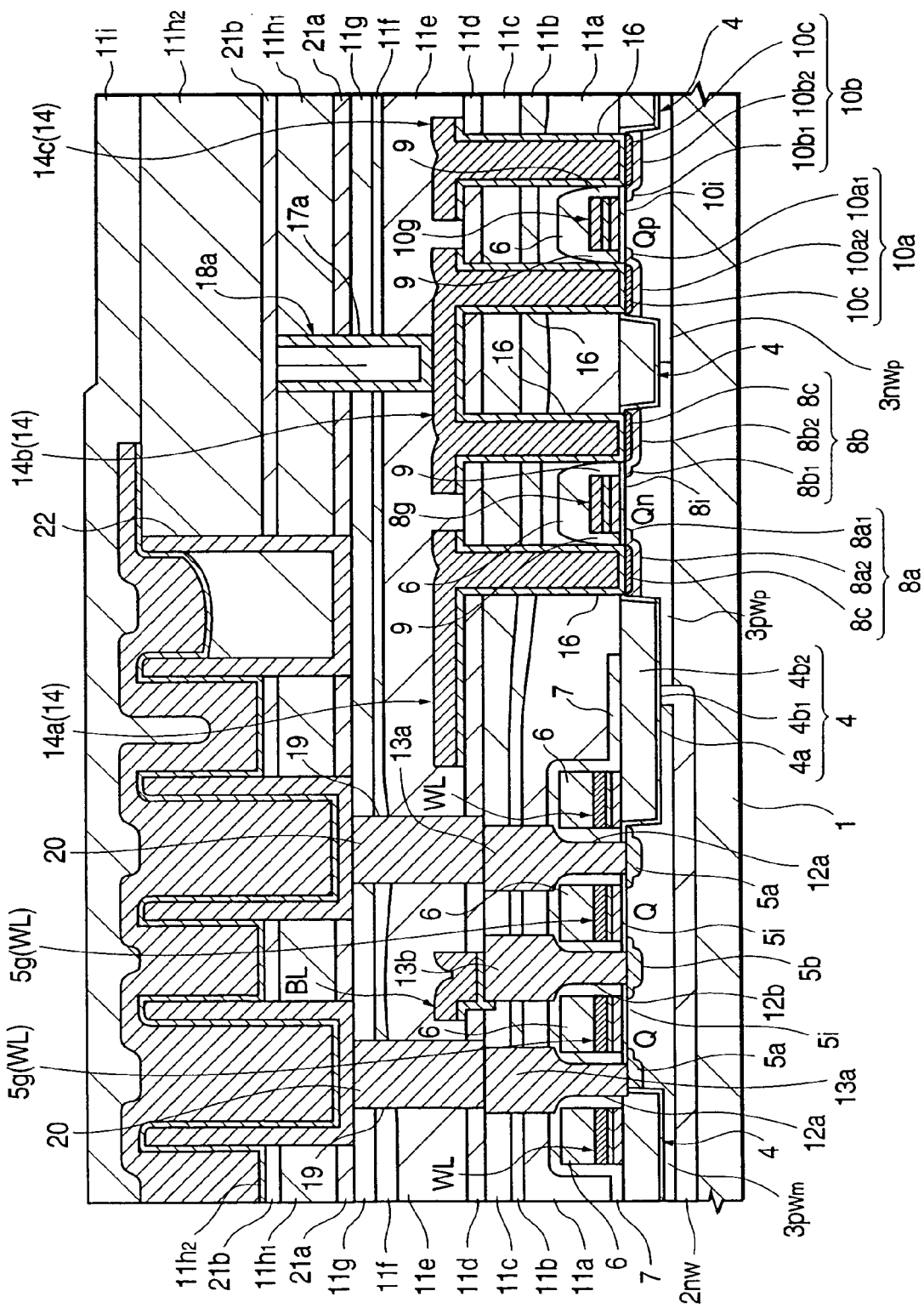
FIG. 14 is a section view of the semiconductor integrated circuit device in the manufacturing process subsequent to FIG. 13

Subsequently, the trenches 22 for exposing the upper face of the plug 20 are formed in the interlayer insulating films 11h1 and 11h2 and the insulation films 21a and 21b, as shown in FIG. 14, by a photolithography technique and an etching technique.

At the formation of the trenches 22, the interlayer insulating film 11h1 is etched off at an increased etching selection ratio between the silicon oxide film and the silicon nitride film.

Specifically, the portion of the interlayer insulating film 11h1, exposed from the photoresist pattern, is first removed by performing an etching process in which the silicon oxide film is etched off earlier. At this time, the underlying insulation film 21a functions as an etching stopper because it is made of silicon oxide or the like.

Subsequently, the portion of the insulation film 21a is removed by performing an etching process in which the silicon nitride is etched off earlier. At this time, the interlayer insulating film 11g underlying the insulation film 21a is not greatly removed when the insulation film 21a is removed, because it is made of silicon oxide or the like.

After this step of forming the trenches. 22, there is deposited on the semiconductor substrate 1 by a CVD method a conductor film made of low resistance polysilicon, having a thickness of about 60 nm and doped with, e.g., an n-type impurity (e.g., P (phosphorous)). This conductor film of low resistance polysilicon is employed as the storage electrode material for the information storage capacitive element.

Subsequently, an insulation film of silicon oxide having a larger thickness (e.g., about 2 microns) than the depth of the trenches 22, is formed by spin-coating on the conductor film made of the low resistance polysilicon. After this, the insulation film is etched back, and the conductor film of low resistance polysilicon on the interlayer insulating film 11h2 is etched back, so that the conductor film of low resistance polysilicon is left in (on the inner walls and on the bottoms of) the trenches 22.

After this, the photoresist film covering the interlayer insulating film 11h1 of the peripheral circuit region is employed as a mask to wet-etch off the interlayer insulating film 11h2 in the gap between the insulation film in the trenches 22 and the trenches 22, thereby forming the capacitor electrode 23a of the information storage capacitive element.

At this time, the upper portion of the interlayer insulating film 11h1 underlying the insulation film 21b is not etched because the insulation film 21b of silicon nitride or the like is left in the gap of the trenches 22. Moreover, the interlayer insulating film 11h1 and the insulation film 12b have a function to prevent the storage electrode 23a from falling down. In this case, the ability to prevent the storage electrode from falling down can be improved more by the thickness of the insulation film 21b and the interlayer insulating film 11h1 than that of Embodiment 1.

One end of the photoresist film covering the interlayer insulating film 11h2 of the peripheral circuit region is disposed at the boundary between the storage electrode 23a, formed at the outermost portion of the memory array and the peripheral circuit region. Then, even if the misregistration occurs at the end of the photoresist film, the insulation film will not be left in the trench 22 of the storage electrode 23a formed at the outermost portion of the memory array, and the interlayer insulating film 11h2 of the peripheral circuit region will not be etched.

Next, as in Embodiment 1, for example, there is formed a cylindrical information storage capacitive element C which is constituted of the upper electrode 23c, the insulation film 23b of tantalum oxide or the like, and the storage electrode 23a of low resistance polysilicon. As a result, there is provided a memory cell for the DRAM constituted of the memory cell selecting MOSFET Q and the information storage capacitive element C connected in series with the former.

Subsequently, as in Embodiment 1, the interlayer insulating film (a seventh insulation film) 11i of silicon oxide or the like having a thickness of about 100 nm, for example, is so deposited on the interlayer insulating film 11h2 as to cover the information storage capacitive element C.

Figure 15:
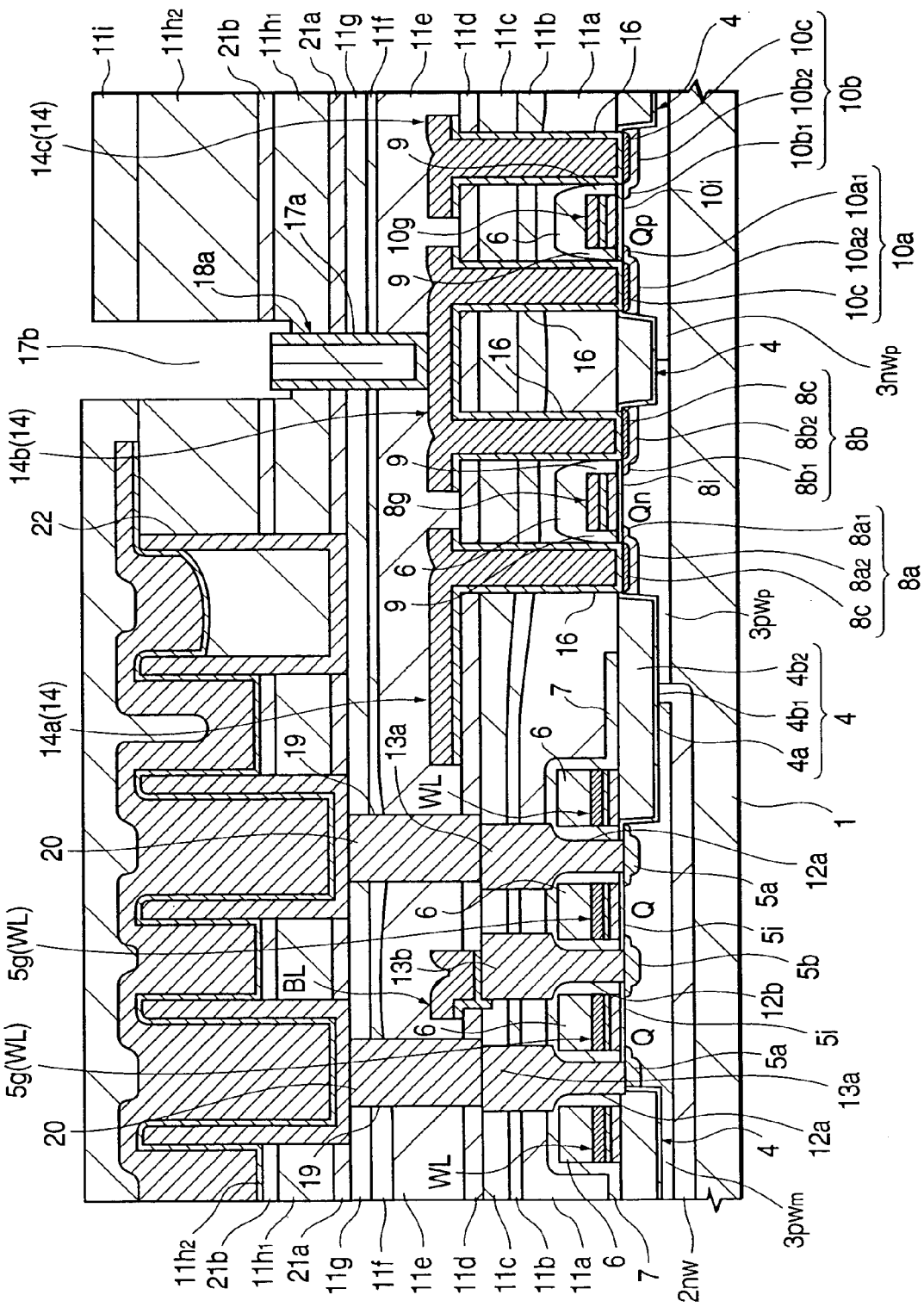
FIG. 15 is a section view of the semiconductor integrated circuit device in the manufacturing process subsequent to FIG. 14.

After this, a photoresist pattern for opening the connection hole in the peripheral circuit region is formed over the interlayer insulating film 11i and is employed as the mask to etch off a interlayer insulating films 11i and 11h2 and the insulation film 21b exposed from the resist pattern, thereby opening the connection hole 17b for exposing the upper portion of the plug 18a, as shown in FIG. 15.

The diameter of this connection hole 17b is about the gate work length (1.5 to 3.0 times), or preferably about 0.4 microns. In Embodiment 1, moreover, the upper portion of the plug 18a is positioned at an intermediate position relative to the height of the information storage capacitive element C, so that the connection hole 17b can be made shallower than that of the foregoing case of Embodiment 1. This makes the opening process of the connection hole 17b easier than that of Embodiment 1. The depth is about 1.3 microns, for example, although the invention is not especially limited thereto.

At the time of forming the connection hole 17b, the etching process is performed at an increased etching selection ratio between the silicon oxide film and the silicon nitride film. Specifically, the portions of the interlayer insulating films 11i and 11h2, exposed from the photoresist pattern, are removed by performing an etching process in which the silicon oxide film is etched off earlier. At this time, the underlying insulation film 21b functions as an etching stopper because it is made of silicon nitride or the like. Subsequently, the portion of the insulation film 21 is removed by performing an etching process in which the silicon nitride is etched off earlier. At this time, the interlayer insulating film 11h1 underlying the insulation film 21b is not greatly removed at the time of removing the insulation film 21b, because it is made of silicon oxide.

Figure 16:
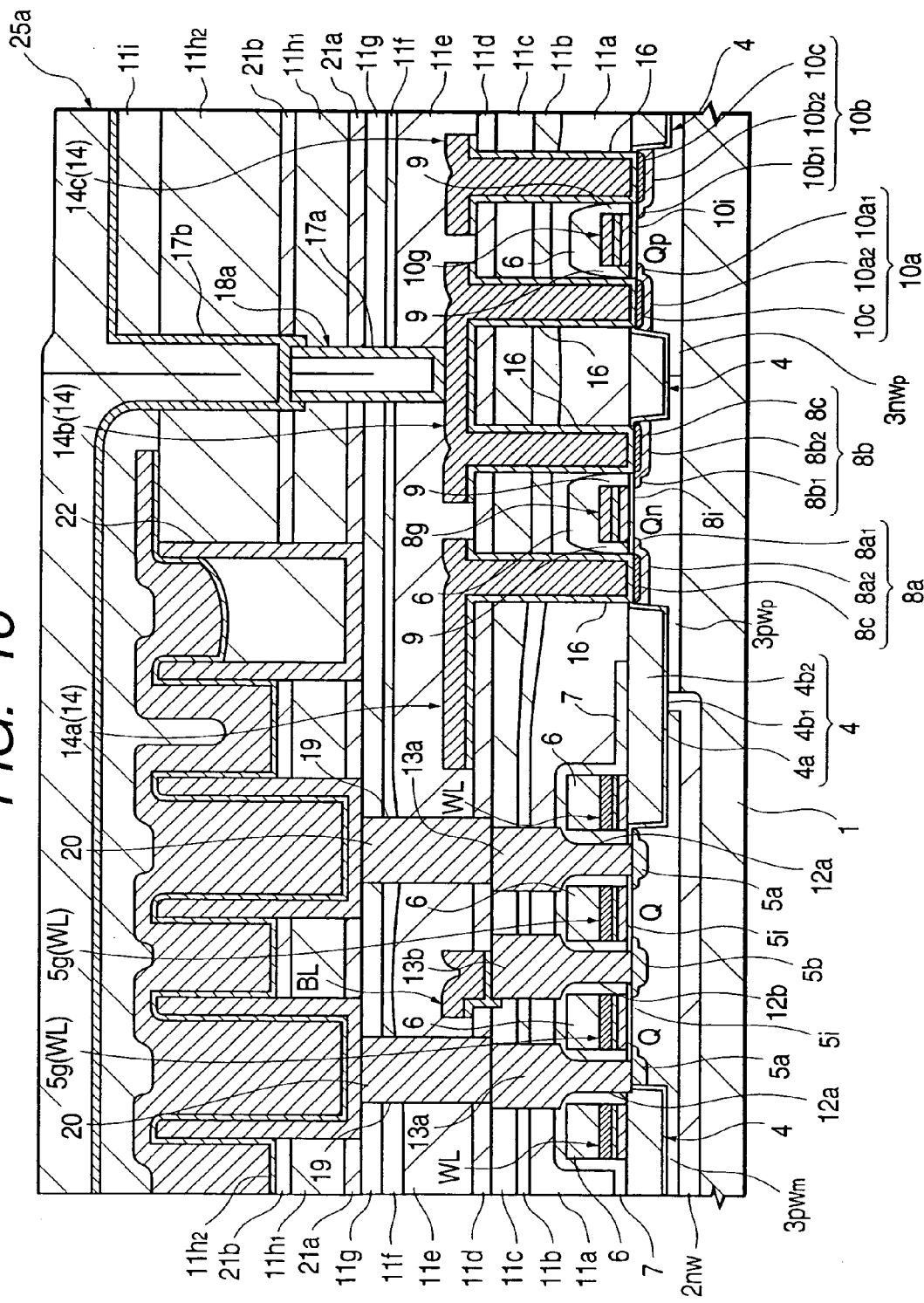
FIG. 16 is a section view of the semiconductor integrated circuit device in the manufacturing process subsequent to FIG. 15.
Figure 17:
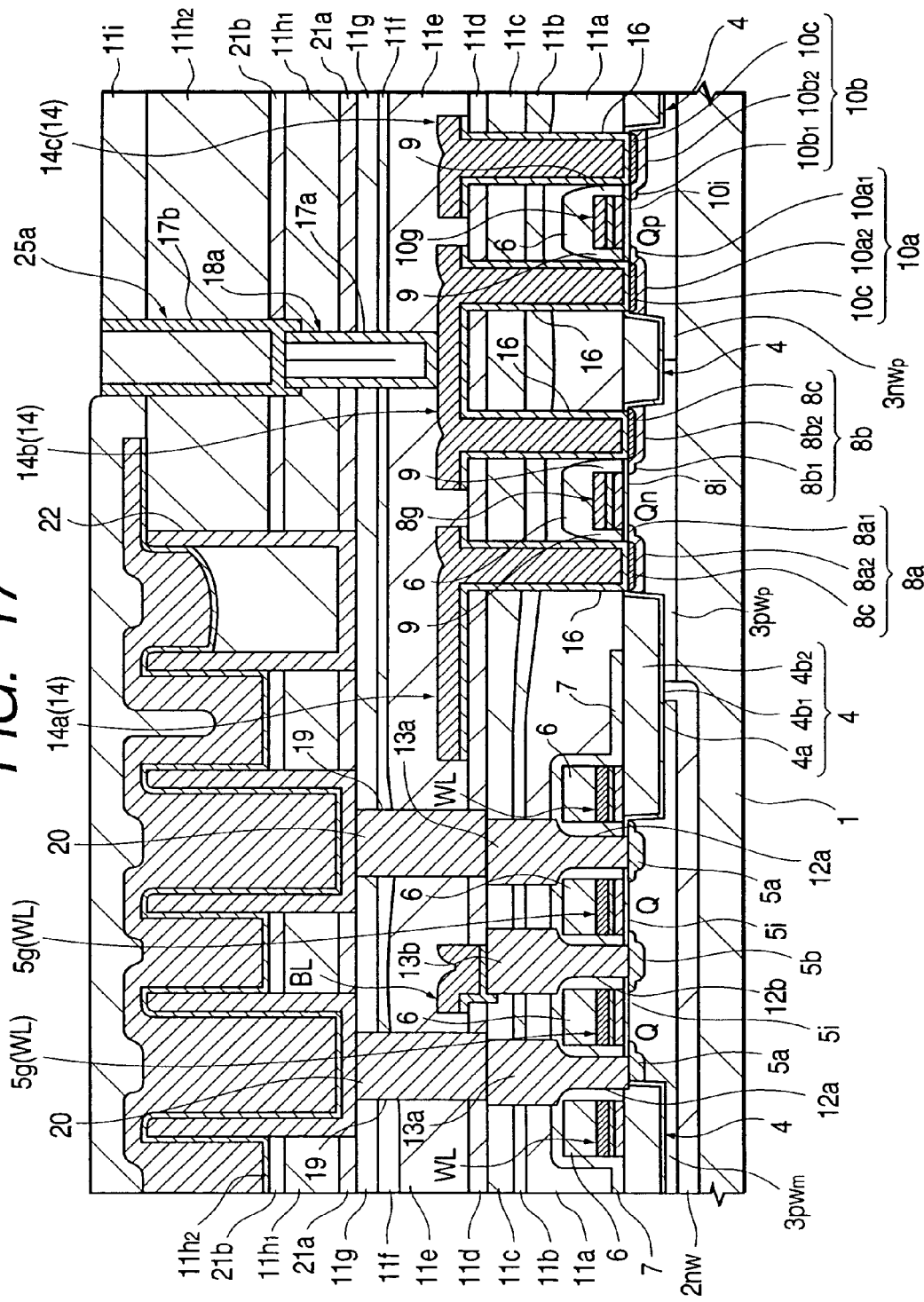
FIG. 17 is a section view of the semiconductor integrated circuit device in the manufacturing process subsequent to FIG. 16.

After this process of opening the connection hole 17b in the peripheral circuit region, the upper face of the interlayer insulating film 11i and the inside of the connection hole 17b are covered as in Embodiment 1 with the conductor film 25, as shown in FIG. 16.

Subsequently, the plug (a second connection portion) 25a is formed in the connection hole 17b, as shown in FIG. 16, by performing anisotropic dry etching of the semiconductor substrate 1 to remove the conductor film 25 on the upper face of the interlayer insulating film 11i while leaving the conductor film 25 in the connection hole 17b.

In the case of this embodiment, the depth of the connection hole 17b is smaller than that of the foregoing case of Embodiment 1 so that the conductor film can be more easily buried than that of Embodiment 1. Thus in Embodiment 2, as well, there is achieved in the peripheral circuit region a structure in which the plug 25a is stacked in direct contact on the plug 18a, so that they are electrically connected with each other.

Figure 18:
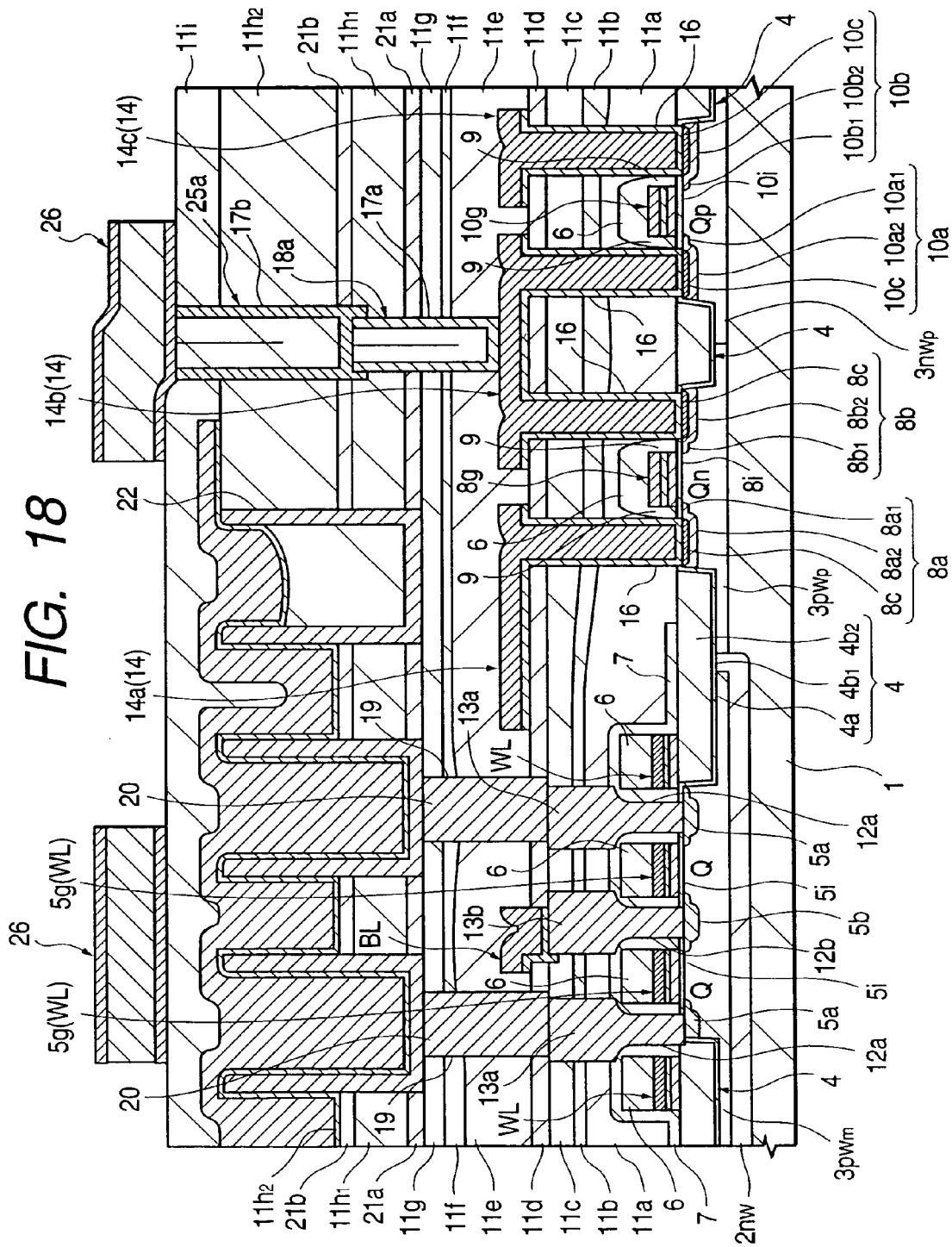
FIG. 18 is a section view of the semiconductor integrated circuit device in the manufacturing process subsequent to FIG. 17.

After this, as shown in FIG. 18, the DRAM is manufactured, as in Embodiment 1, by forming the second-layer line 26, depositing the interlayer insulating film of, e.g., silicon oxide on the interlayer insulating film 11i, forming a third-layer line like the second-layer line 26 on the interlayer insulating film, and depositing a surface protective film formed of either a single-layer film of, e.g., a silicon oxide film or a multilayer film having a silicon nitride film laid over a silicon oxide film in such a way as to cover the third-layer line.

In Embodiment 2 thus constructed, the following effects can be achieved in addition to those obtained in Embodiment 1.

(1) At the time of forming the information storage capacitive element C, the storage electrode 23a is supported by the interlayer insulating film 11h1 and the insulation films 21a and 21b, so that the ability of preventing the fall of the storage electrode 23a can be improved.

(2) The height of the uppermost portion of the plug 18a is at an intermediate position relative to the height of the information storage capacitive element C, so that the connection hole 17b can be made shallower than that of the aforementioned case of Embodiment 1, thereby reducing the aspect ratio. This makes it easier to open the connection hole 17b and to fill it in with the conductor film.

Embodiment 3

FIGS. 19 to 25 are sections of a semiconductor integrated circuit device show in the manufacturing process according to another embodiment of the invention.

Embodiment 3 will also be described with reference to the case in which the technical concept of the invention is applied to a 256M DRAM, for example.

Figure 19:
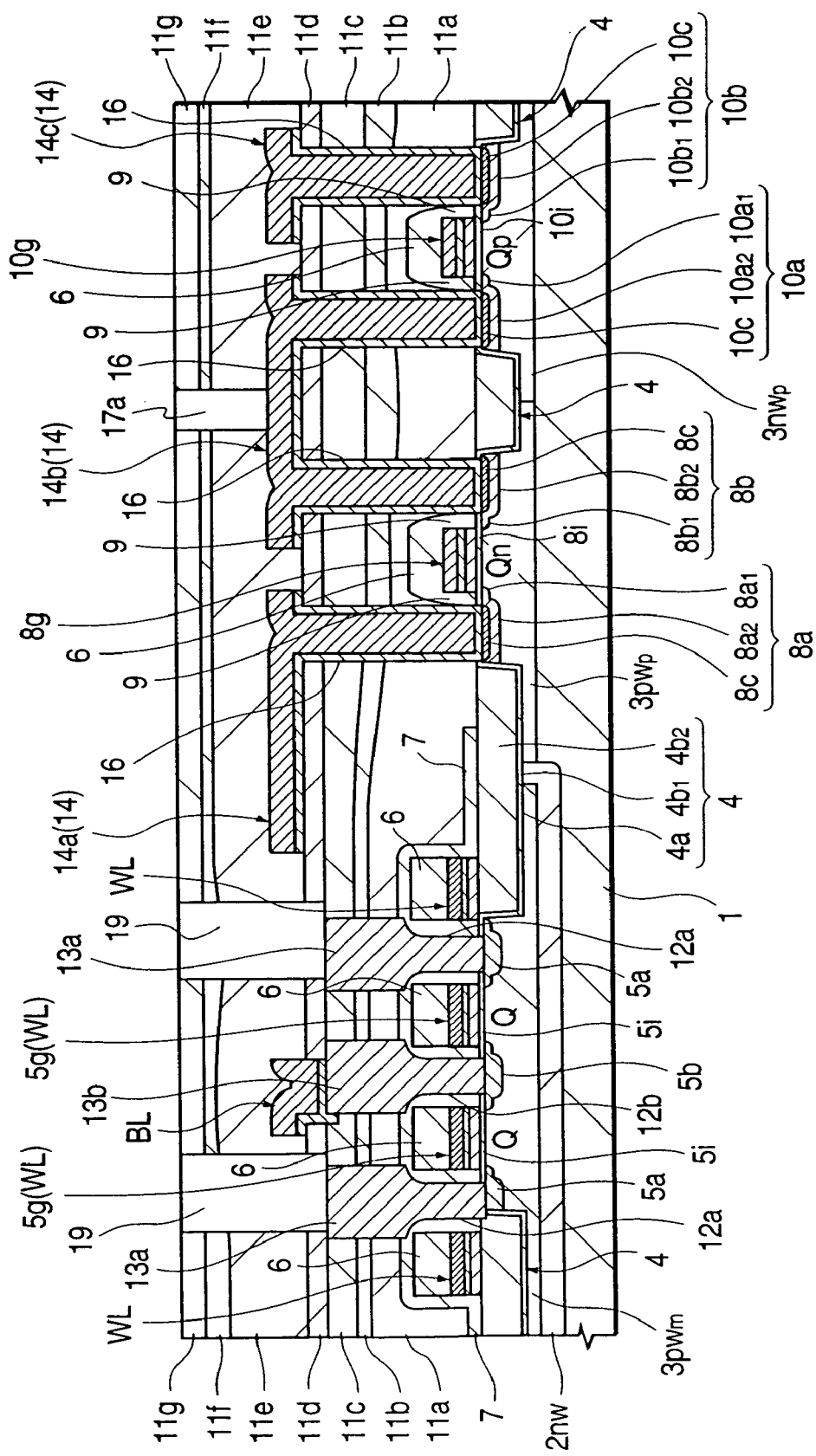
FIG. 19 is a section view of a portion of a semiconductor integrated circuit device manufactured according to another embodiment of the invention.

First, the interlayer insulating films 11d to 11g shown in FIG. 1 are opened, as shown in FIG. 19, to form the connection hole 19 for exposing the upper face of the plug 13a and the connection hole 17a for exposing a part of the first-layer line 14b, by a photolithography technique and a dry etching technique.

In Embodiment 3, more specifically, the connection hole 19 of the memory cell region and the connection hole 17a of the peripheral circuit region are simultaneously opened. As a result, there can be a reduction in the series of photolithography processes including the resist application, the exposure and the development, so that the manufacturing process can be accordingly simplified. Since one photolithography step can be omitted, moreover, it is possible to improve the production yield and reliability of the DRAM.

The connection hole 19 of this case is given a diameter of about 0.2 microns, for example, although the invention is not especially limited thereto, and a depth of about 0.8 microns, for example, although the invention is not especially limited thereto. Moreover, the connection hole 17a of this case is given a diameter of about 0.25 microns, for example, although the invention is not especially limited thereto, and a depth of about 0.7 microns, for example, although the invention is not especially limited thereto.

Figure 20:
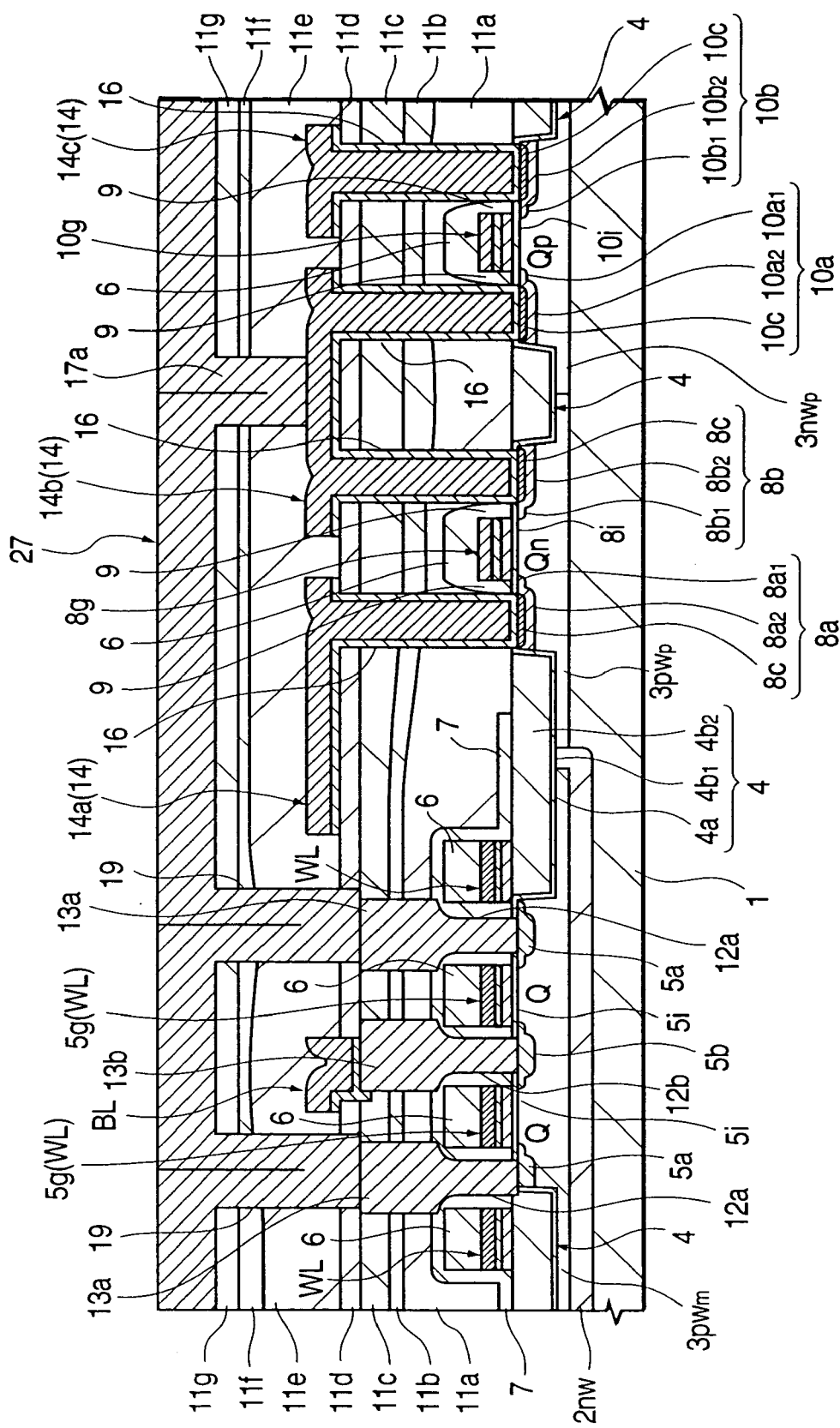
FIG. 20 is a section view of the semiconductor integrated circuit device in the manufacturing process subsequent to FIG. 19.

Subsequently, as shown in FIG. 20, the upper face of the interlayer insulating film 11g and the insides of the connection holes 17a and 19 are covered by a CVD method with a conductor film 27 of, e.g., titanium nitride, and this conductor film 27 is then scraped by an etch-back method, a CMP method or the like.

Figure 21:
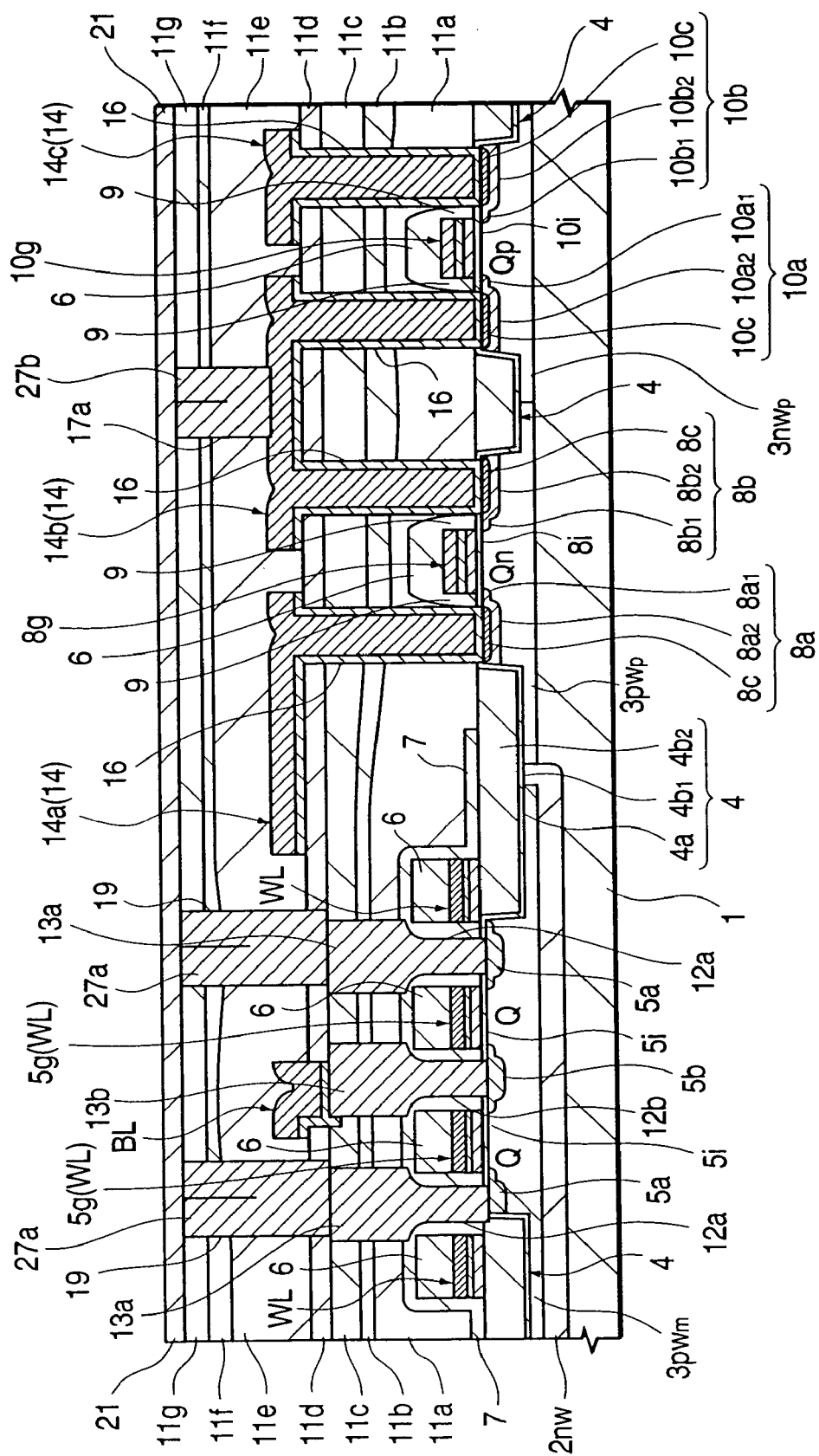
FIG. 21 is a section view of the semiconductor integrated circuit device in the manufacturing process subsequent to FIG. 20.
Figure 22:
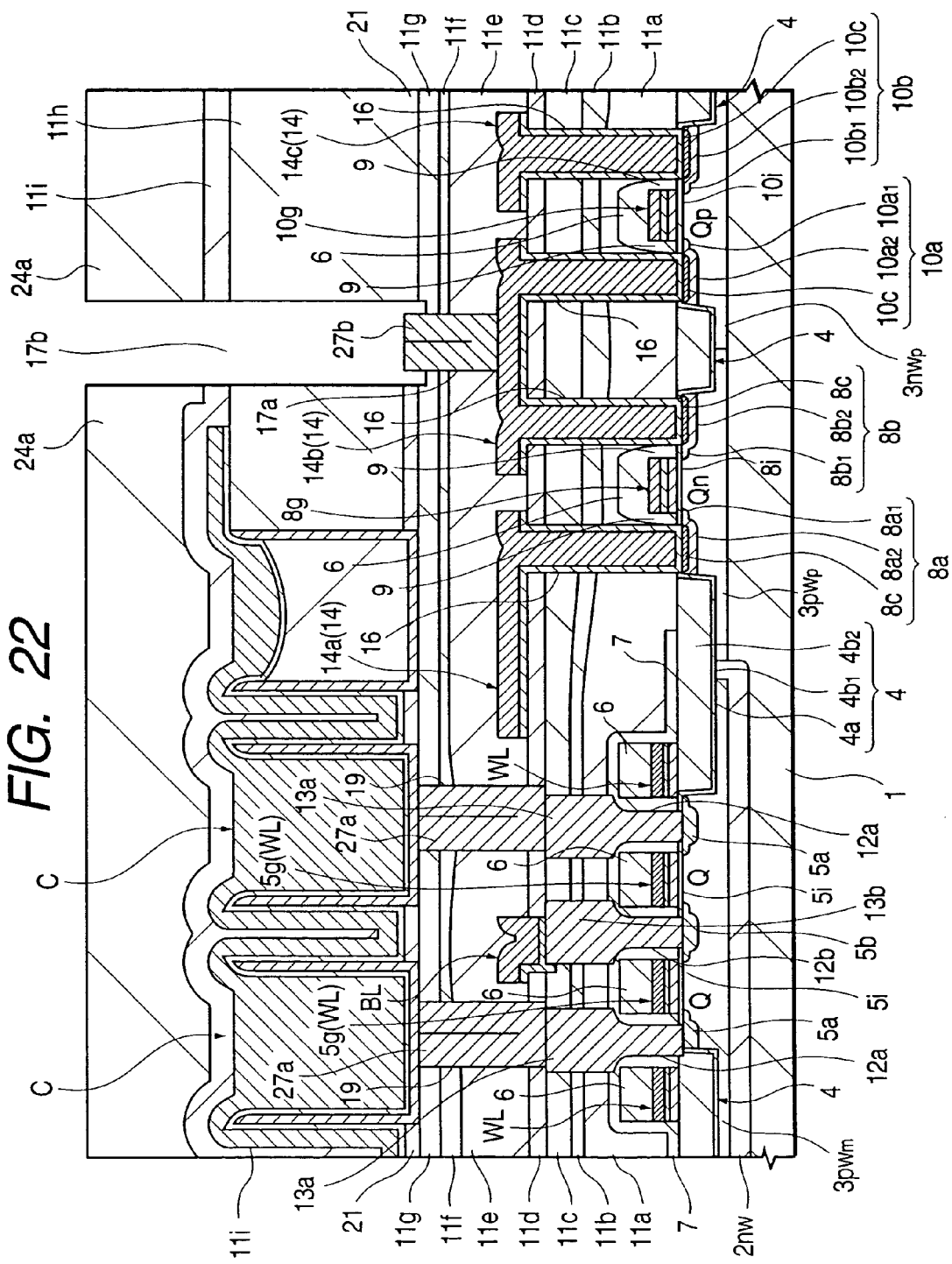
FIG. 22 is a section view of the semiconductor integrated circuit device in the manufacturing process subsequent to FIG. 21.

In this case, the conductor film 27 is left only in the connection holes 17a and 19, but is not left on the upper face of the interlayer insulating film 11g. As a result, a plug 27a is formed in the connection hole 19, and a plug 27b is formed in the connection hole 17a, as shown in FIG. 21.

In other words, in Embodiment 3, the plug 27b of the peripheral circuit region is formed simultaneously with the formation of the plug 27a for the information storage capacitive element of the memory cell region. As a result, a series of processes such as the coating and etch-back of the conductor film can be reduced to reduce the number of steps in manufacturing the DRAM, and to simplify the manufacturing steps.

However, the material of the conductor film 27 for forming the plugs 27a and 27b should not be limited to titanium nitride, but can be one of various materials, and for example, the conductor film 27 can be a multilayer film which is formed by depositing tungsten over the titanium nitride. In this modification, the titanium nitride film may be formed by a sputtering method whereas the tungsten film may be formed by a CVD method, or both films may be formed by a CVD method.

After this, the upper faces of the interlayer insulating film hg and the plugs 27a and 27b are covered with an insulation film 21 of silicon nitride or the like by a CVD method or the like, and the insulation film 21 is then covered by the CVD method or the like with an interlayer insulating film 11h of silicon oxide or the like, for example.

Next, as in Embodiment 1, there is formed the cylindrical information storage capacitive element C, which is constructed to include the upper electrode 23c, the insulation film 23b of tantalum oxide or the like, and the storage electrode 23a. As a result, there is a memory cell for the DRAM, which is constructed to include the memory cell selecting MOSFET Q and the information storage capacitive element C connected in series with the former.

When the plug 27a is made of titanium nitride, the storage electrode 23a is appropriately made of a polysilicon film, tungsten or tungsten nitride, for example. When the plug 27a is formed of a multilayer film of titanium nitride and tungsten, on the other hand, the storage electrode 23a is preferably made of tungsten or tungsten nitride, for example.

Subsequently, there is deposited on the interlayer insulating film 11h an interlayer insulating film 11i which is made of silicon oxide or the like having a thickness of about 100 nm, for example, in such a way as to cover the information storage capacitive element C.

After this, a connection hole 17b for exposing the upper portion of the plug 27b is opened as in Embodiment 1 by forming a photoresist pattern 24a for opening the connection hole in the peripheral circuit region on the interlayer insulating film 11i, and then by etching off the interlayer insulating films 11i and 11h and the insulation film 21 exposed therefrom, by using the photoresist pattern 24a as a mask.

This connection hole 17b is given a diameter about 1.5 to 3.0 times as large as the gate work length, for example, or preferably about 0.4 microns and larger than the diameter of the aforementioned connection hole 17a. Moreover, the depth is about 1.8 microns, although the invention is not especially limited thereto.

Figure 23:
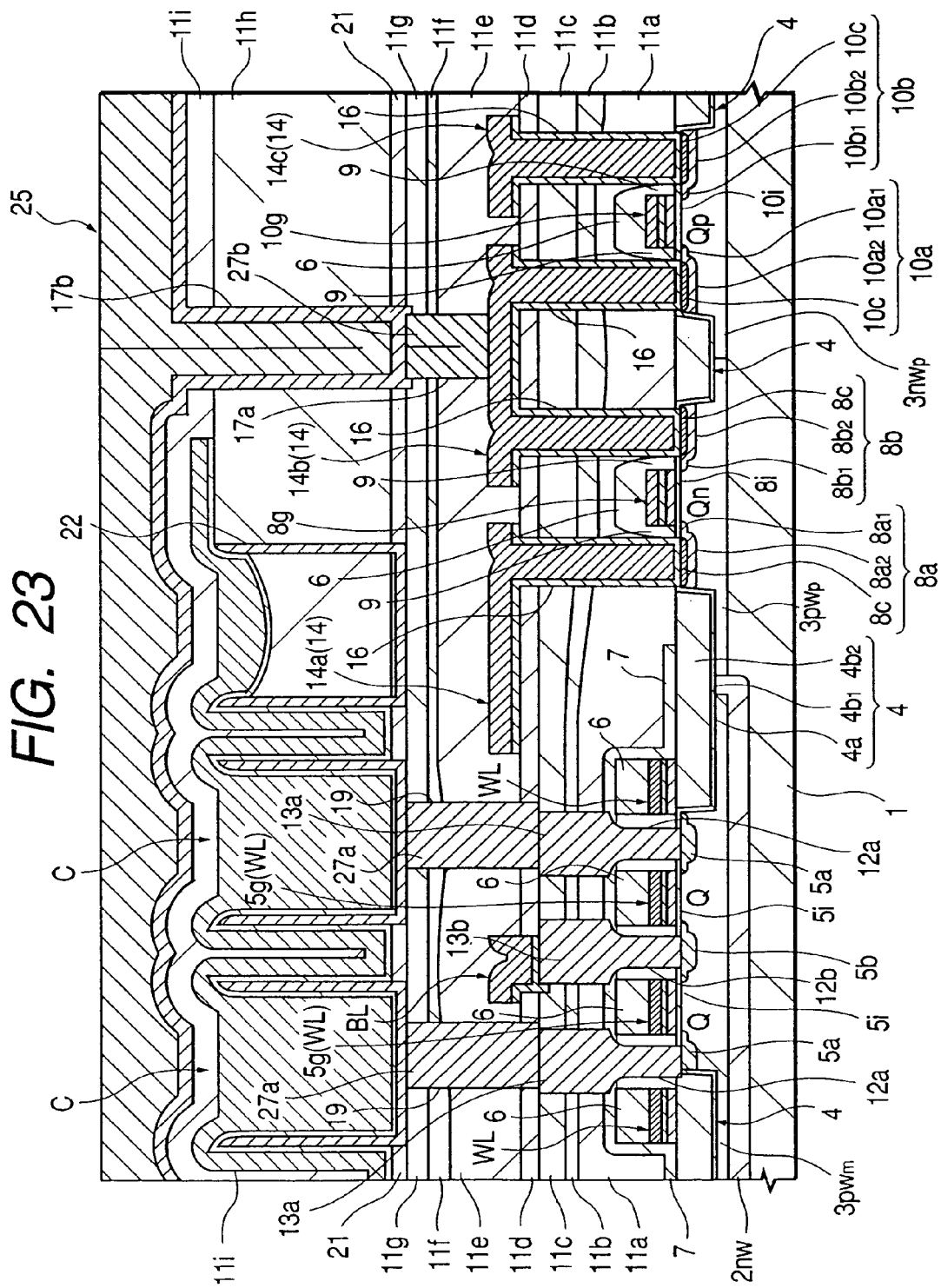
FIG. 23 is a section view of the semiconductor integrated circuit device in the manufacturing process subsequent to FIG. 22.
Figure 24:
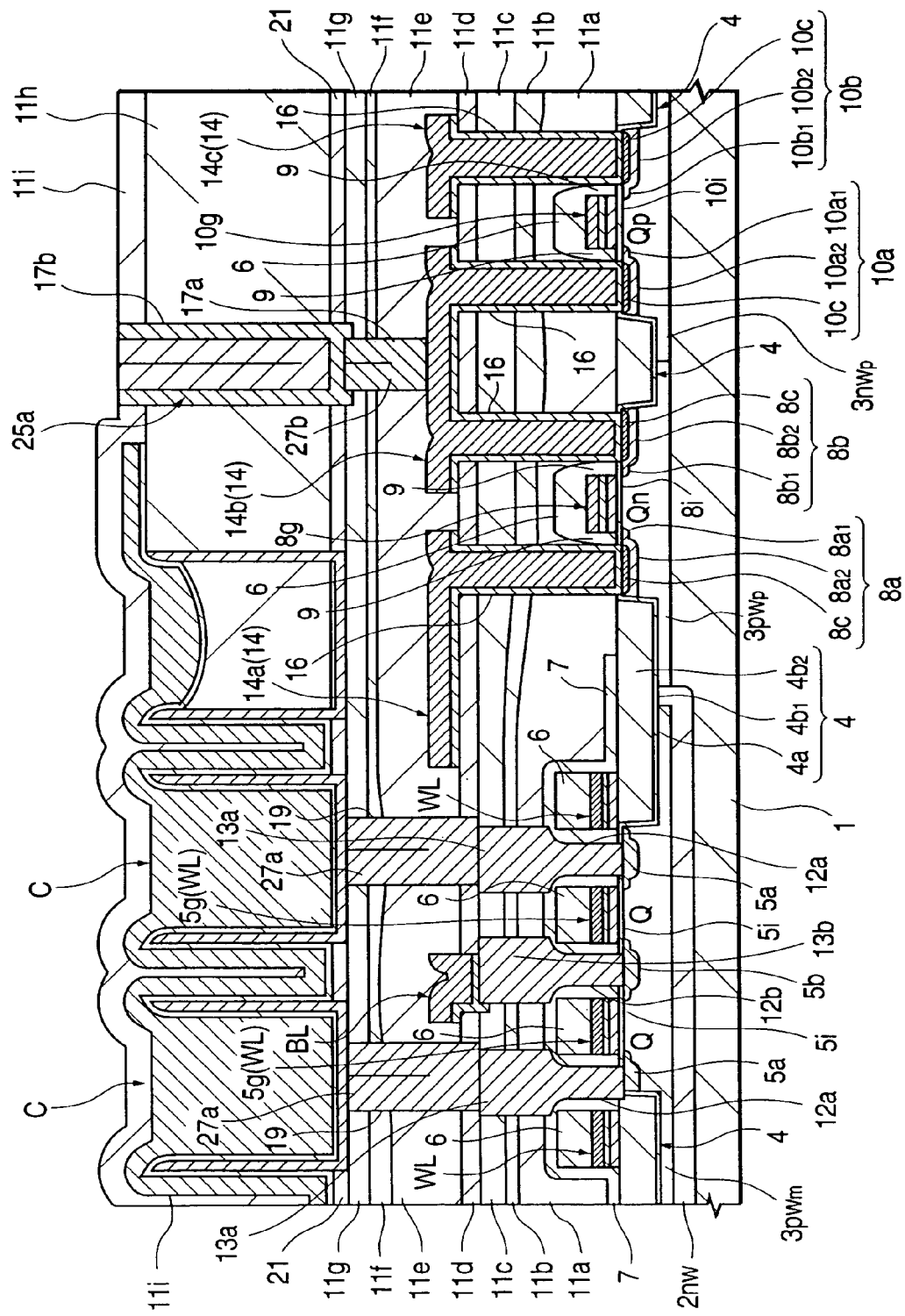
FIG. 24 is a section view of the semiconductor integrated circuit device in the manufacturing process subsequent to FIG. 23.

After the connection hole 17b is thus formed in the peripheral circuit region, the plug 25a is formed in the connection hole 17b, as shown in FIG. 24, by covering the upper face of the interlayer insulating film 11i and the inside of the connection hole 17b with a conductor film 25 as in Embodiment 1, as shown in FIG. 23, and then anisotropically dry-etching the semiconductor substrate 1 to remove the conductor film 25 on the upper face of the interlayer insulating film 11i while leaving the conductor film 25 in the connection hole 17b. Thus, in Embodiment 3, as well, there is provided a structure in which the plug 25a is so stacked in direct contact on the plug 27b in the peripheral circuit region that they are electrically connected with each other.

Figure 25:
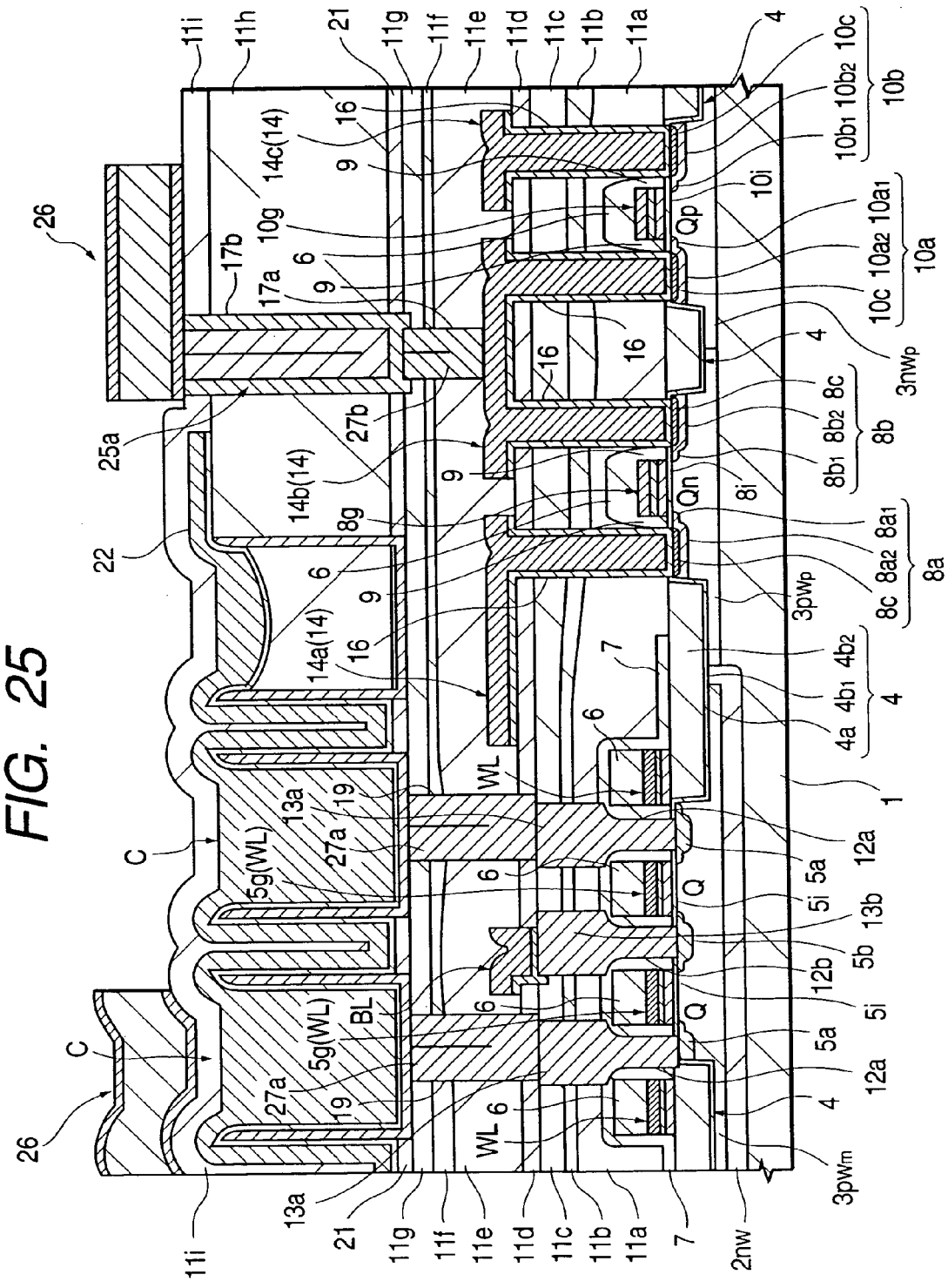
FIG. 25 is a section view of the semiconductor integrated circuit device in the manufacturing process subsequent to FIG. 24.

After this, as shown in FIG. 25, the DRAM is manufactured, as in Embodiment 1, by forming a second-layer line 26, depositing an interlayer insulating film of silicon oxide, for example, on the interlayer insulating film 11i, forming a third-layer line like the second-layer line 26 on the interlayer insulating film, and depositing a surface protective film of either a single-layer film of a silicon oxide film, for example, or a multilayer film formed by depositing a silicon nitride film on a silicon oxide film, to cover the third layer line.

Thus in Embodiment 3, the following effects can be achieved in addition to those obtained from embodiment 1.

(1) The number us in the steps of manufacturing of the DRAM can be greatly reduced to simplify the manufacturing process of the DRAM, by opening the connection hole 17a in the peripheral circuit region simultaneously with the step of opening the connection hole 19 in the memory cell region, and filling in the connection holes 19 and 17a simultaneously to form their individual plugs 27a and 27b simultaneously.

(2) The rate of production of foreign matter in the manufacturing process of the DRAM can be reduced to improve the production yield and the reliability of the DRAM, by opening the connection hole 17a in the peripheral circuit region simultaneously with the step of opening the connection hole 19 in the memory cell region, and filling in the connection holes 19 and 17a simultaneously to form their individual plugs 27a and 27b simultaneously.

Embodiment 4

Figure 26:
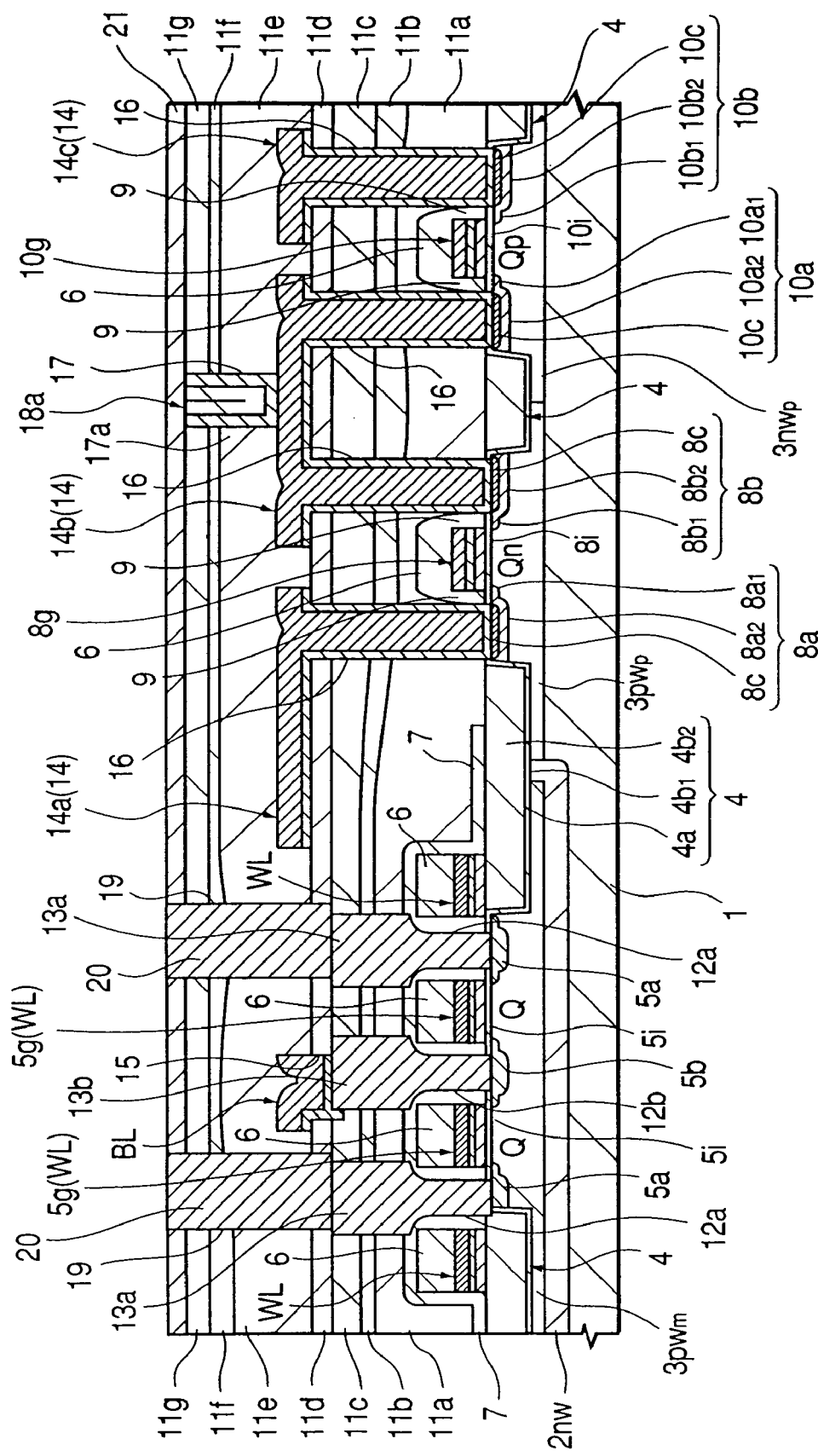
FIG. 26 is a section view of a portion of a semiconductor integrated circuit device manufactured according to another embodiment of the invention.
Figure 27:
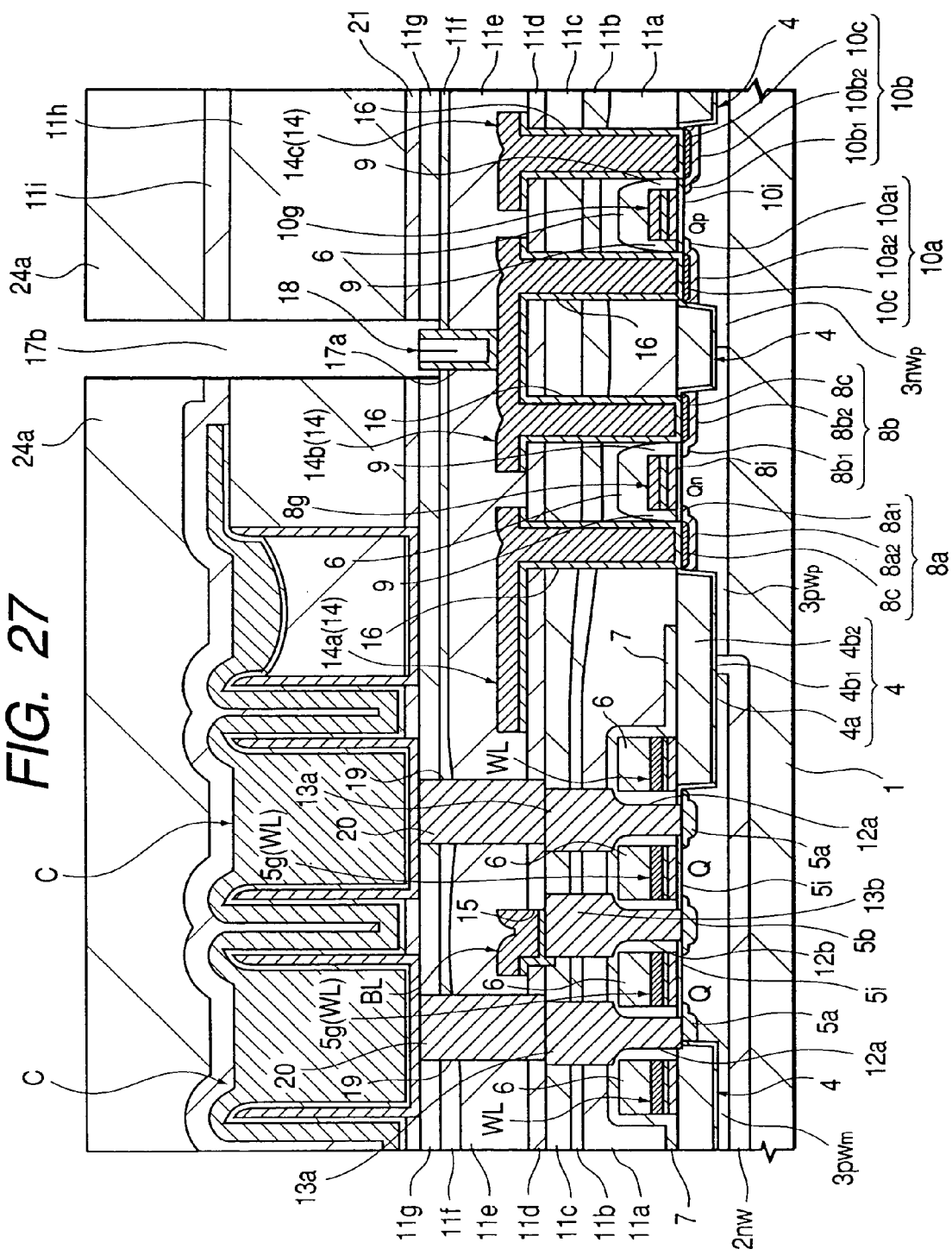
FIG. 27 is a section view of the semiconductor integrated circuit device in the manufacturing process subsequent to FIG. 26.
Figure 28:
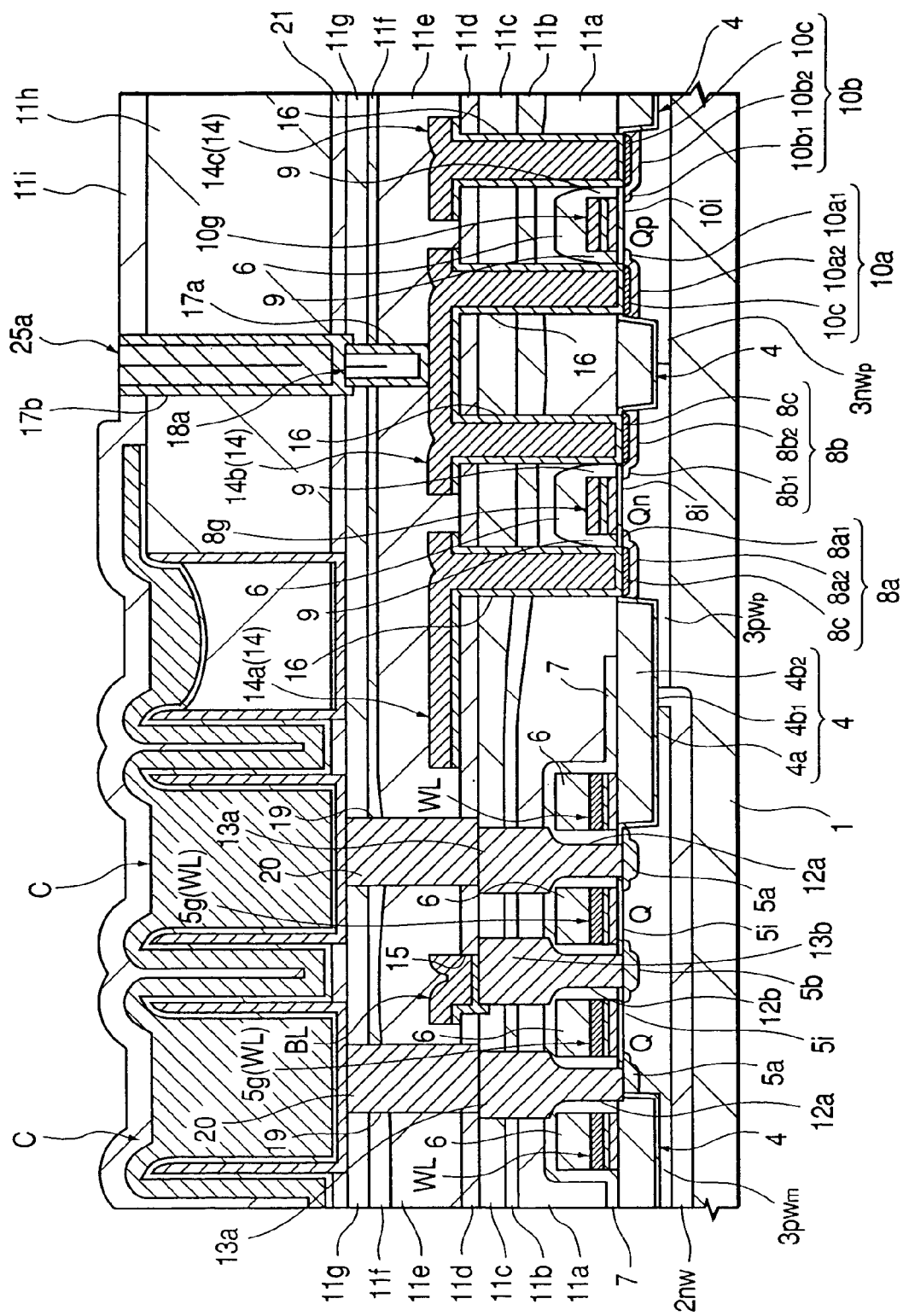
FIG. 28 is a section in the semiconductor integrated circuit device in the manufacturing process subsequent to FIG. 27.

FIGS. 26 to 28 are sections of a semiconductor integrated circuit device shown in the manufactured process according to another embodiment of the invention.

Embodiment 4 will also be directed to the case in which the technical concept of the invention is applied to a 256M DRAM, for example. In Embodiment 4, through the same steps described with reference to FIGS. 1 to 4 of Embodiment 1, a plug 18a is formed, as shown in FIG. 26. After this, an insulation film 21 of a silicon nitride film having a thickness of about 100 nm, for example, is formed over an interlayer insulating film hg as in Embodiment 1. What is different from FIG. 4 is that a connection hole 19 of the memory cell is formed after the insulation film 21 has been deposited. In the connection hole 19, moreover, a plug 20 is formed as in Embodiment 1. This connection hole 19 is given a diameter of about 1 to 1.5 times in microns of the gate working length, or preferably about 0.25 microns, although the invention is not especially limited thereto. The order of forming these plugs 18a and 19 may be reversed.

After this, the upper faces of the interlayer insulating film 11g and the plugs 27a and 27b are covered by a CVD method or the like with an interlayer insulating film 11h of silicon oxide or the like, for example, as shown in FIG. 27. After this, as in Embodiment 1, there is formed a cylindrical information storage capacitive element C, for example, which is constructed to include an upper electrode 23c, an insulating film 23b of tantalum oxide or the like, and a storage electrode 23a. As a result, there is provided a memory cell for the DRAM, which is constructed to include a memory cell selecting MOSFET Q and an information storage capacitive element C connected in series with the former.

After this, as in Embodiment 1, an interlayer insulating film 11i and a photoresist pattern 24a for opening a connection hole in the peripheral circuit region are formed on the interlayer insulating film 11h in order from the lower layer. After this, the photoresist pattern 24a is employed as a mask to etch off the interlayer insulating films 11i and 11h and the insulation film 21 exposed therefrom, to open a connection hole 17b for exposing the upper-portion 5 of the plug 18a, as in Embodiment 1.

After this, the connection hole 17b is filled in with the conductor film, as in Embodiment 1, to form the plug 25a, as shown in FIG. 28. The subsequent steps are identical to those of Embodiment 1, and 10 their description will be omitted.

Thus, Embodiment 4 can achieve effects similar to those of Embodiment 1.

Embodiment 5

Figure 29:
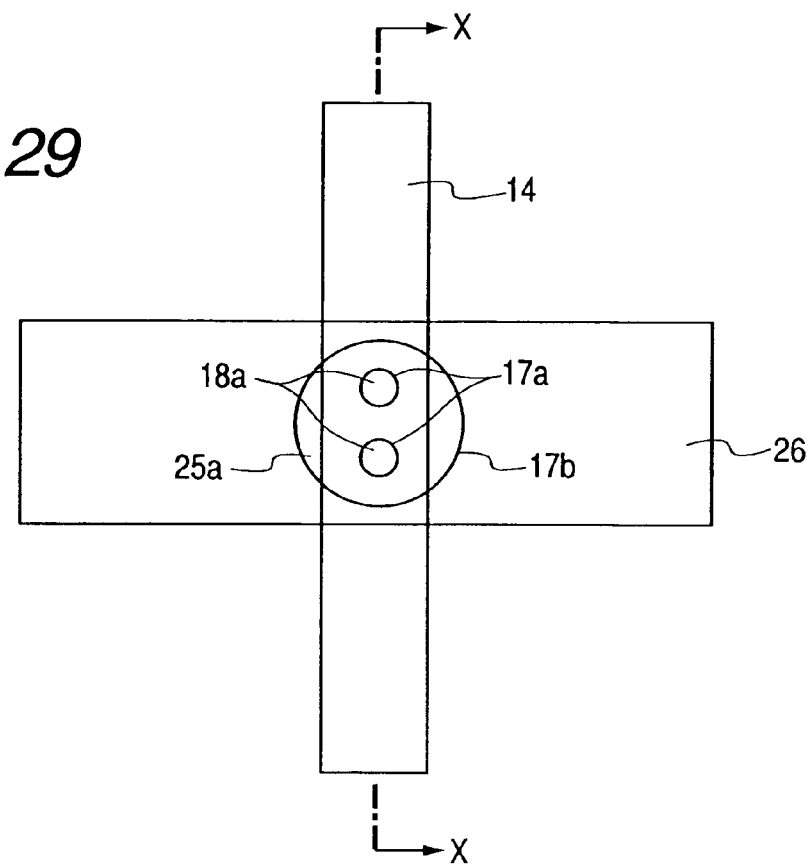
FIG. 29 is a top plan view of a semiconductor integrated circuit device according to another embodiment of the invention.
Figure 30:
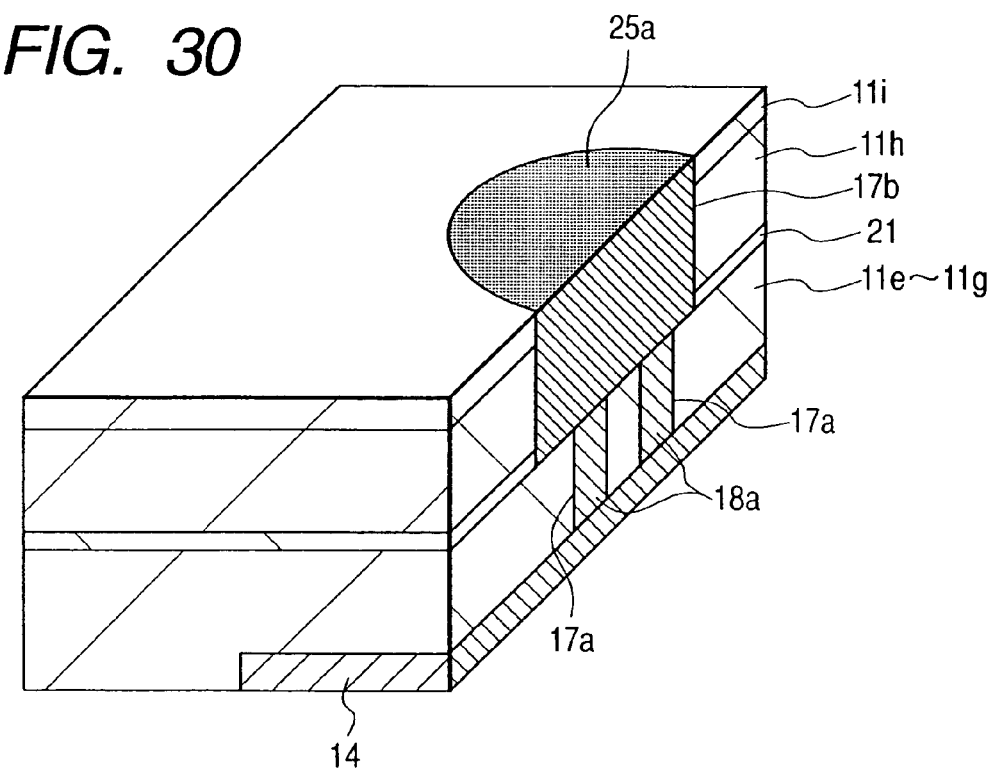
FIG. 30 is a perspective view partially in section showing essential portions of the semiconductor integrated circuit device of FIG. 29.
Figure 31:
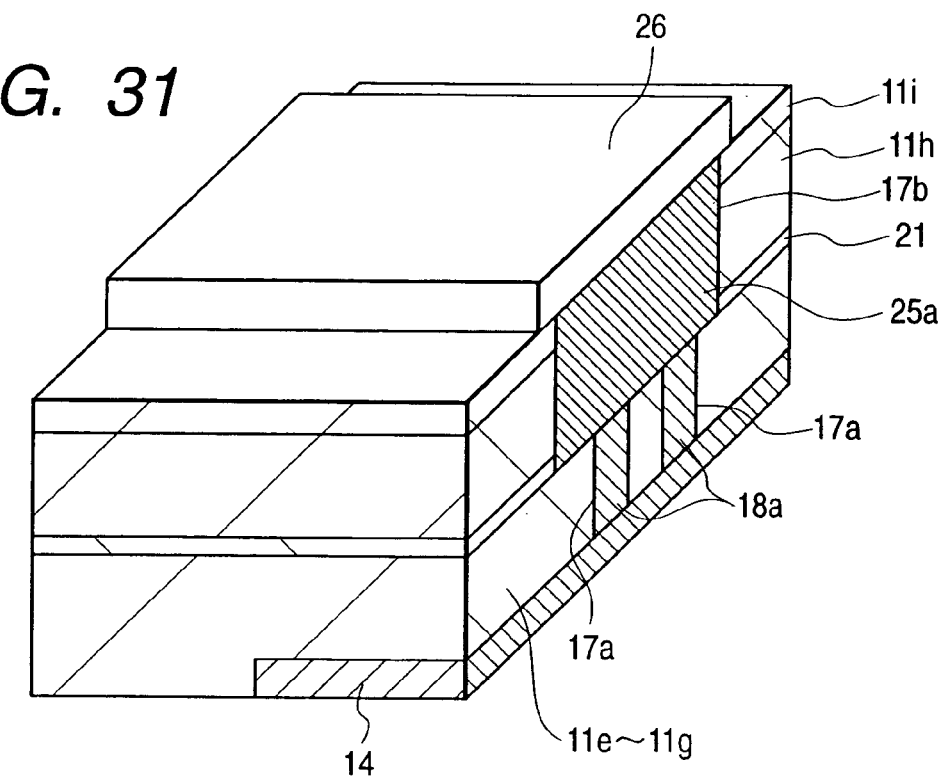
FIG. 31 is a perspective view partially is section showing essential portions of the semiconductor integrated circuit device.
Figure 32:
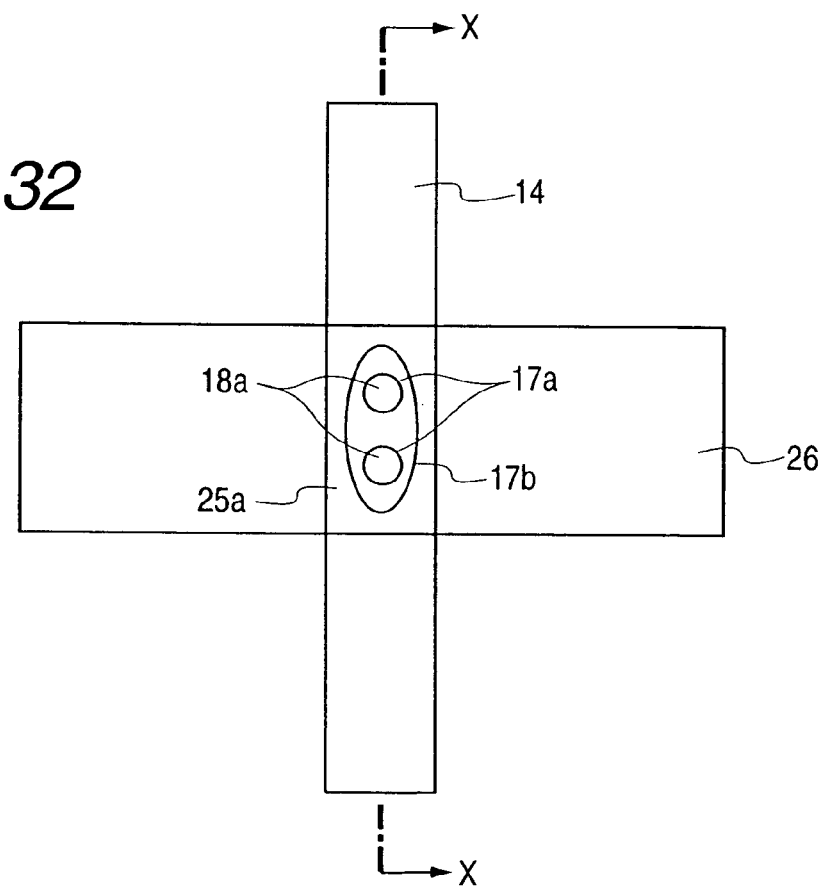
FIG. 32 is a top plan view according to a semiconductor integrated circuit device of another embodiment of the invention.

FIGS. 29 and 32 are top plan views showing 15 portions of a semiconductor integrated circuit device of another embodiment according to the invention, and FIGS. 30 and 31 are perspective views partially in section showing portions of the semiconductor integrated circuit device of FIG. 29.

As shown in FIGS. 29, 30 and 31, Embodiment 5 is constructed such that the diameter of the upper stage connection hole 17b is larger, in that it encompasses both of the lower stage connection holes 17a, than that of each of the connection holes 17a, and such 25 that one plug 25a in the upper stage connection hole 17b is electrically connected in direct contact with the plugs 18a in the two connection holes 17a juxtaposed at the lower stage, as will be described in the following.

The lower stage connection holes 17a and the upper stage connection hole 17b are arranged planarly in the intersection area between the first-layer line 14 and the second-layer line 26. Of these, the lower stage two connection holes 17a are formed into a planar circular shape and are juxtaposed in the longitudinal direction of the first-layer line 14. The plugs 18a in the connection holes 17a are electrically connected in direct contact with the first-layer line 14. However, the two connection holes 17a may be juxtaposed in the widthwise direction of the first-layer line 14. In other words, the minute two connection holes 17a are arranged perpendicularly to the direction of the electric current flow therethrough. Then, the electric current flow through the minute connection holes 17a can be distributed to improve the electromigration resistance in the connection holes 17a and 17b. Moreover, the number of the connection holes 17a should not be limited to two.

The upper stage connection hole 17b is formed into a planar circular shape, for example, like the lower stage connection holes 17a, but its diameter is larger than those of the lower stage connection holes 17a such as to include the two connection holes 17a.

The plug 25a in the upper stage connection hole 17b is electrically connected at its lower portion in direct contact with the plugs 18a in the lower stage two connection holes 17a and at its upper portion with the second-layer line 26. Thus, in Embodiment 5, the resistance in the plugs 18a and 25a can be lowered by connecting the two plugs 18a electrically with the one plug 25a. The planar shape of the connection hole 17b should not be limited to a circular shape, but can be modified in various manners, for example, to an elliptical shape, as shown in FIG. 32. In this modification, too, the region defining the upper stage connection hole 17b encompasses the region defining the lower stage two connection holes 17a.

Thus, Embodiment 5 achieves the following effects in addition to those obtained from Embodiment 1.

(1) Of the connection holes 17a and 17b for connecting the first-layer line 14 and the second-layer line 26 electrically, plural connection holes 17a are provided and are juxtaposed to each other, so that the resistance between the plug 25a and the first-layer line 14b can be lowered to reduce the whole wiring resistance.

(2) The planar size of the connection hole 17b is large enough to encompass the two connection holes 17a planarly, so that the processes to open the connection hole 17b and to fill it in with the conductor film can be facilitated.

Embodiment 6

FIGS. 33 to 36 are sections of a semiconductor integrated circuit device shown in a manufacturing process according to still another embodiment of the invention.

Figure 33:
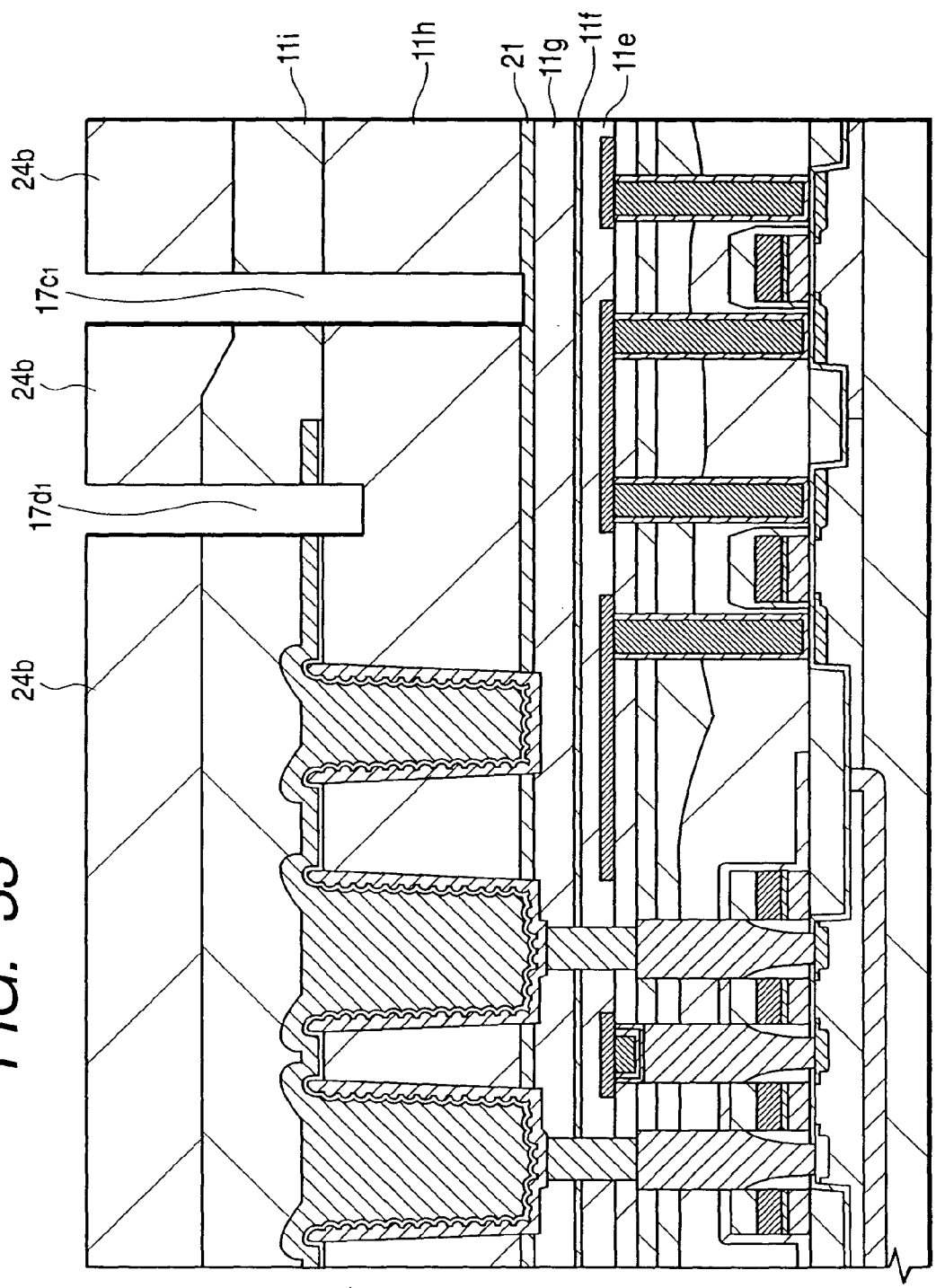
FIG. 33 is a section view of a portion of a semiconductor integrated circuit device manufactured according to another embodiment of the invention.
Figure 34:
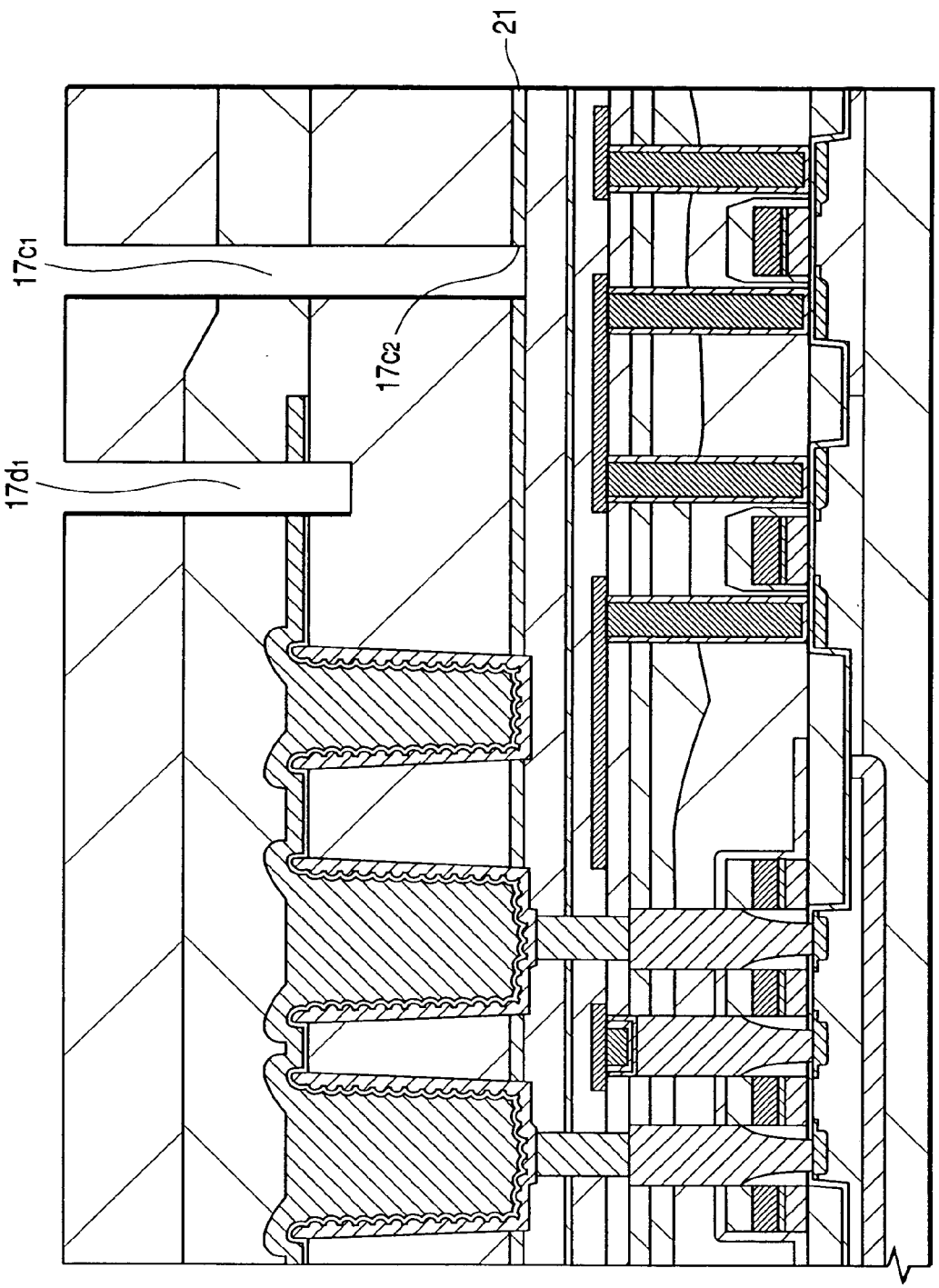
FIG. 34 is a section view of the semiconductor integrated circuit device in the manufacturing process subsequent to FIG. 33.

In Embodiment 6, the invention is applied to a process for manufacturing a DRAM, for example. FIG. 33 is a section showing portions of the device at a step in the manufacturing process. In FIG. 33, the same reference numerals as those of Embodiment 1 are used to identify the same materials in this Embodiment 6.

The total thickness of the interlayer insulating films 11e to 11g is, e.g., about 0.4 microns; the thickness of the insulation film 21 is, e.g., about 0.1 microns; the thickness of the layer insulating film 11h is, e.g., about 1.3 microns; and the thickness of the interlayer insulating film 11i is, e.g., about 0.6 microns (so that the total thickness of the interlayer insulating films 11h and 11i is, e.g., about 1.9 microns). The insulation film 21 is used as an etching stopper for making trenches as in Embodiment 1 when the storage electrode 23a of the information storage capacitive element C is formed.

In Embodiment 6, an interlayer insulating film 11i is formed first as in Embodiment 1, and a photoresist film 24b is formed over the interlayer insulating film 11i. This photoresist film 24b is a mask pattern for opening an interconnection hole for connecting a first-layer line and a second-layer line and an electrode lead-out connection hole for leading out the plate electrode 23c of the information storage capacitive element C. The mask pattern has a planarly circular opening for exposing a part of the surface of the plate electrode 23c and the first-layer line 14.

Subsequently, the photoresist film 24b is employed as the etching mask to perform an etching process under the condition in which the silicon oxide film is more easily etched off than the silicon nitride film at a relatively large etching selection ratio between the silicon oxide film and the silicon nitride film, so that the interlayer insulating films 11i and 11$h$ exposed from the photoresist film 24$b$ are removed to open connection holes (a first hole) 17$c$1 and 17$d$1 in the peripheral circuit region of the DRAM.

The connection hole 17$c$1 is a hole for connecting the wiring layers, and the insulation film (the second insulation film) 21 is exposed through the bottom face of the connection hole 17$c$1. In this connection hole 17$c$1, the insulation film 21 functions as the etching stopper. This etching process removes 3.0 microns in terms of silicon oxide film under the condition of a selection ratio of 15 to the silicon nitride film, for example, the residual of the insulation film 21 of the silicon oxide film is ensured to have a thickness of about 0.02 microns even at the thinnest portion.

The connection hole 17$d$1 is a hole for leading out the plate electrode (the second electrode) 23$c$ and is made through the interlayer insulating film 11$i$ and the plate electrode 23$c$ to a depth at an intermediate position of the interlayer insulating film 11$h$ underlying the former. Here will be described the reason why one connection hole 17$d$1 fails to reach the insulation film 21 although the two connection holes 17$c$1 and 17$d$1 are opened at the same processing step. The connection hole 17$c$1, in which the insulation film 21 is exposed from its bottom portion, creates no problem because the plate electrode 23$c$ is not interposed at an intermediate position of the depth, but the connection hole 17$d$1, which terminates at an intermediate position of the depth of the interlayer insulating film 11$h$, is etched at a slow etching rate because the upper electrode 23$c$ is interposed at an intermediate position of the depth and is partially etched off.

After this, the photoresist film 24$b$ is employed as an etching mask to etch off the insulation film 21, exposed from the connection hole 17$c$1, selectively with respect to the interlayer insulating films 11$g$, 11$h$ and 11$i$, thereby forming a connection hole (the second hole) 17$c$2 which extends from the bottom of the connection hole 17$c$1 to the semiconductor substrate 1 side. In short, the etching is performed under the condition in which the silicon nitride film is more easily etched off than the silicon oxide film at a relatively high etching selection ratio between the silicon oxide film and the silicon nitride film.

Figure 35:
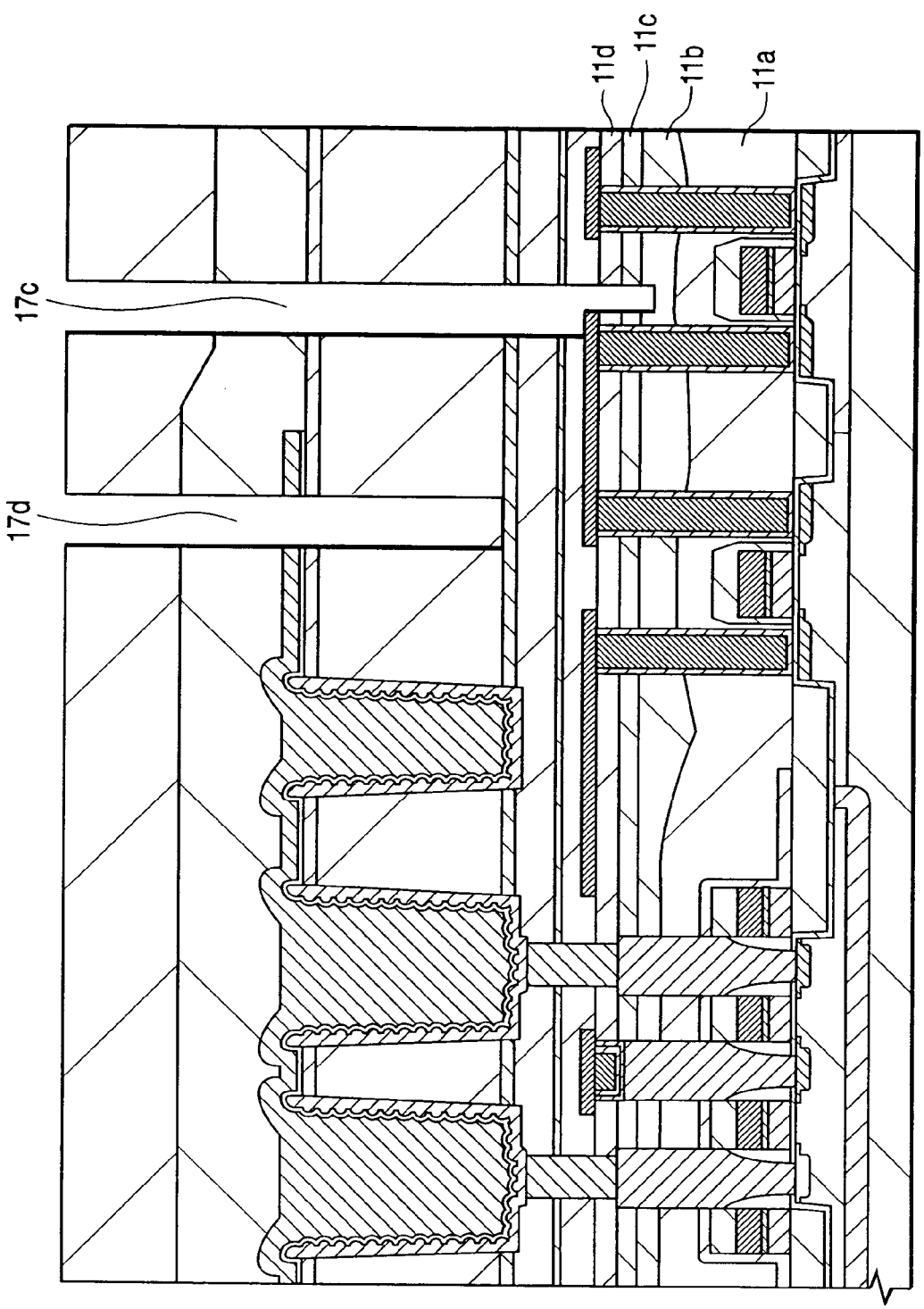
FIG. 35 is a section view of the semiconductor integrated circuit device in the manufacturing process subsequent to FIG. 34.
Figure 36:
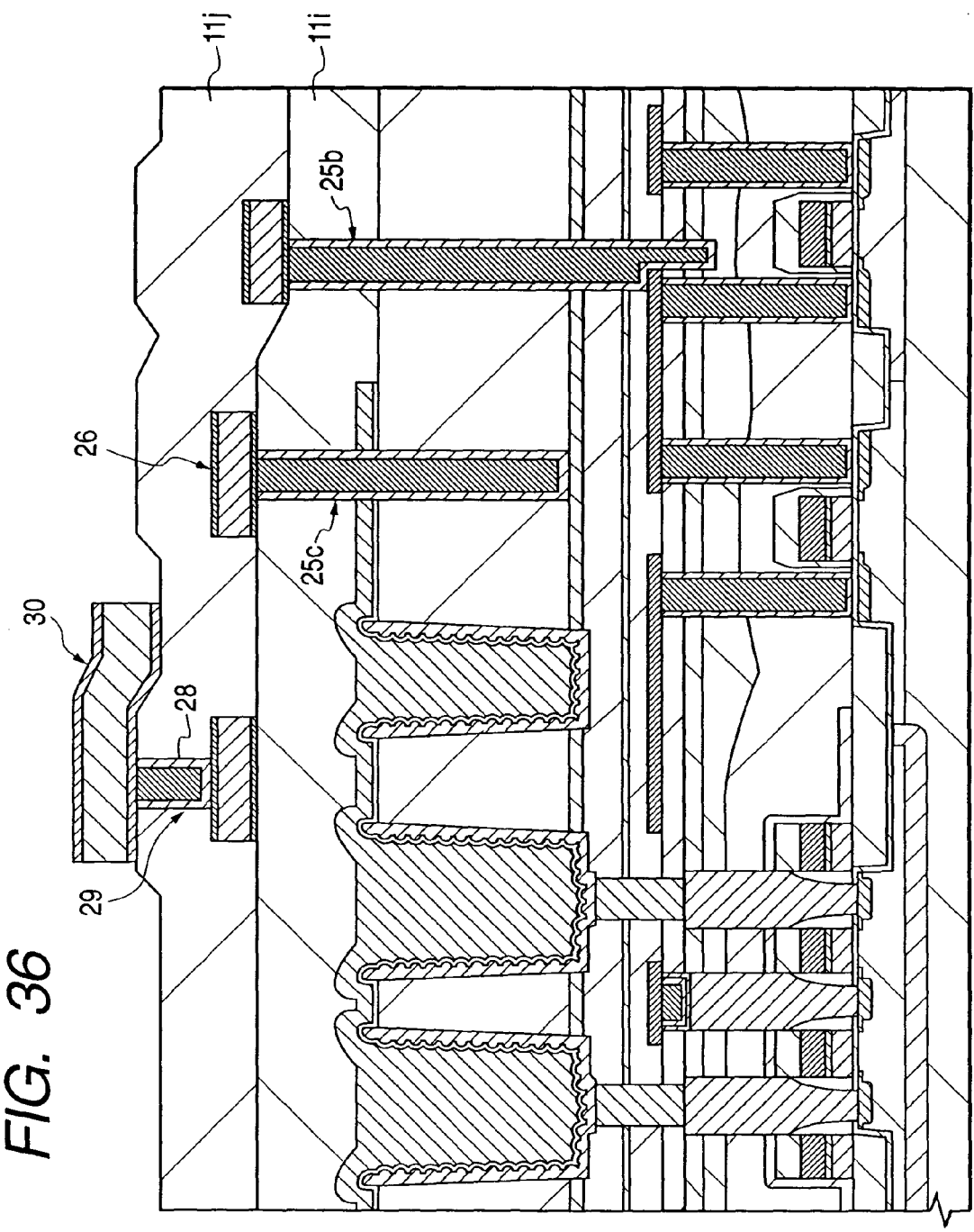
FIG. 36 is a section view of the semiconductor integrated circuit device in the manufacturing process subsequent to FIG. 35.

Next, the photoresist mask 24$b$ is employed as the etching mask to perform the etching under the condition in which the silicon oxide film is more easily etched off than the silicon nitride film at a relatively high etching selection ratio between the silicon oxide film and the silicon nitride film, thereby to etch off the interlayer insulating films 11$e$ to 11 and 11$h$ exposed from the bottoms of the connection holes 17$c$1 (17$c$2) and 17$d$1 and to open connection holes 17$c$ and 17$d$, as shown in FIG. 35.

A part of the first-layer line 14 is exposed from the bottom face of the connection hole 17$c$. FIG. 35 shows the case in which the relative planar positions of the connection hole 17$c$ and the first-layer line 14 are slightly different. In this embodiment, 50% over etching (0.2 μm) of the interlayer insulating films 11$e$ to 11$g$ of a total thickness of 0.4 μm is performed. As a result, the bottom of the connection hole 17$c$ is positioned at an intermediate position of the depth of the interlayer insulating films 11$b$ to 11$d$ underlying the first-layer line 14 in a misregistration region. Outside of the misregistration region, however, between the bottom of the connection hole 17$c$ and the semiconductor substrate 1 a residual of the insulation film of at least 0.4 microns is ensured, so that they are not possibly connected electrically. That is, since the aforementioned over-etching amount can be increased, even in the case of the minute connection hole 17$c$ having a high aspect ratio, any defect of electrical connection inside the connection hole 17$c$ and the occurrence of the increase/variation of the resistance can be avoided. This makes it possible to improve the production yield and reliability of the DRAM.

The insulation film 21 is exposed from the bottom face of the connection hole 17$d$. Since this etching is performed under a condition wherein the silicon oxide film is more easily etched off, the connection hole 17$d$ neither extends through the insulation film 21 made of the silicon nitride film nor reaches the first-layer line 14. Just under the connection hole for leading out the plate electrode 23$c$, the first-layer line 14 is not ordinarily provided, because the connection hole may reach, when opened, the depth of the wiring layer of the first-layer line 14. Since this problem is not involved in this embodiment, the first-layer line 14 can even be disposed just under the connection hole 17$d$ for leading out the plate electrode 23$c$. This makes it possible to enhance the size reduction of the semiconductor chip and the high density arrangement of the first-layer line 14.

Subsequently, as in Embodiment 1, for example, the conductor film comprising a titanium nitride film and a conductor film made of tungsten or the like are deposited in order from the lower layer and are then etched back to form plugs 25$b$ and 25$c$. In this case, too, the first-layer line 14 is made of tungsten so that neither the first-layer line 14 is etched nor a high resistance film is formed when the plug forming tungsten film is subjected to a filming process. The plug 25$b$ is electrically connected in direct contact with the first-layer line 14. The plug 25$c$ is electrically connected with the plate electrode 23$c$, exposed from the inner side face of the connection hole 17$d$, through a part of the plate electrode 23$c$.

After this, as in Embodiment 1, the second-layer line 26 is formed, and then the interlayer insulating film 11$j$ of a silicon oxide film, for example, is formed by a CVD method on the interlayer insulating film 11$i$ to cover the second-layer line 26. After this, a connection hole 28 is opened in the interlayer insulating film 11$j$, and a plug 29 is formed like the plugs 25$c$ and 25$d$ in the connection hole 28. Moreover, a third-layer line 30 is formed like the second-layer line 26 over the interlayer insulating film 11$j$. Thus, the DRAM is completed.

Although our invention has been specifically described in connection with various embodiments, it should not be limited thereto but can naturally be modified in various manners without departing from the gist thereof.

For example, Embodiments 1 to 6 have been described taking the case in which the information storage capacitive element has a cylindrical shape. However, the invention should not be limited-thereto but can be applied in various manners to an information storage capacitive element having a fin shape, for example.

Moreover, the description of Embodiments 1 to 6 includes a process for forming the information storage capacitive element in which a trench is formed in the interlayer insulating film and a storage electrode is formed in the trench. However, the invention should not be limited thereto but can be modified in the following various manners.

First, the conductor film for forming the storage electrode is deposited on the interlayer insulating film, and the insulation film is then deposited on the conductor film. Subsequently, the insulation film and the conductor film are patterned to form the bottom of the storage electrode, and the pattern of the insulation film is formed thereon. After this, the conductor film for forming the storage electrode is formed to cover the surfaces of the insulation film and the bottom of the storage electrode. After this, the conductor film is etched back to leave the conductor film only on the side wall of the insulation film thereby to form the side wall of the storage electrode. After this, the insulation film, encompassed by the bottom and the side wall of the storage electrode, is removed to form the storage electrode.

Our invention has been thus far described mainly with respect to the manufacture of a DRAM; however, the invention should not be limited thereto, but can be applied to other semiconductor integrated circuit devices such as other memory circuit, chips including a SRAM (Static Random Access Memory) or flash memory (EEPROM: Electrically Erasable Programmable ROM), a logical circuit chip such as a microprocessor, or a logic memory circuit chip having a logic circuit and a memory circuit on a common semiconductor chip.

The effects achieved by a representative aspect of the invention disclosed herein will be briefly described in the following.

(1) According to the invention, in the peripheral circuit region of the DRAM, the connection hole for connecting the first-layer line and the second-layer line electrically is divided into two, a first connection hole and a second connection hole, and a first filling conductor film and a second filling conductor film are buried in the two individual connection holes, so that the processes to open the first connection hole and the second connection hole and to bury the conductor film can be facilitated.

(2) Thanks to the aforementioned effect (1), electrical connection defects in the first connection hole and the second connection hole for connecting the first-layer line and the second-layer line electrically can be reduced to improve the production yield and the reliability of the DRAM.

(3) Thanks to the aforementioned effect (1), at the time of setting the height of the cylindrical information storage capacitive element, the restriction from the connection holes opened in the peripheral circuit region can be loosened to raise the information storage capacitive element. As a result, the capacitance contributing to the information storage can be increased without increasing the area occupied by the information storage capacitive element and additionally introducing any high-degree and complicated processing technique.

(4) Thanks to the aforementioned effect (3), the refresh characteristics of the DRAM and the reliability of the read/write operations can be improved without increasing the area of the memory cell region.

(5) By making the diameter of the second connection hole larger than that of the first connection hole, according to the invention, it is possible to loosen the alignment accuracy at the photolithography step for forming the second connection hole. It is also possible to facilitate the opening process at the etching step of forming the second connection hole. It is further possible to facilitate and improve the process to bury the conductor film in the second connection hole.

(6) According to the invention, the number of steps used in manufacturing the DRAM can be greatly reduced to simplify the manufacturing process of the DRAM, by opening the first connection hole in the peripheral circuit region of the DRAM simultaneously with the step of opening the connection hole formed in the information storage capacitive element in the memory cell region, and by filling in the individual connection holes simultaneously to form their individual buried conductor films simultaneously.

(7) According to the invention, the rate of production of foreign matter in the manufacturing process of the DRAM can be reduced to improve the production yield and the reliability of the DRAM, by opening the first connection hole in the peripheral circuit region of the DRAM simultaneously with the step of opening the connection hole formed in the information storage capacitive element in the memory cell region, and by filling in the individual connection holes simultaneously to form their individual buried conductor films simultaneously.

(8) According to the invention, the resistance between the second buried conductor film and the underlying connection portion can be lowered to reduce the whole wiring resistance, by making the diameter of the second connection hole larger than that of the first connection hole to an extent that the second connection hole includes a plurality of first connection holes, and by electrically connecting one second buried conductor film in the second connection hole and the individual first buried conductor films in the plurality of first connection holes.

(9) According to the invention, the processes to open the second connection hole and to fill it in with the conductor film can be facilitated by making the diameter of the second connection hole larger than that of the first connection hole to an extent that the second connection hole includes a plurality of first connection holes, and by electrically connecting one second buried conductor film in the second connection hole and the individual first buried conductor films in the plurality of first connection holes.

(10) According to the invention, in the case of over etching when the connection hole for electrically connecting the first line and the second line on both sides of the information storage capacitive element in the DRAM is opened, a predetermined amount of insulation film can be ensured between the bottom of the connection hole and the semiconductor substrate in the misregistration region of the connection hole. Since the over etching amount can be increased, more specifically, even a minute connection hole having a high aspect ratio can be satisfactorily opened to suppress the rate of occurrence of electrical connection defects therein and the increase/variation of the resistance. This makes it possible to improve the production yield and reliability of the semiconductor integrated circuit device.

(11) According to the invention, by interposing the second insulation film between the second electrode and the first line of the information storage capacitive element, the second insulation film can function as an etching stopper when the connection hole for leading out the second electrode is formed. As a result, the bottom of the connection hole does not possibly reach the underlying first line so that the first line can be provided just under the connection hole. This makes it possible to promote the size reduction of the semiconductor chip and the high density arrangement of the first line.

What is claimed is:

1. A semiconductor integrated circuit device including, on a semiconductor substrate, a plurality of memory cells each having a memory cell selecting transistor and an information storage capacitive element connected in series with said memory cell selecting transistor, the semiconductor integrated circuit device comprising:

a bit line and a first line formed in the same wiring layer over said semiconductor substrate; said information storage capacitive element provided over said bit line not through other wiring layers; and a second line provided over said information storage capacitive element, wherein in the region other than the region where said memory cell is formed, there are provided a first plug connected in direct contact with said first line, and a second plug connected in direct contact with said first plug and said second line between said first line and said second line, wherein said first line and said second line are electrically connected, wherein a contact portion between said first plug and said second plug is higher than a lower end portion of said information storage capacitive element, and wherein said contact portion between said first plug and aid second plug is lower than a higher end portion of said information storage capacitive element.

2. A semiconductor integrated circuit device according to claim 1, wherein said second plug has a planar size larger than that of said first plug.

3. A semiconductor integrated circuit device according to claim 1, wherein said first line is made of tungsten or tungsten silicide, and wherein said first plug comprises a first metal film and a second metal film of tungsten overlying said first metal film and formed by a CVD method.

4. A semiconductor integrated circuit device including, on a semiconductor substrate, a plurality of memory cells each having a memory cell selecting transistor and an information storage capacitive element connected in series with said memory cell selecting transistor, the semiconductor integrated circuit device comprising:

(a) a first line and a bit line formed in the same wiring layer over said semiconductor substrate;

(b) a first insulation film covering said first line and said bit line;

(c) a first connection hole opened in the region other than said memory cell forming region such that a part of said first line is exposed in said first insulation film;

(d) a first plug formed by filling in said first connection hole with a conductor film;

(e) an information storage capacitive element formed over said bit line;

(f) a second line formed in a wiring layer over said information storage capacitive element;

(g) a second connection hole opened in the region other than said memory cell forming region, in the insulation film between said second line and said first plug such that said second connection hole overlies said second line in the plan view and a part of said first plug is exposed; and (h) a second plug formed by filling in said second connection hole with a conductor film and electrically connected in direct contact with said second line and said first plug, wherein said first plug and said second plug are disposed between said first line and said second line, wherein a contact portion between said first plug and said second plug is higher than a lower end portion of said information storage capacitive element, and wherein said contact portion between said first plug and aid second plug is lower than a higher end portion of said information storage capacitive element.

* * * * *